US012613549B2

(12) United States Patent
Kim et al.

(10) Patent No.: US 12,613,549 B2
(45) Date of Patent: Apr. 28, 2026

(54) HINGE ASSEMBLY AND ELECTRONIC DEVICE INCLUDING THE SAME

(71) Applicant: Samsung Electronics Co., Ltd., Suwon-si (KR)

(72) Inventors: Jongyoon Kim, Suwon-si (KR); Jaehee Kim, Suwon-si (KR); Jongkeun Kim, Suwon-si (KR); Hyungsoo Kim, Suwon-si (KR); Daehyeong Park, Suwon-si (KR); Chungkeun Yoo, Suwon-si (KR); Soobin Choi, Suwon-si (KR); Sooyeon Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 369 days.

(21) Appl. No.: 18/322,877

(22) Filed: May 24, 2023

(65) Prior Publication Data

US 2023/0400881 A1 Dec. 14, 2023

Related U.S. Application Data

(63) Continuation of application No. PCT/KR2023/004261, filed on Mar. 30, 2023.

(30) Foreign Application Priority Data

Jun. 10, 2022 (KR) ........................ 10-2022-0070864
Aug. 4, 2022 (KR) ........................ 10-2022-0097322

(51) Int. Cl.
*G06F 1/16* (2006.01)
*H05K 5/02* (2006.01)
(52) U.S. Cl.
CPC .......... *G06F 1/1618* (2013.01); *G06F 1/1681* (2013.01); *H05K 5/0226* (2013.01)

(58) Field of Classification Search
CPC .... G06F 1/1618; G06F 1/1681; G06F 1/1652; H04M 1/0268; H04M 1/022; H05K 5/0226
See application file for complete search history.

(56) References Cited

U.S. PATENT DOCUMENTS

2020/0323089 A1 10/2020 Rothkopf et al.
2020/0409427 A1* 12/2020 Hsu ........................ G06F 1/1681
(Continued)

FOREIGN PATENT DOCUMENTS

CN 113286023 A 8/2021
CN 114244935 A * 3/2022 .......... H04M 1/0268
(Continued)

OTHER PUBLICATIONS

International Search Report dated Jul. 3, 2023 for PCT application No. PCT/KR2023/004261.
(Continued)

*Primary Examiner* — Sagar Shrestha
*Assistant Examiner* — Peter Krim
(74) *Attorney, Agent, or Firm* — Nixon & Vanderhye P.C.

(57) ABSTRACT

An electronic device may include a display including a first area, a second area, and a third area between at least the first area and the second area, a first housing configured to support the first area, a second housing configured to support the second area, and a hinge assembly configured to connect the first housing to the second housing and operate between a folded state in which the first area and the second area face each other and an unfolded state in which the first area and the second area are open. The hinge assembly may include a hinge bracket, a first rotator connected to the first housing and rotatably connected to the hinge bracket based on a first hinge axis, a second rotator connected to the second housing and rotatably connected to the hinge bracket based on a (Continued)

second hinge axis, a slide bracket slidably connected in a first axis direction parallel with the first hinge axis or the second hinge axis by interoperating with rotations of the first rotator and the second rotator, and a detent assembly configured to provide a detent force resisting movement of the slide bracket in the first axis direction.

20 Claims, 29 Drawing Sheets

(56) References Cited

U.S. PATENT DOCUMENTS

| | | | | |
|---|---|---|---|---|
| 2021/0034117 | A1 | 2/2021 | Torres et al. | |
| 2022/0321685 | A1* | 10/2022 | Park | F16C 11/04 |
| 2024/0036617 | A1* | 2/2024 | Zheng | G06F 1/1681 |

FOREIGN PATENT DOCUMENTS

| | | | |
|---|---|---|---|
| KR | 20180122210 | A | 11/2018 |
| KR | 20200101251 | A | 8/2020 |
| KR | 102223632 | B1 | 3/2021 |
| KR | 10-2022-0028364 | A | 3/2022 |
| KR | 10-2022-0039675 | A | 3/2022 |
| KR | 10-2022-0050462 | A | 4/2022 |
| KR | 10-2390038 | B1 | 4/2022 |
| WO | WO 2022/019621 | A1 | 1/2022 |

OTHER PUBLICATIONS

Extended European Search Report dated Apr. 29, 2025 for EP Application No. 23819965.7.

* cited by examiner

P1

P0

550 { 551
      555
      557

552 { 552a
      552b 540  553  548  510  558  557  551  554  552a  552b  553  551  555  554

HINGE ASSEMBLY AND ELECTRONIC DEVICE INCLUDING THE SAME

CROSS-REFERENCE TO RELATED APPLICATIONS

This application is a continuation application of International Application No. PCT/KR2023/004261 designating the United States, filed on Mar. 30, 2023, in the Korean Intellectual Property Receiving Office and claiming priority to Korean Patent Application No. 10-2022-0070864, filed on Jun. 10, 2022, and Korean Patent Application No. 10-2022-0097322, filed on Aug. 4, 2022, in the Korean Intellectual Property Office, the disclosures of which are all incorporated by reference herein in their entireties.

BACKGROUND

1. Field

Certain example embodiments relate to a hinge assembly and/or an electronic device including the hinge assembly.

2. Description of Related Art

With the development of display-related technologies, electronic devices with flexible displays have been developed. A flexible display may be used in the form of a flat surface and may also be transformed into a specific shape for use thereof. For example, an electronic device with a flexible display may be implemented in a foldable form to be folded or unfolded about at least one folding axis.

To implement a folding operation or unfolding operation of an electronic device, a hinge assembly may be provided between a first housing and a second housing. The hinge assembly may have a structure for generating a force to maintain a predetermined folding state of the electronic device.

However, the content described above should not be interpreted as the recognized prior art to the descriptions provided herein and should be interpreted as a related art to the scope herein.

SUMMARY

An electronic device may include a sync assembly configured to interoperate the folding operation of a first housing with the folding operation of a second housing to synchronize the folding angle of the first housing with the folding angle of the second housing.

When a hinge assembly and the sync assembly are provided as separate components, the number of components may increase and the weight and/or cost of the electronic device may increase. Thus, a hinge assembly in which a rotation function, a detent function, and an interoperation function are integrated may exist.

For example, through an axis rotation of the hinge assembly, a cam operates and detent is implemented by interoperating with an elastic member, such as a spring. However, when implementing detent by interoperating repeated folding and unfolding operations, there is a technical demand for overcoming the limit of a torque and the lifespan of the elastic member.

However, the goals to be achieved are not limited to those described above and may be expanded in various manners within the scope without departing from the spirit and field of the disclosure.

In an example embodiment, an electronic device may include a display including a first area, a second area, and a third area between the first area and the second area, a first housing configured to support the first area, a second housing configured to support the second area, and a hinge assembly configured to connect, directly or indirectly, the first housing to the second housing and operate between a folded state in which the first area and the second area face each other and an unfolded state in which the first area and the second area are viewable. In an example embodiment, the hinge assembly may include a hinge bracket, a first rotator connected, directly or indirectly, to the first housing and rotatably connected, directly or indirectly, to the hinge bracket based on a first hinge axis, a second rotator connected, directly or indirectly, to the second housing and rotatably connected, directly or indirectly, to the hinge bracket based on a second hinge axis, a slide bracket slidably connected, directly or indirectly, in a first axis direction parallel with the first hinge axis or the second hinge axis by interoperating with rotations of the first rotator and the second rotator, and a detent assembly configured to provide a detent force resisting movement of the slide bracket in the first axis direction. In an example embodiment, the detent assembly may include a cam moving in a second axis direction perpendicular to the first axis direction by interoperating with movement of the slide bracket, and an elastic member configured to provide an elastic force in the second axis direction by interoperating with movement of the cam.

In an example embodiment, a hinge assembly applied to a foldable electronic device may include a hinge bracket, a first rotator rotatably connected, directly or indirectly, to the hinge bracket based on a first hinge axis, a second rotator rotatably connected, directly or indirectly, to the hinge bracket based on a second hinge axis, a slide bracket slidably connected, directly or indirectly, in a first axis direction parallel with the first hinge axis or the second hinge axis by interoperating with rotations of the first rotator and the second rotator, and a detent assembly coupled, directly or indirectly, to the slide bracket to move in the first axis direction together with the slide bracket and configured to provide a detent force resisting movement of the slide bracket in the first axis direction. In an example embodiment, the detent assembly may include a cam moving in a second axis direction perpendicular to the first axis direction by interoperating with movement of the slide bracket, and an elastic member configured to provide an elastic force in the second axis direction by interoperating with movement of the cam. In an example embodiment, the slide bracket may include a detent space configured to accommodate the detent assembly such that the cam is able to move in the second axis direction.

According to an example embodiment, a hinge assembly integrated with rotation, detent, and/or interoperation functions through a slider and an electronic device including the hinge assembly may be provided and an elastic member may be arranged to receive a force in a direction perpendicular to a rotation axis of the hinge assembly and may have an advantage of lifespan and torque application.

BRIEF DESCRIPTION OF THE DRAWINGS

The above and other aspects, features, and advantages of certain embodiments will be more apparent from the following detailed description, taken in conjunction with the accompanying drawings, in which.

DETAILED DESCRIPTION

Figure 1:
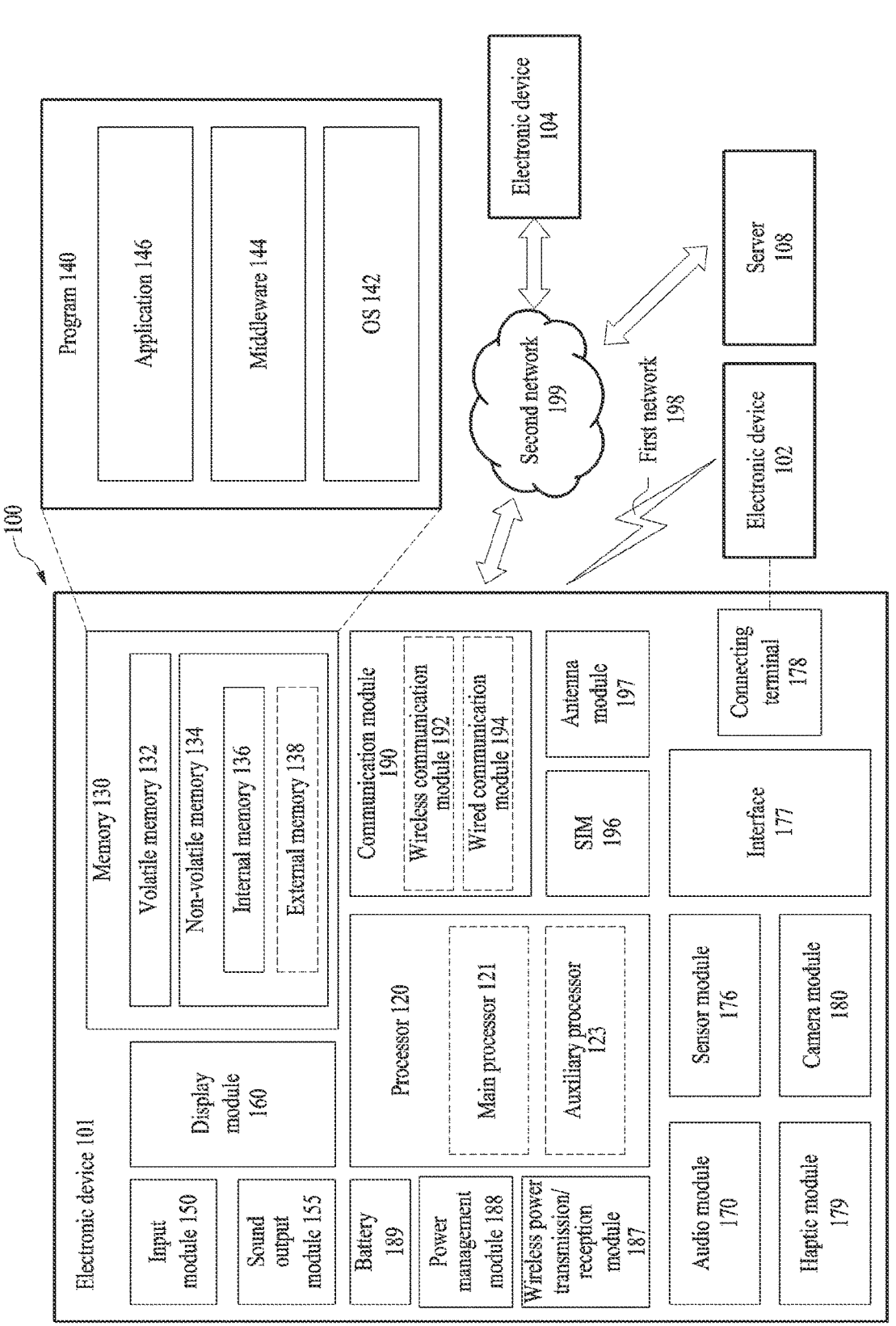
FIG. 1 is a block diagram illustrating an electronic device in a network environment according to various example embodiments.

Hereinafter, embodiments will be described in detail with reference to the accompanying drawings. When describing the examples with reference to the accompanying drawings, like reference numerals refer to like components and a repeated description related thereto will be omitted.

The electronic device according to an example embodiment may be one of various types of electronic devices. The electronic device may include, for example, a portable communication device (e.g., a smart phone), a computer device, a portable multimedia device, a portable medical device, a camera, a wearable device, or a home appliance device. According to an example embodiment, the electronic device is not limited to those described above.

It should be appreciated that various embodiments of the present disclosure and the terms used therein are not intended to limit the technological features set forth herein to particular embodiments and include various changes, equivalents, or replacements for a corresponding embodiment. In connection with the description of the drawings, like reference numerals may be used for similar or related components. It is to be understood that a singular form of a noun corresponding to an item may include one or more of the things, unless the relevant context clearly indicates otherwise. As used herein, "A or B", "at least one of A and B", "at least one of A or B", "A, B or C", "at least one of A, B and C", and "A, B, or C," each of which may include any one of the items listed together in the corresponding one of the phrases, or all possible combinations thereof. Terms such as "first", "second", or "first" or "second" may simply be used to distinguish the component from other components in question, and do not limit the components in other aspects (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., by wire), wirelessly, or via at least a third element(s).

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an example embodiment, the module may be implemented in a form of an application-specific integrated circuit (ASIC). Thus, each "module" herein may comprise circuitry.

Various embodiments as set forth herein may be implemented as software (e.g., the program 140) including one or more instructions that are stored in a storage medium (e.g., an internal memory 136 or an external memory 138) that is readable by a machine (e.g., the electronic device 101). For example, a processor (e.g., the processor 120, including processing circuitry) of the machine (e.g., the electronic device 101) may invoke at least one of the one or more instructions stored in the storage medium and execute it. This allows the machine to be operated to perform at least one function according to the at least one instruction invoked. The one or more instructions may include code generated by a compiler or code executable by an interpreter. The machine-readable storage medium may be provided in the form of a non-transitory storage medium. Here, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an example embodiment, a method according to various embodiments of the disclosure may be included and provided in a computer program product. The computer program product may be traded as a product between a seller and a buyer. The computer program product may be distributed in the form of a machine-readable storage medium (e.g., compact disc read-only memory (CD-ROM)), or be distributed (e.g., downloaded or uploaded) online via an application store (e.g., PlayStore™), or between two user devices (e.g., smartphones) directly. If distributed online, at least part of the computer program product may be temporarily generated or at least temporarily stored in the machine-readable storage medium, such as a memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

FIG. 1 is a block diagram illustrating an electronic device 101 in a network environment 100 according to an example embodiment.

Referring to FIG. 1, the electronic device 101 in the network environment 100 may communicate with an electronic device 102 via a first network 198 (e.g., a short-range wireless communication network), or communicate with an electronic device 104 or a server 108 via a second network 199 (e.g., a long-range wireless communication network). According to an example embodiment, the electronic device 101 may communicate with the electronic device 104 via the server 108. According to an example embodiment, the electronic device 101 may include a processor 120, a memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one (e.g., the connecting terminal 178) of the above components may be omitted from the electronic device 101, or one or more other components may be added in the electronic device 101. In some embodiments, some (e.g., the sensor module 176, the camera module 180, or the antenna module 197) of the components may be integrated as a single component (e.g., the display module 160).

The processor 120 may execute, for example, software (e.g., a program 140) to control at least one other component (e.g., a hardware or software component) of the electronic device 101 connected, directly or indirectly, to the processor 120, and may perform various data processing or computation. According to an example embodiment, as at least a part of data processing or computation, the processor 120 may store a command or data received from another component (e.g., the sensor module 176 or the communication module 190) in a volatile memory 132, process the command or the data stored in the volatile memory 132, and store resulting data in a non-volatile memory 134. According to an example embodiment, the processor 120 may include a main processor 121 (e.g., a central processing unit (CPU) or an application processor (AP)) or an auxiliary processor 123 (e.g., a graphics processing unit (GPU), a neural processing unit (NPU), an image signal processor (ISP), a sensor hub processor, or a communication processor (CP)) that is operable independently of, or in conjunction with the main processor 121. For example, when the electronic device 101 includes the main processor 121 and the auxiliary processor 123, the auxiliary processor 123 may be adapted to consume less power than the main processor 121 or to be specific to a specified function. The auxiliary processor 123 may be implemented separately from the main processor 121 or as a part of the main processor 121. Each processor herein comprises processing circuitry.

The auxiliary processor 123 may control at least some of functions or states related to at least one (e.g., the display module 160, the sensor module 176, or the communication module 190) of the components of the electronic device 101, instead of the main processor 121 while the main processor 121 is in an inactive (e.g., sleep) state or along with the main processor 121 while the main processor 121 is in an active state (e.g., executing an application). According to an example embodiment, the auxiliary processor 123 (e.g., an ISP or a CP) may be implemented as a portion of another component (e.g., the camera module 180 or the communication module 190) that is functionally related to the auxiliary processor 123. According to an example embodiment, the auxiliary processor 123 (e.g., an NPU) may include a hardware structure specified for artificial intelligence (AI) model processing. An artificial intelligence model may be generated by machine learning. Such learning may be performed by, for example, the electronic device 101 in which artificial intelligence is performed, or performed via a separate server (e.g., the server 108). Learning algorithms may include, but are not limited to, for example, supervised learning, unsupervised learning, semi-supervised learning, or reinforcement learning. The AI model may include a plurality of artificial neural network layers. An artificial neural network may include, for example, a deep neural network (DNN), a convolutional neural network (CNN), a recurrent neural network (RNN), a restricted Boltzmann machine (RBM), a deep belief network (DBN), a bidirectional recurrent deep neural network (BRDNN), a deep Q-network, or a combination of two or more thereof, but is not limited thereto. The AI model may additionally or alternatively include a software structure other than the hardware structure.

The memory 130 may store various data used by at least one component (e.g., the processor 120 or the sensor module 176) of the electronic device 101. The various pieces of data may include, for example, software (e.g., the program 140) and input data or output data for a command related thereto. The memory 130 may include the volatile memory 132 or the non-volatile memory 134.

The program 140 may be stored as software in the memory 130 and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output a sound signal to the outside of the electronic device 101. The sound output module 155 may include, for example, a speaker or a receiver. The speaker may be used for general purposes, such as playing multimedia or playing record. The receiver may be used to receive an incoming call. According to an example embodiment, the receiver may be implemented separately from the speaker or as a part of the speaker.

The display module 160 may visually provide information to the outside (e.g., a user) of the electronic device 101. The display module 160 may include, for example, a control circuit for controlling a display, a hologram device, or a projector and control circuitry to control a corresponding one of the display, the hologram device, and the projector. According to an example embodiment, the display device 160 may include a touch sensor adapted to sense a touch, or a pressure sensor adapted to measure an intensity of a force incurred by the touch.

The audio module 170 may convert a sound into an electric signal or vice versa. According to an example embodiment, the audio module 170 may obtain the sound via the input device 150 or output the sound via the sound output device 155 or an external electronic device (e.g., an electronic device 102 such as a speaker or a headphone) directly or wirelessly connected to the electronic device 101.

The sensor module 176 may detect an operational state (e.g., power or temperature) of the electronic device 101 or an environmental state (e.g., a state of a user) external to the electronic device 101, and generate an electrical signal or data value corresponding to the detected state. According to an example embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., by wire) or wirelessly. According to an example embodiment, the interface 177 may include, for example, a high-definition multimedia interface (HDMI), a universal serial bus (USB) interface, a secure digital (SD) card interface, or an audio interface.

The connecting terminal 178 may include a connector via which the electronic device 101 may be physically connected to an external electronic device (e.g., the electronic device 102). According to an example embodiment, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or an electrical stimulus which may be recognized by a user via his or her tactile sensation or kinesthetic sensation. According to an example embodiment, the haptic module 179 may include, for example, a motor, a piezoelectric element, or an electric stimulator.

The camera module 180 may capture a still image and moving images. According to an example embodiment, the camera module 180 may include one or more lenses, image sensors, ISPs, or flashes.

The power management module 188 may manage power supplied to the electronic device 101. According to an example embodiment, the power management module 188 may be implemented as, for example, at least a part of a power management integrated circuit (PMIC).

The battery 189 may supply power to at least one component of the electronic device 101. According to an example embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently of the processor 120 (e.g., an AP) and that support a direct (e.g., wired) communication or a wireless communication. According to an example embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module, or a power line communication (PLC) module). A corresponding one of these communication modules may communicate with the external electronic device 104 via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., a LAN or a wide area network (WAN))). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The wireless communication module 192, comprising communication circuitry, may support a 5G network after a 4G network, and a next-generation communication technology, e.g., a new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., a mmWave band) to achieve, e.g., a high data transmission rate. The wireless communication module 192 may support various technologies for securing performance on a high-frequency band, such as, e.g., beamforming, massive multiple-input and multiple-output (MIMO), full dimensional MIMO (FD-MIMO), an array antenna, analog beam-forming, or a large scale antenna. The wireless communication module 192 may support various requirements specified in the electronic device 101, an external electronic device (e.g., the electronic device 104), or a network system (e.g., the second network 199). According to an example embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., an external electronic device) of the electronic device 101. According to an example embodiment, the antenna module 197 may include an antenna including a radiating element including a conductive material or a conductive pattern formed in or on a substrate (e.g., a printed circuit board (PCB)). According to an example embodiment, the antenna module 197 may include a plurality of antennas (e.g., array antennas). In such a case, at least one antenna appropriate for a communication scheme used in a communication network, such as the first network 198 or the second network 199, may be selected by, for example, the communication module 190 from the plurality of antennas. The signal or power may be transmitted or received between the communication module 190 (comprising communication circuitry) and the external electronic device via the at least one selected antenna. According to an example embodiment, another component (e.g., a radio frequency integrated circuit (RFIC)) other than the radiating element may be additionally formed as a part of the antenna module 197.

According to an example embodiment, the antenna module 197 may form a mmWave antenna module. According to an example embodiment, the mmWave antenna module may include a PCB, an RFIC disposed on a first surface (e.g., a bottom surface) of the PCB or adjacent to the first surface and capable of supporting a designated a high-frequency band (e.g., the mmWave band), and a plurality of antennas (e.g., array antennas) disposed on a second surface (e.g., a top or a side surface) of the PCB, or adjacent to the second surface and capable of transmitting or receiving signals in the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an example embodiment, commands or data may be transmitted or received between the electronic device 101 and the external electronic device 104 via the server 108 coupled with the second network 199. Each of the external electronic devices 102 and 104 may be a device of the same type as or a different type from the electronic device 101. According to an example embodiment, all or some of operations to be executed by the electronic device 101 may be executed at one or more of the external electronic devices 102, 104, and 108. For example, if the electronic device 101 needs to perform a function or a service automatically, or in response to a request from a user or another device, the electronic device 101, instead of, or in addition to, executing the function or the service, may request one or more external electronic devices to perform at least part of the function or the service. The one or more external electronic devices receiving the request may perform the at least part of the function or the service requested, or an additional function or an additional service related to the request, and may transfer an outcome of the performing to the electronic device 101. The electronic device 101 may provide the result, with or without further processing the result, as at least part of a response to the request. To that end, cloud computing, distributed computing, mobile edge computing (MEC), or client-server computing technology may be used, for example. The electronic device 101 may provide ultra low-latency services using, e.g., distributed computing or mobile edge computing. In an example embodiment, the external electronic device 104 may include an Internet-of-things (IoT) device. The server 108 may be an intelligent server using machine learning and/or a neural network. According to an example embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2A:
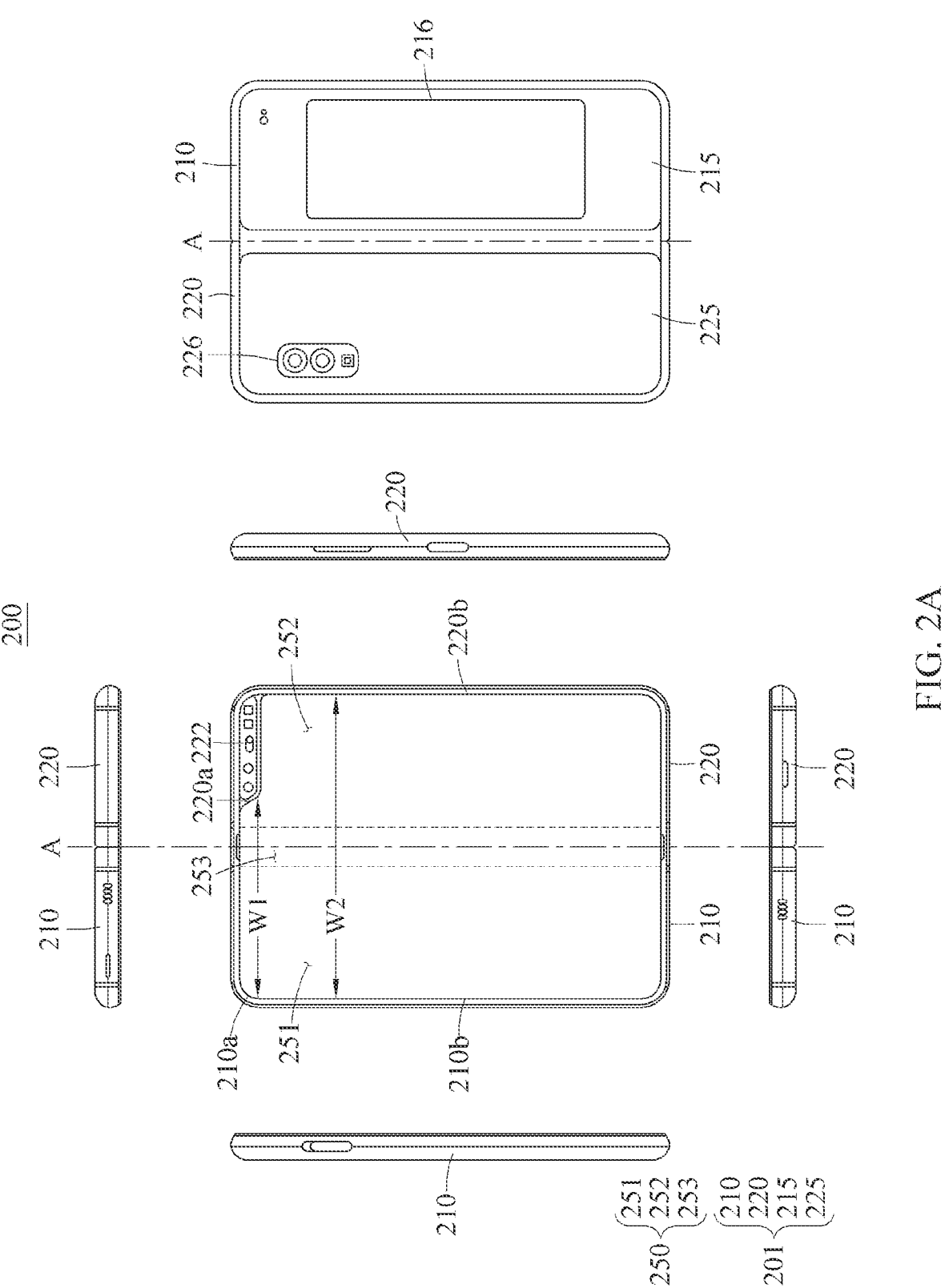
FIG. 2A is a view of an electronic device in an unfolded state according to an example embodiment.
Figure 2B:
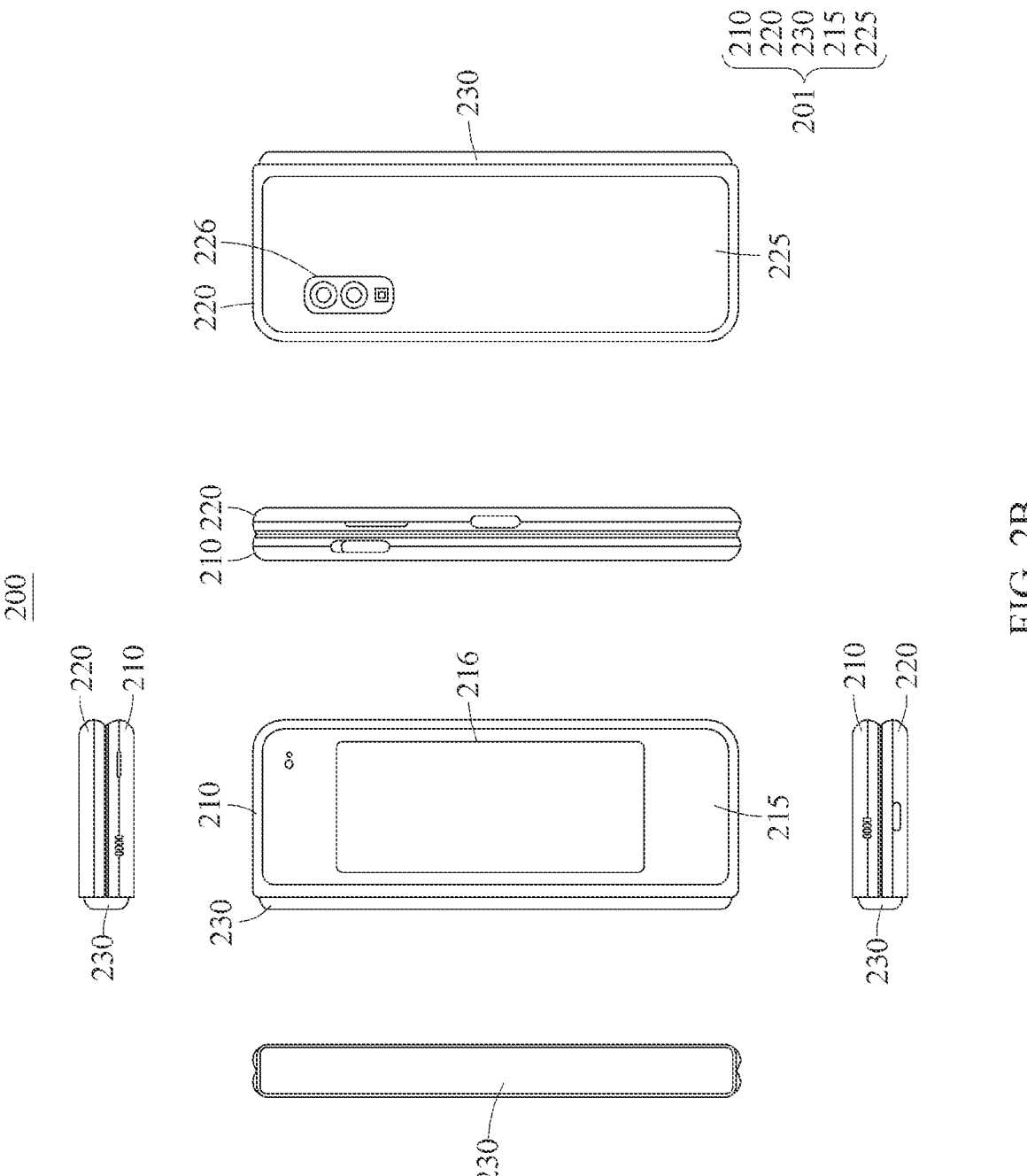
FIG. 2B is a view of the electronic device in a folded state according to an example embodiment.
Figure 2C:
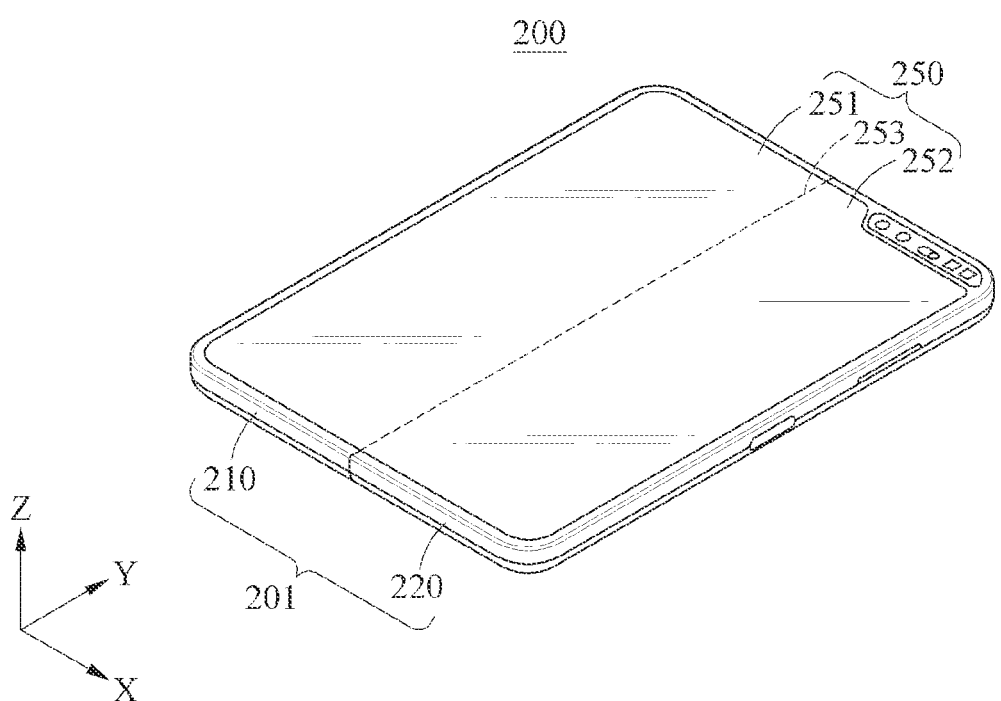
FIG. 2C is a perspective view of the electronic device in an unfolded state according to an example embodiment.
Figure 2D:
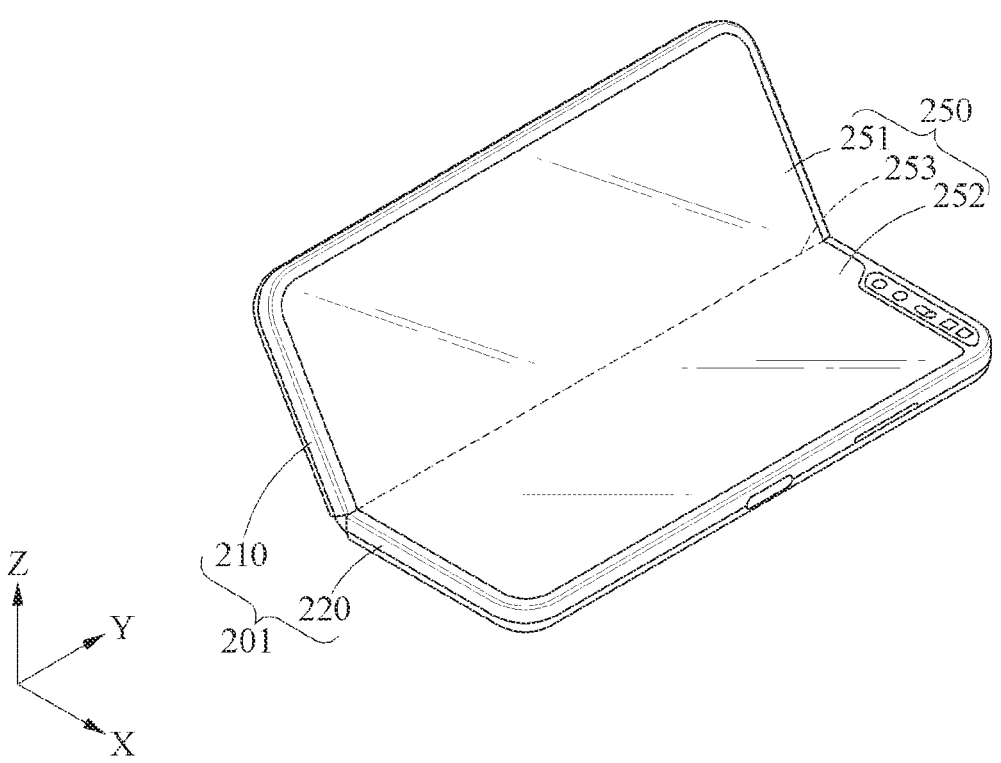
FIG. 2D is a perspective view of the electronic device in an intermediate state according to an example embodiment.

FIG. 2A is a view illustrating an unfolded state of an electronic device 200 (e.g., the electronic device 101 of FIG. 1) according to an example embodiment. FIG. 2B is a view illustrating a folded state of the electronic device 200 according to an example embodiment. FIG. 2C is a perspective view of the electronic device 200 in an unfolded state according to an example embodiment and FIG. 2D is a perspective view of the electronic device 200 in an intermediate state according to an example embodiment.

The electronic device 200 of FIGS. 2A to 2D is an example of the electronic device 101 of FIG. 1 and may be a foldable or bendable electronic device.

In FIG. 2C and other following drawings, illustrated is a spatial coordinate system with an X-axis, a Y-axis, and a Z-axis that are orthogonal to each other. Here, the X-axis may represent a width direction of an electronic device, the Y-axis may represent a length direction of the electronic device, and the Z-axis may represent a height (or thickness) direction of the electronic device. In the following description, a "first direction" may refer to a direction parallel to the Z-axis.

Referring to FIGS. 2A and 2B, in an example embodiment, the electronic device 200 may include a foldable housing 201 and a flexible or foldable display 250 (hereinafter, the "display" 250 in short) (e.g., the display module 160 of FIG. 1) disposed in a space formed by the foldable housing 201.

According to an example embodiment, a surface on which the display 250 is disposed (or a surface on which the display 250 is viewed from the outside of the electronic device 200) may be a front surface of the electronic device 200. In addition, a surface opposite to the front surface may be a rear surface of the electronic device 200. Further, a surface surrounding a space between the front surface and the rear surface may be a side surface of the electronic device 200.

According to an example embodiment, the foldable housing 201 may include a first housing structure 210, a second housing structure 220 including a sensor area 222, a first rear cover 215, a second rear surface 225, and a hinge structure 230. Here, the hinge structure 230 may include a hinge cover that covers a foldable portion of the foldable housing 201. The foldable housing 201 of the electronic device 200 is not limited to the shape and combination shown in FIGS. 2A and 2B, and may be implemented in a different shape or a different combination of components. For example, in an example embodiment, the first housing structure 210 and the first rear cover 215 may be integrally formed, and the second housing structure 220 and the second rear cover 225 may be integrally formed.

According to an example embodiment, the first housing structure 210 may be connected, directly or indirectly, to the hinge structure 230 and may include a first surface facing a first direction and a second surface facing a second direction opposite to the first direction. The second housing structure 220 may be connected, directly or indirectly, to the hinge structure 230 and may include a third surface facing a third direction and a fourth surface facing a fourth direction opposite to the third direction. The second housing structure 220 may rotate with respect to the first housing structure 210 about the hinge structure 230. A state of the electronic device 200 may be changed to a folded state or an unfolded state.

According to an example embodiment, the first surface may face the third surface in a state in which the electronic device 200 is fully folded and the third direction may be identical to the first direction in a state in which the electronic device 200 is fully unfolded.

According to an example embodiment, the first housing structure 210 and the second housing structure 220 are disposed on both sides with respect to a folding axis A and generally may be symmetrical with respect to the folding axis A. As to be described hereinafter, an angle or distance between the first housing structure 210 and the second housing structure 220 may vary depending on whether the state of the electronic device 200 is the unfolded state, the folded state, or a partially unfolded or folded state (or an intermediate state). According to an example embodiment, unlike the first housing structure 210, the second housing structure 220 may additionally include the sensor area 222, in which various sensors are arranged, however, the first housing structure 210 and the second housing structure 220 may have shapes symmetrical to each other in areas other than the sensor area 222.

According to an example embodiment, as shown in FIG. 2A, the first housing structure 210 and the second housing structure 220 may together form a recess for accommodating the display 250. In an example embodiment, due to the sensor area 222, the recess may have at least two different widths in a direction perpendicular to the folding axis A. For example, the recess may have a first width w1 between a first portion 210a of the first housing structure 210 parallel to the folding axis A and a first portion 220a of the second housing structure 220 formed on a periphery of the sensor area 222, and a second width w2 formed by a second portion 210b of the first housing structure 210 and a second portion 220b of the second housing structure 220 not corresponding to the sensor area 222 and being parallel to the folding axis A. In this case, the second width w2 may be greater than the first width w1. In an example embodiment, the first portion 220a and the second portion 220b of the second housing structure 220 may be at different distances from the folding axis A. The widths of the recess are not limited to the shown example. In an example embodiment, the recess may have a plurality of widths according to the shape of the sensor area 222 or asymmetrical portions of the first housing structure 210 and the second housing structure 220. In an example embodiment, the sensor area 222 may be formed to have a predetermined area adjacent to one corner of the second housing structure 220. However, the arrangement, shape, and size of the sensor area 222 are not limited to the shown example. For example, in an example embodiment, the sensor area 222 may be provided at another corner of the second housing structure 220 or in a predetermined area between an upper corner and a lower corner. In an example embodiment, components embedded in the electronic device 200 to perform various functions may be exposed to the front surface of the electronic device 200 through the sensor area 222 or through one or more openings provided in the sensor area 222. In one embodiment, the components may include various types of sensors. The sensors may include, for example, at least one of a front camera, a receiver, or a proximity sensor. According to an example embodiment, the sensor area 222 may not be included in the second housing structure 220 or may be formed at a position different from that shown in the drawings.

According to an example embodiment, at least a portion of the first housing structure 210 and the second housing structure 220 may be formed of a metal material or a non-metal material having a selected magnitude of rigidity to support the display 250. At least a portion formed of the metal material may provide a ground plane for the electronic device 200, and may be electrically connected, directly or indirectly, to a ground line formed on a printed circuit board (PCB) disposed inside the foldable housing 201.

According to an example embodiment, the first rear cover 215 may be disposed on one side of the folding axis A on a rear surface of the electronic device 200, and may have, for example, a substantially rectangular periphery that may be surrounded by the first housing structure 210. Similarly, the second rear cover 225 may be disposed on the other side of the folding axis A on the rear surface of the electronic device 200, and may have a periphery that may be surrounded by the second housing structure 220.

In an example embodiment, the first rear cover 215 and the second rear cover 225 may have substantially symmetrical shapes with respect to the folding axis A. However, the first rear cover 215 and the second rear cover 225 are not necessarily mutually symmetrical. In another example, the electronic device 200 may include a first rear cover 215 and a second rear cover 225 in various shapes. In an example embodiment, the first rear cover 215 may be formed integrally with the first housing structure 210, and the second rear cover 225 may be formed integrally with the second housing structure 220.

According to an example embodiment, the first rear cover 215, the second rear cover 225, the first housing structure 210, and the second housing structure 220 may form a space in which various components (e.g., a PCB, or a battery) of the electronic device 200 are to be disposed. In an example embodiment, one or more components may be disposed or visually exposed on the rear surface of the electronic device 200. For example, at least a portion of a sub-display may be visually exposed through a first rear area 216 of the first rear cover 215. In an example embodiment, one or more components or sensors may be visually exposed through a second rear area 226 of the second rear cover 225. In an example embodiment, the sensors may include a proximity sensor and/or a rear camera.

According to an example embodiment, a front camera exposed to the front surface of the electronic device 200 through one or more openings provided in the sensor area 222, or a rear camera exposed through the second rear area 226 of the second rear cover 225 may include one or more lenses, an image sensor, and/or an image signal processor. A flash may include, for example, a light-emitting diode (LED) or a xenon lamp. In an example embodiment, two or more lenses (e.g., infrared camera, wide-angle, and telephoto lenses) and image sensors may be disposed on one surface of the electronic device 200.

Referring to FIG. 2B, the hinge cover may be disposed between the first housing structure 210 and the second housing structure 220 to cover internal components (e.g., the hinge structure 230). According to an example embodiment, the hinge structure 230 may be covered by a portion of the first housing structure 210 and a portion of the second housing structure 220, or may be exposed to the outside, depending on the state (e.g., the unfolded state, the intermediate state, or the folded state) of the electronic device 200.

For example, when the electronic device 200 is in the unfolded state (e.g., the fully unfolded state) as illustrated in FIG. 2A, the hinge structure 230 may be covered by the first housing structure 210 and the second housing structure 220 not to be exposed. In another example, when the electronic device 200 is in the folded state (e.g., a fully folded state), as shown in FIG. 2B, the hinge structure 230 may be exposed to the outside between the first housing structure 210 and the second housing structure 220. In another example, when the first housing structure 210 and the second housing structure 220 are in the intermediate state where the first housing structure 210 and the second housing structure 220 are folded with a certain angle, a portion of the hinge structure 230 may be exposed to the outside between the first housing structure 210 and the second housing structure 220. However, the area exposed in this example may be smaller than that in the fully folded state. In an example embodiment, the hinge structure 230 may include a curved surface.

According to an example embodiment, the display 250 may be disposed in a space formed by the foldable housing 201. For example, the display 250 may be seated in the recess formed by the foldable housing 201 and may be viewed from the outside through the front surface of the electronic device 200. For example, the display 250 may constitute most of the front surface of the electronic device 200. Accordingly, the front surface of the electronic device 200 may include the display 250, and a partial area of the first housing structure 210 and a partial area of the second housing structure 220, which are adjacent to the display 250. In addition, the rear surface of the electronic device 200 may include the first rear cover 215, a partial area of the first housing structure 210 adjacent to the first rear cover 215, the second rear cover 225, and a partial area of the second housing structure 220 adjacent to the second rear cover 225.

In an example embodiment, the display 250 may refer to a display in which at least one area is transformable into a planar surface or a curved surface. In an example embodiment, the display 250 may include a third area 253, a first area 251 disposed on one side of the third area 253 (e.g., on the left side of the third area 253 shown in FIG. 2A), and a second area 252 disposed on the other side of the third area 253 (e.g., on the right side of the third area 253 shown in FIG. 2A).

However, the area division of the display 250 shown in FIG. 2A is merely an example, and the display 250 may be divided into a plurality of areas (e.g., four or more areas, or two areas) depending on the structure or functions thereof. In an example, as shown in FIG. 2A, the display 250 may be divided into areas based on the third area 253 extending in parallel to the folding axis A. In another example, the display 250 may be divided into areas based on another folding axis (e.g., a folding axis parallel to a width direction of an electronic device).

In an example embodiment, the third area 253 may be a foldable area. In an example embodiment, the third area 253 may be an area that bends or stretches based on a folding state of the display 250. For example, the third area 253 may be a folding area, a flexible area, or a foldable area and the first area 251 and the second area 252 may be inflexible areas. In an example embodiment, the third area 253 may be an area corresponding to an area provided in a hinge assembly (e.g., a hinge assembly 400 of FIGS. 3 to 8D or a hinge assembly 500 of FIGS. 9 to 14C).

According to an example embodiment, the display 250 may be coupled to or disposed adjacent to a touch panel including a touch sensing circuit and a pressure sensor for measuring a strength (a pressure) of a touch. For example, the display 250 is an example of a touch panel, and may be coupled to or disposed adjacent to a touch panel for detecting an electromagnetic resonance (EMR) type stylus pen.

According to an example embodiment, the first area 251 and the second area 252 may generally have symmetrical shapes with respect to the third area 253. However, unlike the first area 251, the second area 252 may include a notch cut according to the presence of the sensor area 222, but may be symmetrical to the first area 251 in the other areas. For example, the first area 251 and the second area 252 may include mutually symmetrical portions and mutually asymmetrical portions.

According to an example embodiment, an edge thickness of each of the first area 251 and the second area 252 may be different from an edge thickness of the third area 253. The edge thickness of the third area 253 may be less than those of the first area 251 and the second area 252. For example, the first area 251 and the second area 252 may be asymmetrical in terms of thickness when cross-sectionally viewed. For example, an edge of the first area 251 may be formed to have a first radius of curvature and an edge of the second area 252 may be formed to have a second radius of curvature that is different from the first radius of curvature. In another example, the first area 251 and the second area 252 may be symmetrical in terms of thickness when cross-sectionally viewed.

Hereinafter, each area of the display 250 and operations of the first housing structure 210 and the second housing structure 220 depending on the state (e.g., a folded state, an unfolded state, or an intermediate state) of the electronic device 200) will be described.

According to an example embodiment, when the electronic device 200 is in the unfolded state (e.g., FIG. 2A), the first housing structure 210 and the second housing structure 220 may be arranged to face the same direction while forming an unfolding angle (e.g., about 180 degrees, or 170 to 190 degrees). The surface of the first area 251 of the display 250 and the surface of the second area 252 thereof may face the same direction (e.g., a front direction of an electronic device) with an angle of 180 degrees. The third area 253 may form the same plane together with the first area 251 and the second area 252.

According to an example embodiment, when the electronic device 200 is in the folded state (e.g., FIG. 2B), the first housing structure 210 and the second housing structure 220 may be arranged to face each other. The surface of the first area 251 and the surface of the second area 252 of the display 250 may face each other and may form a folding angle that is a narrow angle (e.g., an angle between 0 degrees to 10 degrees). At least a portion of the third area 253 may form a curved surface having a predetermined curvature.

According to an example embodiment, when the electronic device 200 is in the intermediate state, the first housing structure 210 and the second housing structure 220 may be arranged to form a predetermined angle (e.g., 10 to 170 degrees) therebetween. The surface of the first area 251 and the surface of the second area 252 of the display 250 may form an angle greater than that in the folded state and smaller than that in the unfolded state. At least a portion of the third area 253 may include a curved surface having a predetermined curvature, and the curvature may be less than that in the folded state.

FIG. 2C illustrates a fully unfolded state of the electronic device 200 and FIG. 2D illustrates a partially folded stat (or an intermediate state) of the electronic device 200. As described above, the state of the electronic device 200 may be changed to the folded state or the unfolded state. According to an example embodiment, when viewed in a direction of a folding axis (e.g., the folding axis A of FIG. 2A), the electronic device 200 may be folded in two types, e.g., an "in-folding" type in which the front surface of the electronic device 200 is folded to form an acute angle, and an "out-folding" type in which the front surface of the electronic device 200 is folded to form an obtuse angle. In an example, in the state in which the electronic device 200 is folded in the in-folding type, the first surface of the first housing structure 210 may face the third surface of the second housing structure 220. In the fully unfolded state, the first surface of the first housing structure 210 and the third surface of the second housing structure 220 may face the same direction (e.g., a direction parallel to the z-axis).

In another example, when the electronic device 200 is folded in the out-folding type, the second surface of the first housing structure 210 may face the fourth surface of the second housing structure 220.

In addition, although not shown in the drawings, the electronic device 200 may include a plurality of hinge axes (e.g., two parallel hinge axes including the folding axis A of FIG. 2A and another axis parallel to the folding axis A). In this example, the electronic device 200 may also be folded in a "multi-folding" type in which the in-folding type is combined with the out-folding type.

The in-folding type may refer to a state in which the display 250 is not exposed to the outside in the fully folded state. The out-folding type may refer to a state in which the display 250 is exposed to the outside in the fully folded state. FIG. 2D shows an intermediate state in which the electronic device 200 is partially unfolded in an in-folding process.

Although the state in which the electronic device 200 is folded in the in-folding type will be described below for convenience's sake, it should be noted that the description may be similarly applied to the state in which the electronic device 200 is folded in the out-folding type.

Figure 3:
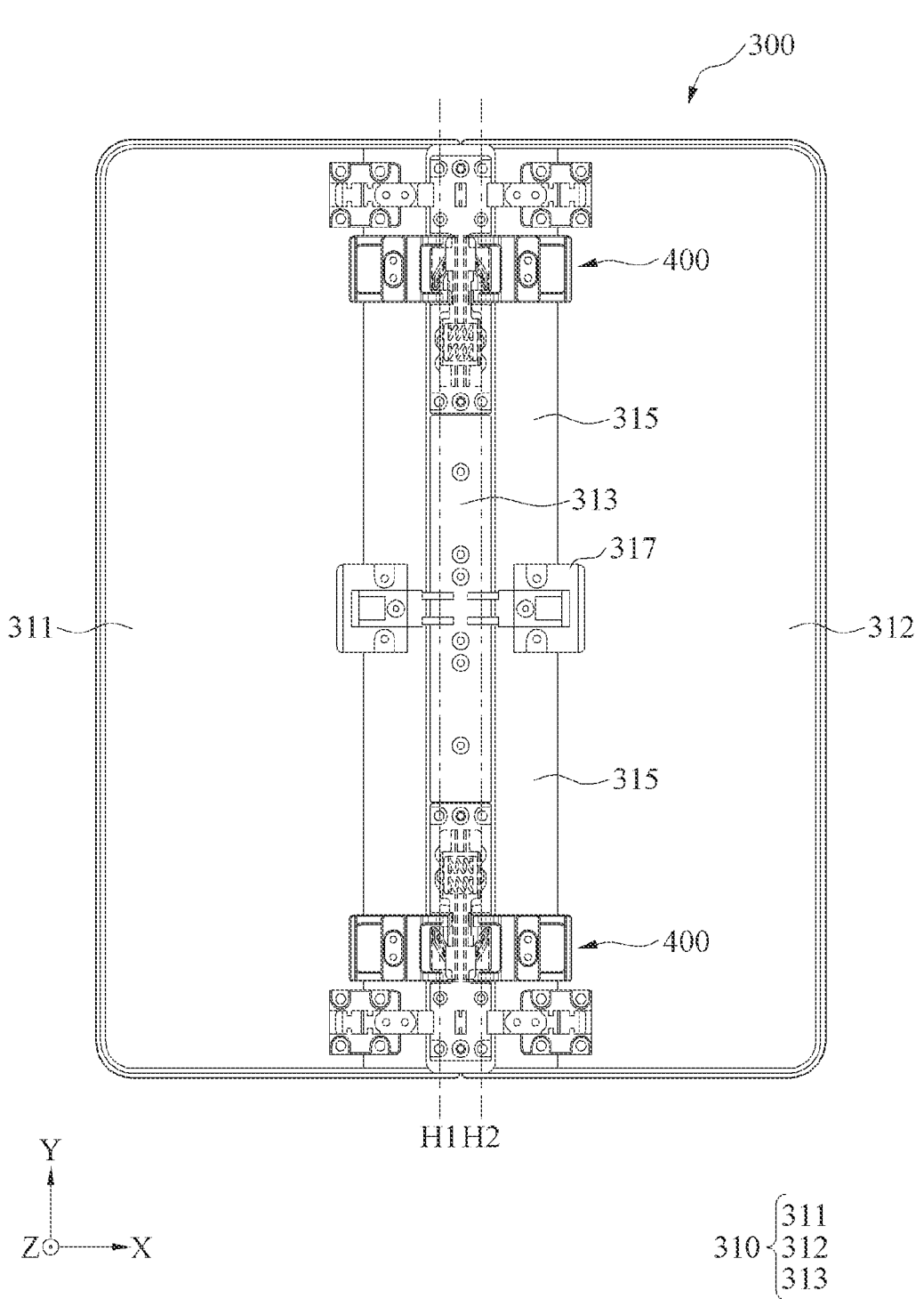
FIG. 3 is a front view illustrating a state in which a hinge assembly is applied to an electronic device according to an example embodiment.

FIG. 3 is a front view illustrating a state in which a hinge assembly 400 is applied to an electronic device according to an example embodiment.

Referring to FIG. 3, an electronic device 300 (e.g., the electronic device 101 of FIG. 1 or the electronic device 200 of FIGS. 2A through 2C) according to an example embodiment may be a foldable electronic device. For example, the electronic device 300 may be folded or unfolded based on a pair of hinge axes H1 and H2. The pair of hinge axes H1 and H2 may be substantially parallel with each other.

However, FIG. 3 is merely an example, and the size, the shape, the structure, and the hinge axes of the electronic device 300 are not limited thereto. For example, the electronic device 300 of FIG. 3 may include the hinge axis H1 or H2 in a long side direction (e.g., the Y-axis direction). However, the example is not limited thereto and an electronic device in an example embodiment may also include a hinge axis in a short side direction (e.g., the X-axis direction).

The electronic device 300 according to an example embodiment may include a housing 310 (e.g., the foldable housing 201 of FIGS. 2A through 2D), a display (not illustrated) (e.g., the display module 160 of FIG. 1 or the display 250 of FIGS. 2A through 2D), and the hinge assembly 400.

In an example embodiment, the housing 310 may form at least a portion of an exterior of the electronic device 300. The housing 310 may include a first housing 311 (e.g., the first housing structure 210 of FIGS. 2A through 2D), a second housing 312 (e.g., the second housing structure 220 of FIGS. 2A through 2D), and a hinge housing 313.

In an example embodiment, the first housing 311 and the second housing 312 may be foldably connected to each other by the hinge assembly 400. An angle or distance between the first housing 311 and the second housing 312 may vary depending on whether the electronic device 300 is in a flat state or unfolded state, a folded state, or an intermediate state. The intermediate state described above may include all states between the unfolded state and the folded state.

In an example embodiment, the hinge housing 313 may be disposed between the first housing 311 and the second housing 312 to provide a space for mounting internal components (e.g., the hinge assembly 400). For example, the hinge housing 313 may be configured to cover the hinge assembly 400 such that the hinge assembly 400 is not exposed to the outside. For example, the hinge housing 313 may include at least one screw hole (not illustrated) to arrange an internal component (e.g., the hinge assembly 400).

In an example embodiment, the first housing 311 and the second housing 312 may provide a space in which the display 250 is disposed. The display 250 may be a foldable flexible display. For example, the display 250 may include a first area (e.g., the first area 251 of FIG. 2C and/or FIG. 2D), a second area (e.g., the second area 252 of FIG. 2C and/or FIG. 2D), and a third area (e.g., the third area 253 of FIG. 2C and/or FIG. 2D) between the first area 251 and the second area 252. The first housing 311 may be disposed at a position corresponding to the first area 251 of the display 250 to support the first area 251 of the display 250. The second housing 312 may be disposed at a position corresponding to the second area 252 of the display 250 to support the second area 252 of the display 250. In an example embodiment, the hinge housing 313 may be disposed at a position corresponding to the third area (e.g., the third area 253 of FIG. 2C and/or FIG. 2D) of the display 250.

In an example embodiment, the hinge assembly 400 may be disposed between the first housing 311 and the second housing 312 to connect, directly or indirectly, the first housing 311 to the second housing 312. For example, each of the first housing 311 and the second housing 312 may include a connection plate 315 and the hinge assembly 400 may be connected to the first housing 311 and the second housing 312 by fastening to the connection plate 315.

In an example embodiment, a hinge structure (e.g., the hinge structure 230 of FIG. 2B) of the electronic device 300 may include a plurality of hinge assemblies 400. The plurality of hinge assemblies 400 may be spaced apart from each other along a hinge axis H1 or H2.

In an example embodiment, as illustrated in FIG. 3, two hinge assemblies 400 may be spaced apart from each other along the hinge axis H1 or H2 and a sub hinge 317 may be disposed between the two hinge assemblies 400. For example, one hinge assembly 400 and the sub hinge 317 may be fastened to both ends of one connection plate 315 and the other hinge assembly 400 and the sub hinge 317 may be connected to both ends of another connection plate 315. The sub hinge 317 may be simultaneously connected, directly or indirectly, to the two connection plates 315 and the two hinge assemblies 400 and the sub hinge 317 may interoperate. However, this is only an example. The number of hinge assemblies 400 is not limited thereto and the sub hinge 317 may be omitted.

In an example embodiment, the hinge assembly 400 may implement folding or unfolding operations of the electronic device 300. The hinge assembly 400 may operate between a folded state in which the first area 251 and the second area 252 face each other and an unfolded state in which the first area 251 and the second area 252 do not face each other. The hinge assembly 400 may generate a force (e.g., a friction force) to maintain a specific folded state of the electronic device 300.

For example, when the electronic device 300 is in the folded state, the hinge assembly 400 may generate a force to maintain the electronic device 300 to be in the folded state. When the electronic device 300 is in the unfolded state, the hinge assembly 400 may generate a force for allowing the electronic device 300 to be in the unfolded state. When the electronic device 300 is in the intermediate state, the hinge assembly 400 may generate a force to maintain the intermediate state of the electronic device 300. In addition, the hinge assembly 400 may synchronize a folding angle of the first housing 311 with a folding angle of the second housing 312. For example, the hinge assembly 400 may interoperate a folding operation of the first housing 311 with a folding operation of the second housing 312 such that the folding angle of the first housing 311 may be synchronized with the folding angle of the second housing 312.

Figure 4A:
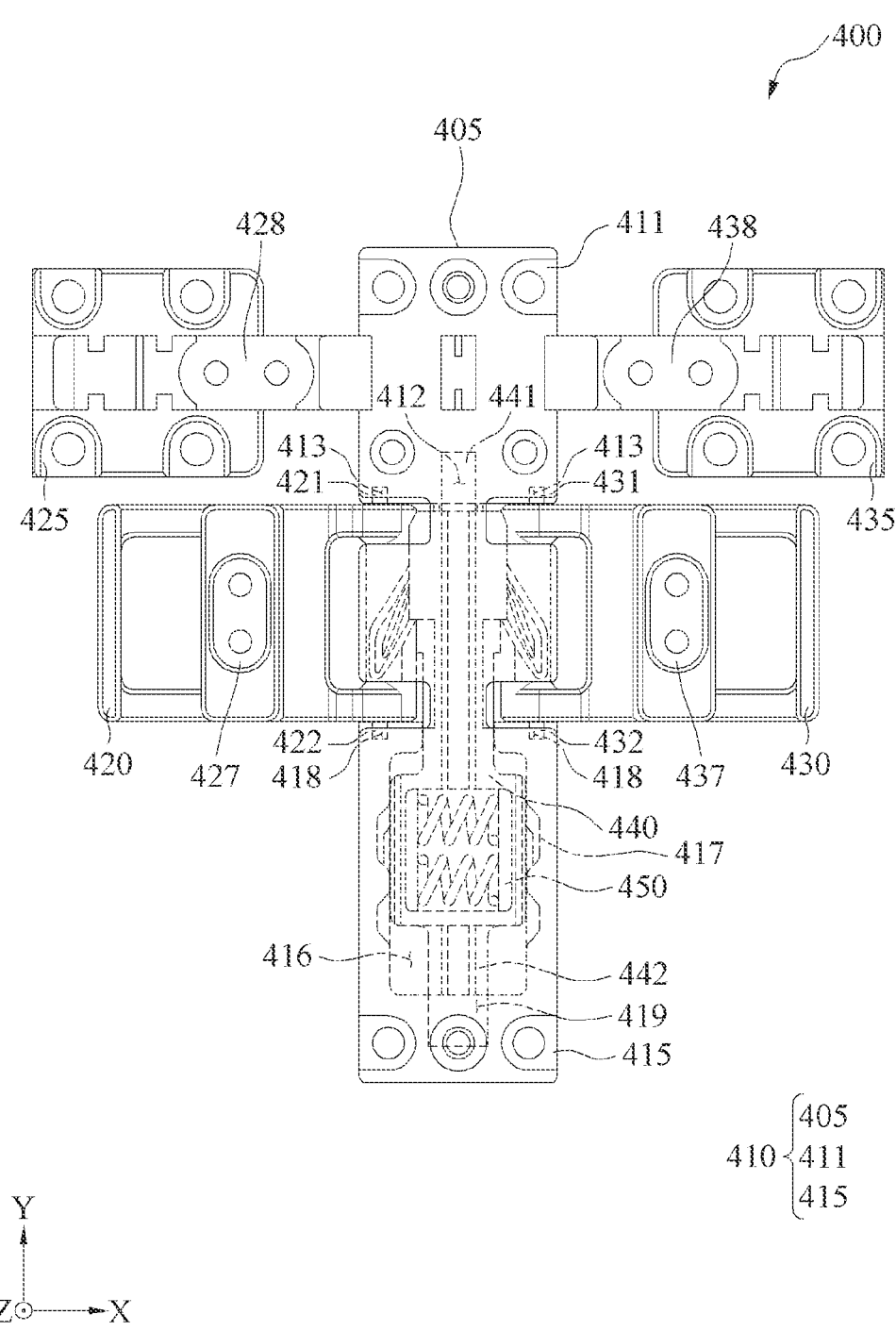
FIG. 4A is a front view of a hinge assembly according to an example embodiment.
Figure 4B:
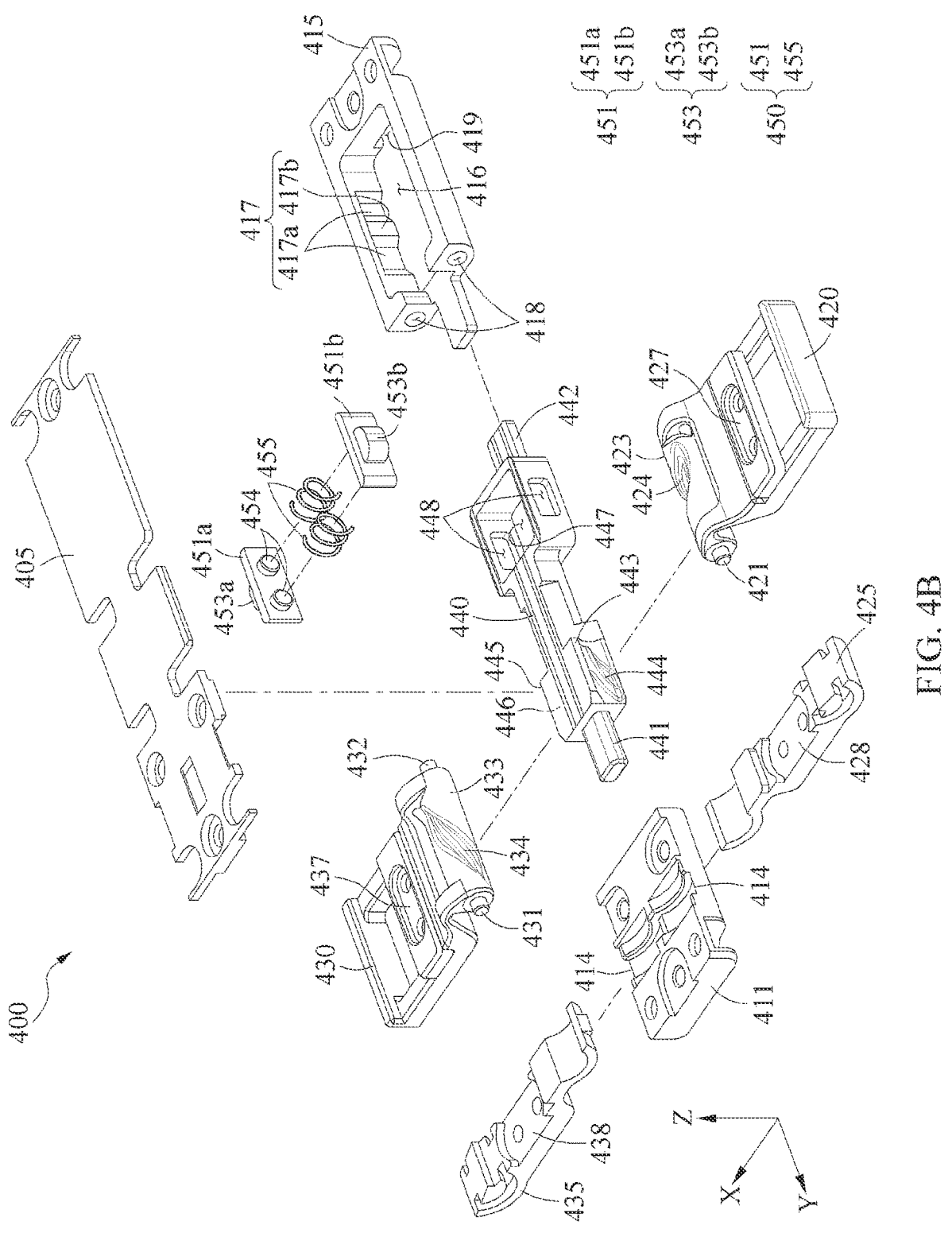
FIG. 4B is an exploded perspective view of the hinge assembly according to an example embodiment.

FIG. 4A is a front view of the hinge assembly 400 according to an example embodiment and FIG. 4B is an exploded perspective view of the hinge assembly 400 according to an example embodiment.

Referring to FIGS. 4A and 4B, the hinge assembly 400 in an embodiment may include a hinge bracket 410, a first rotator 420, a second rotator 430, a slide bracket 440, and a detent assembly 450.

Hereinafter, components and a structure of the hinge assembly 400 in an embodiment are described with reference to FIGS. 4A and 4B. However, this is only an example, and the structure, number, shape, and/or arrangement of the components of the hinge assembly 400 are not limited thereto.

The hinge bracket 410 in an embodiment may be fixedly connected, directly or indirectly, to a housing (e.g., the housing 310 of FIG. 3). For example, the hinge bracket 410 may be fixedly connected to the hinge housing (e.g., the hinge housing 313 of FIG. 3). The hinge bracket 410 may be formed to have a longitudinal direction (e.g., the Y-axis direction) parallel with a hinge axis (e.g., the hinge axis H1 or H2 of FIG. 3). In an example embodiment, the lower surface (e.g., a surface in the −Z direction) of the hinge bracket 410 may be formed substantially corresponding to an inner shape of the hinge housing 313.

In an example embodiment, the hinge bracket 410 may include at least one of a first bracket 411, a second bracket 415, and a hinge cover 405. For example, the first bracket 411 and the second bracket 415 may be separated from each other and may be connected to each other through other components (e.g., the slide bracket 440 or the first and second rotators 420 and 430). The hinge cover 405 may be connected, directly or indirectly, to a surface (e.g., the upper surface in the Z direction) of the hinge assembly 400 and may cover and protect internal components of the hinge assembly 400. However, the structure of the hinge assembly 400 is only an example and is not limited thereto in an actual implementation. The structure of the hinge assembly 400 may be implemented as the hinge bracket 410 formed in one body.

In an example embodiment, the first rotator 420 may include a plurality of bracket connecting members 421 and 422. In an example embodiment, the plurality hinge bracket connecting members 421 and 422 may include a first hinge bracket connecting member 421 and a second hinge bracket connecting member 422 facing both sides (e.g., both sides of the Y-axis), respectively.

In an example embodiment, the first hinge bracket connecting member 421 may be integrally formed with the second hinge bracket connecting member 422. For example, the first hinge bracket connecting member 421 and the second hinge bracket connecting member 422 may be integrally formed with the first rotator 420. As another example, the first hinge bracket connecting member 421 and the second hinge bracket connecting member 422 may be integrally formed with each other and may be disposed in the first rotator 420.

In an example embodiment, the first rotator 420 may include a first rotator pillar 423 to fasten to the slide bracket 440 and a first helical groove 424 formed in a helical shape in one direction based on a first hinge axis (e.g., the first hinge axis H1 of FIG. 3) may be formed in the first rotator pillar 423.

In an example embodiment, the first rotator 420 may include a first fastening area 427 to be fastened to another structure. In an example embodiment, the first fastening area 427 may include at least one hole to insert a fixing member (not illustrated), such as a screw, therein.

For example, the first rotator 420 may be fastened to a partial area (e.g., the first housing structure 210 of FIGS. 2A to 2D) and/or a partial area (e.g., the first area 251 of the display 250 of FIGS. 2A to 2D) of a display through the first fastening area 427.

In an example embodiment, when the first fastening area 427 is fixed and the first rotator 420 rotates toward the first hinge axis H1 as the hinge assembly 400 folds, the first housing structure 210 and/or the first area 251 of the display 250 may rotate by interoperating with the first rotator 420.

In an example embodiment, the second rotator 430 may include a plurality of hinge bracket connecting members 431 and 432. In an example embodiment, the plurality of hinge bracket connecting members 431 and 432 may include the third hinge bracket connecting member 431 and the fourth hinge bracket connecting member 432 facing both directions (e.g., both directions of the Y-axis), respectively.

In an example embodiment, the second rotator 430 may include a second rotator pillar 433 to fasten to the slide bracket 440 and a second helical groove 434 formed in a helical shape in one direction based on a second hinge axis (e.g., the second hinge axis H2 of FIG. 3) may be formed in the second rotator pillar 433.

In an example embodiment, the second rotator 430 may include a second fastening area 437 to be fastened to another structure. In an example embodiment, the second fastening area 437 may include at least one hole to insert a fixing member (not illustrated), such as a screw, therein.

For example, the second rotator 430 may be fastened to a partial area (e.g., the second housing structure 220 of FIGS. 2A to 2D) and/or a partial area (e.g., the second area 252 of the display 250 of FIGS. 2A to 2D) of a display through the second fastening area 437.

In an example embodiment, when the second fastening area 437 is fixed and the second rotator 430 rotates toward the second hinge axis H2 as the hinge assembly 400 folds, the second housing structure 220 and/or the second area 252 of the display 250 may rotate by interoperating with the second rotator 430.

In an example embodiment, the hinge assembly 400 may include a first sub-rotator 425 and a second sub-rotator 435. For example, the first sub-rotator 425 may be rotatably connected to the first bracket 411 based on the first hinge axis H1 and the second sub-rotator 435 may be rotatably connected to the first bracket 411 based on the second hinge axis H2.

In an example embodiment, the first sub-rotator 425 may be connected to a first housing (e.g., the first housing 311 of FIG. 3). The first sub-rotator 425 may rotate together with the first rotator 420 by interoperating with the first rotator 420 and may assist the first rotator 420. For example, the first sub-rotator 425 may include a third fastening area 428 to fasten to another structure, and by fastening to another area of the other structure to which the first fastening area 427 is fastened, the third fastening area 428 may help rotation of the first fastening area 427, may reinforce the hinge assembly 400 by distributing force received by the first fastening area 427, and may assist the first fastening area 427.

Each embodiment herein may be used in combination with any other embodiment(s) described herein.

In an example embodiment, the second sub-rotator 435 may be connected to a second housing (e.g., the second housing 312 of FIG. 3). The second sub-rotator 435 may rotate together with the second rotator 430 by interoperating with the second rotator 430 and may assist the second rotator 430. For example, the second sub-rotator 435 may include a fourth fastening area 438 to fasten to another structure, and by fastening to another area of the other structure to which the second fastening area 437 is fastened, the fourth fastening area 438 may help rotation of the second fastening area 437, may reinforce the hinge assembly 400 by distributing force received by the second fastening area 437, and may assist the second fastening area 437.

In an example embodiment, the hinge bracket 410 may include at least one of a first rotator connection space 413, a second rotator connection space 418, and a sub-rotator connection space 414.

In an example embodiment, the first bracket 411 may include a plurality of first rotator connection spaces 413 and the first hinge bracket connecting member 421 and the third hinge bracket connecting member 431 may be rotatably connected to each of the plurality of first rotator connection spaces 413.

In an example embodiment, the second bracket 415 may include a plurality of second rotator connection spaces 418 and the second hinge bracket connecting member 422 and the fourth hinge bracket connecting member 432 may be rotatably connected to each of the plurality of second rotator connection spaces 418.

In an example embodiment, the first bracket 411 may include a plurality of sub-rotator connection spaces 414 and the first sub-rotator 425 and the second sub-rotator 435 may be rotatably connected to each of the plurality of sub-rotator connection spaces 414.

In an example embodiment, the hinge bracket 410 may include at least one of slide connection spaces 412 and 419. For example, the first bracket 411 may include the first slide connection space 412 and the second bracket 415 may include the second slide connection space 419.

In an example embodiment, the second bracket 415 may include a detent assembly accommodation space 416 for accommodating the detent assembly 450 and/or at least a portion of the slide bracket 440. A slide rail 417, which is a side surface contacting the detent assembly 450, may be formed in the detent assembly accommodation space 416, wherein the slide rail 417 may include a flat area 417a and a protruding area 417b.

In an example embodiment, the slide bracket 440 may be between the first bracket 411 and the second bracket 415 and may be slidably connected to the first bracket 411 and the second bracket 415 in a sliding direction (e.g., the Y-axis direction). For example, both directions in which the slide bracket 440 slides may be a first axis direction and a direction perpendicular to the first axis direction (e.g., the X-axis direction) may be a second axis direction. The slide bracket 440 may include a first guide member 441 and a second guide member 442 formed in both directions facing the first axis direction.

In an example embodiment, the first guide member 441 may be arranged in the first slide connection space 412 and the second guide member 442 may be arranged in the second slide connection space 419. The first guide member 441 and the second guide member 442 may slide in the sliding direction in the first slide connection space 412 and the second slide connection space 419, respectively. The first guide member 441 and the second guide member 442 may restrict a sliding range of the slide bracket 440 and may prevent or reduce the chances of the slide bracket 440 from escaping.

In an example embodiment, the slide bracket 440 may include a first rotator connection space 443 to which the first rotator pillar 423 of the first rotator 420 is rotatably fastened. A first helical protrusion 444 interoperating with the first helical groove 424 may be formed in the first rotator connection space 443.

In an example embodiment, the slide bracket 440 may include a second rotator connection space 445 to which the second rotator pillar 433 of the second rotator 430 is rotatably fastened. A second helical protrusion 446 interoperating with the second helical groove 434 may be formed in the second rotator connection space 445.

In an example embodiment, the slide bracket 440 may include a detent space 447 for accommodating the detent assembly 450 and the detent space 447 may include a protrusion opening 448 that is open such that a partial area of a cam 451 of the detent assembly 450, for example, a protrusion area 453 of the cam 451, protrudes to the outside.

In an example embodiment, the detent assembly 450 may provide a detent force in a direction resisting movement of the slide bracket 440 in the first axis direction. The detent assembly 450 may be accommodated in the detent space 447 of the slide bracket 440 and may move in the first axis direction together with the slide bracket 440.

For example, the detent assembly 450 may be arranged in the slide bracket 440 to provide a detent force in a direction perpendicular to the moving direction (e.g., the first axis direction) of the slide bracket 440. For example, the detent assembly 450 may be disposed in an arrangement space (e.g., the detent space 447) of the slide bracket 440. For example, at least a portion of the detent assembly 450 may contact or connect to the slide bracket 440 in the arrangement space (e.g., the detent space 447) of the slide bracket 440.

In an example embodiment, the detent assembly 450 may include a cam 451 and an elastic member 455. The cam 451 may move in the second axis direction perpendicular to the first axis direction by interoperating with the movement of the slide bracket 440. A support protrusion 454 for supporting the elastic member 455 may be formed on a surface of the cam 451 facing the elastic member 455 and the protrusion area 453 may be formed in the opposite surface of the cam 451. The elastic member 455 may provide an elastic force in the second axis direction by interoperating with the movement of the cam 451.

In an example embodiment, a plurality of cams 451 may be provided and the plurality of cams 451 may include a first cam 451*a* and a second cam 451*b* spaced apart from each other in both directions (e.g., the X-axis direction or the second axis direction) to which an elastic force is applied based on the elastic member 455. The first cam 451*a* may include a first protrusion area 453*a* and the second cam 451*b* may include a second protrusion area 453*b*. The detent space 447 may include a plurality of protrusion openings 448 formed as a pair with the first cam 451*a* and the second cam 451*b* in the second axis direction, and the first protrusion area 453*a* and the second protrusion area 453*b* may be inserted into and withdrawn from the plurality of protrusion openings 448, respectively.

In an example embodiment, the detent assembly 450 may provide a folding detent force and an unfolding detent force in response to folding and unfolding operations of the hinge assembly 400 through an elastic force of the elastic member 455.

In an example embodiment, the detent assembly 450 may include at least one cam 451 and/or at least one elastic member 455. For example, the detent assembly 450 may include at least one cam 451 and at least one elastic member 455. For example, the detent assembly 450 may include an elastic structure body (e.g., a leaf spring) that functions as the cam and the elastic member.

Figure 5A:
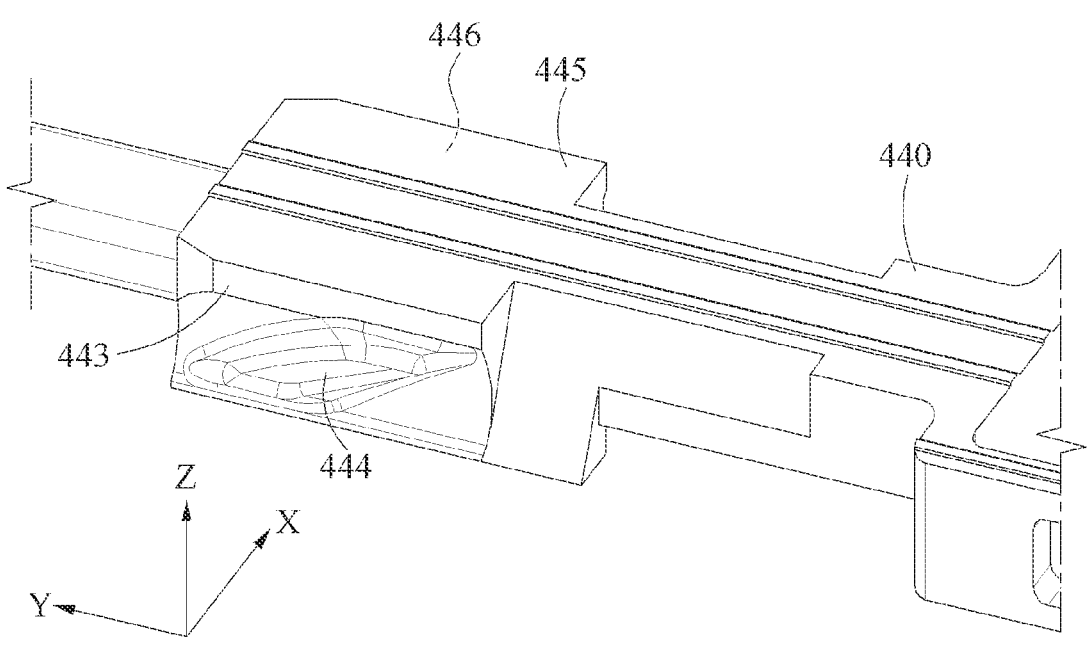
FIG. 5A is an enlarged perspective view of a slide bracket according to an example embodiment.
Figure 5B:
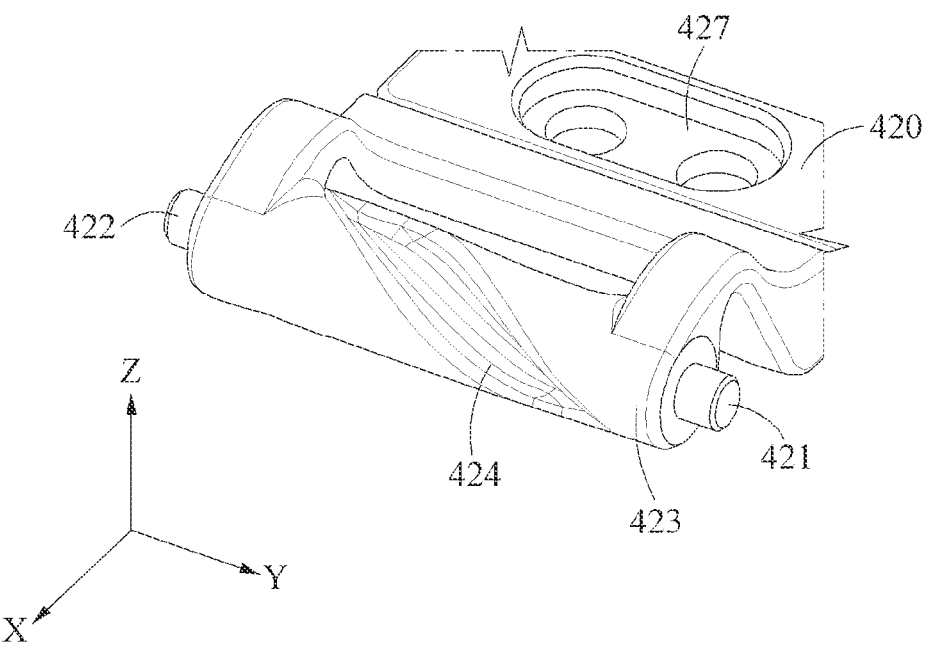
FIG. 5B is an enlarged perspective view of a rotator according to an example embodiment.
Figure 5C:
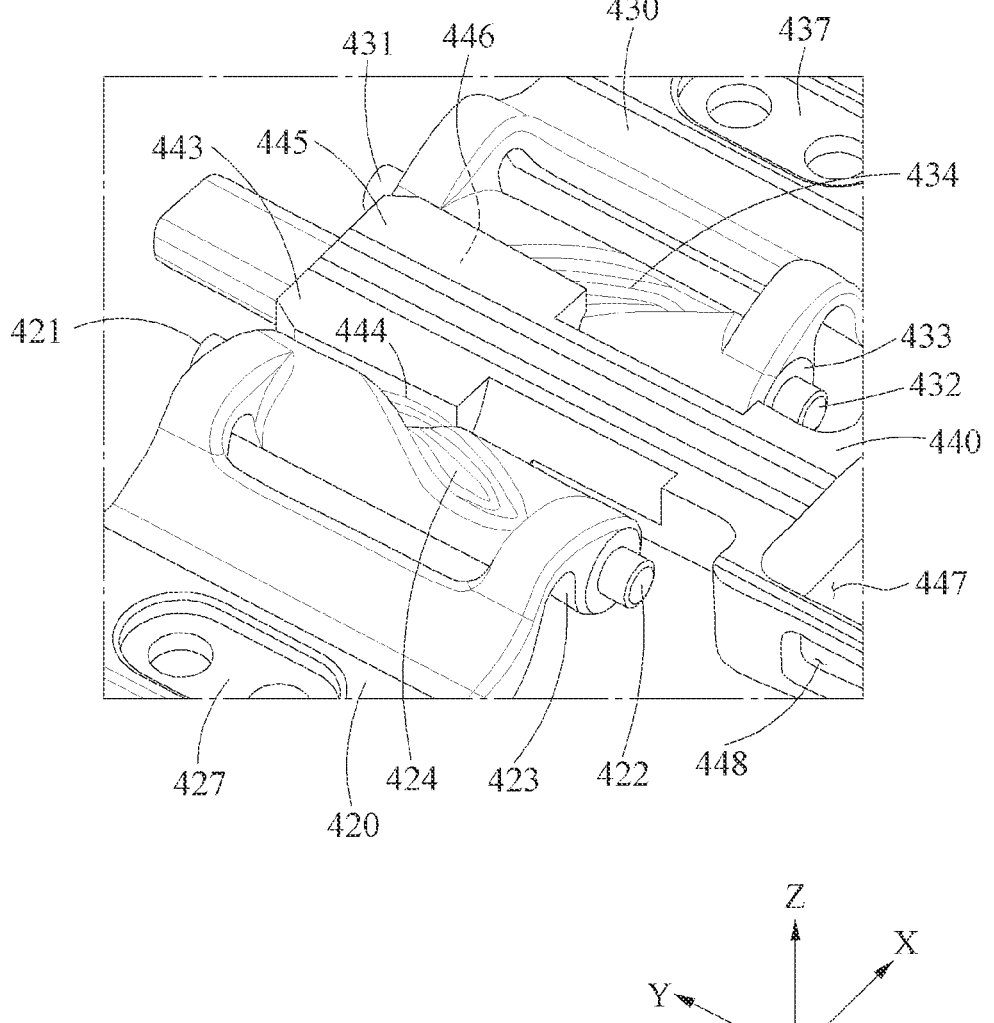
FIG. 5C is an enlarged perspective view of a hinge assembly in an unfolded state according to an example embodiment.
Figure 5D:
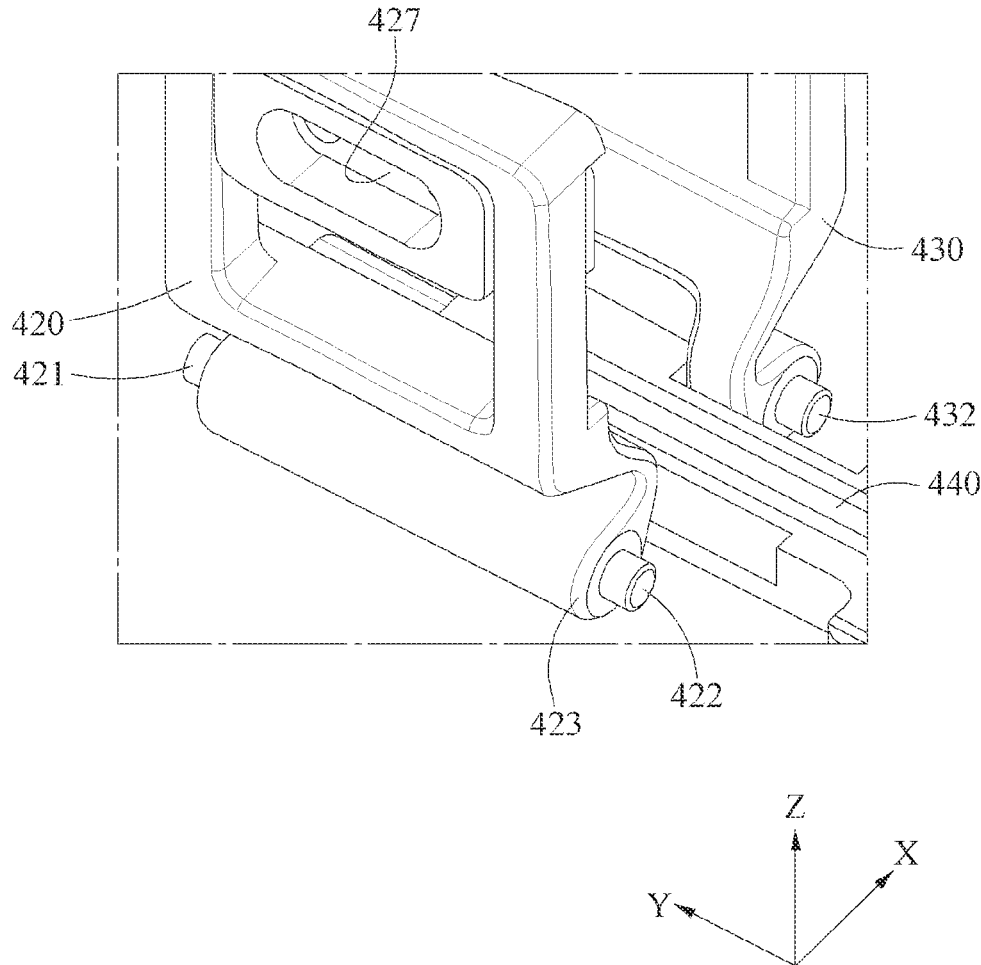
FIG. 5D is an enlarged perspective view of the hinge assembly in a folded state according to an example embodiment.

FIG. 5A is an enlarged perspective view of the slide bracket 440 according to an example embodiment, FIG. 5B is an enlarged perspective view of the second rotator 430 according to an example embodiment, FIG. 5C is an enlarged perspective view of the hinge assembly 400 in an unfolded state according to an example embodiment, and FIG. 5D is an enlarged perspective view of the hinge assembly 400 in a folded state according to an example embodiment.

Referring to FIGS. 5A to 5D, the slide bracket 440 in an embodiment may slide in interoperation with rotations of the first rotator 420 and the second rotator 430. Hereinafter, to describe FIGS. 5A to 5D, the descriptions provided with reference to FIGS. 4A and 4B are omitted.

In an example embodiment, the first rotator 420 may be rotatably connected to the slide bracket 440 (or the hinge bracket 410) based on the first hinge axis H1, and the second rotator 430 may be rotatably connected to the slide bracket 440 (or the hinge bracket 410) based on the second hinge axis H2. The first rotator 420 and the second rotator 430 may be formed in substantially symmetrical shapes based on the first axis direction (e.g., the Y-axis direction) parallel with the hinge axis H1 or H2.

In an example embodiment, the slide bracket 440 may be slidably connected to the second bracket 415 in the first axis direction (e.g., the Y-axis direction) parallel with the first hinge axis H1 or the second hinge axis H2 by interoperating with rotations of the first rotator 420 and the second rotator 430. The slide bracket 440 may include the first rotator connection space 443 and the second rotator connection space 445 to rotatably connect to the first rotator 420 and the second rotator 430.

In an example embodiment, the slide bracket 440 may spiral-slide by interoperating with rotations of the first rotator 420 and the second rotator 430. The spiral-slide may refer to an operation or a structure in which the slide bracket 440 slides by engaging with spiral structures of the first rotator 420 and the second rotator 430 in interoperation with rotations of the first rotator 420 and the second rotator 430. For example, the first helical groove 424 of the first rotator 420 and the second helical groove 434 of the second rotator 430 may interoperate with the first helical protrusion 444 and the second helical protrusion 446, respectively.

In an example embodiment, the first helical groove 424 may be formed in the first rotator 420 and the first helical protrusion 444 may be formed in the first rotator connection space 443 of the slide bracket 440. Hereinafter, the descriptions of the first helical groove 424 and the first helical protrusion 444 may be applicable to the second helical groove 434 of the second rotator 430 and the second helical protrusion 446 of the second rotator connection space 445 in substantially the same or similar manner.

In an example embodiment, the first helical protrusion 444 may include an arc shape and the center of the arc shape of the first helical protrusion 444 may be the first hinge axis H1. For example, the first helical protrusion 444 may include an arc shape with the first hinge axis H1 as the center. The first helical protrusion 444 may protrude in the first hinge axis direction from two surfaces of the first helical groove 424 that face each other. For example, the first helical protrusion 444 and the second helical protrusion 446 may be formed in both side surfaces (e.g., a pair of surfaces in the X-axis direction) of the slide bracket 440, respectively.

In an example embodiment, the first helical groove 424 may be recessed in the outer circumferential surface of the first rotator pillar 423. The first helical groove 424 may include an arc shape with the first hinge axis H1 as the center.

In an example embodiment, the first helical protrusion 444 may interoperate with the first helical groove 424. The first helical protrusion 444 may slide along the helical shape of the first helical groove 424 by being inserted into the first helical groove 424. The first helical protrusion 444 may be formed in a direction corresponding to a helical direction of the first helical groove 424.

In an example embodiment, the second helical protrusion 446 may interoperate with the second helical groove 434. The second helical protrusion 446 may slide along the helical shape of the second helical groove 434 by being inserted into the second helical groove 434. The second helical protrusion 446 may be formed in a direction corresponding to a helical direction of the second helical groove 434.

For example, the first helical protrusion 444 may be inserted into the first helical groove 424. The arc shape of the first helical protrusion 444 may substantially correspond to the arc shape of the first helical groove 424. The width of the first helical protrusion 444 may substantially correspond to the width of the first helical groove 424. The first helical groove 424 may rotate on the first hinge axis H1 along the first helical protrusion 444 in a designated angle range. According to the structure described above, the first rotator 420 may rotate on the first hinge axis H1 in the designated angle range relative to the hinge bracket 440. However, this is an example, and the hinge assembly 400 in an embodiment may include a recessed structure (not illustrated) corresponding to the first helical protrusion 444 or a protruding structure (not illustrated) corresponding to the first helical groove 424.

In an example embodiment, the first helical protrusion 444 may be formed in a helical shape in a clockwise direction when facing the upper side (e.g., the +Y direction) from the lower side (e.g., the −Y direction) and the second helical protrusion 446 may be formed in a helical shape in a counterclockwise direction when facing the upper side (e.g., the +Y direction) from the lower side (e.g., the −Y direction). However, the example is not limited thereto and may be formed conversely.

In an example embodiment, the slide bracket 440 may slide in the first axis direction (e.g., the Y-axis direction) parallel with the hinge axis H1 or H2 direction along the first helical protrusion 444 and the second helical protrusion 446. According to the structure described above, the slide bracket 440 may slide in the first axis direction relative to the hinge bracket 410.

In an example embodiment, when the first rotator 420 and the second rotator 430 rotate from the unfolded state (e.g., the state of FIG. 5C) to the folded state (e.g., the state of FIG. the first helical groove 424 and the second helical groove 434 may rotate along the first hinge axis H1 and the second hinge axis H2, respectively. The first helical protrusion 444 and the second helical protrusion 446 may be pushed in one (e.g., the −Y direction) of the first axis directions by interoperating with rotations of the first helical groove 424 and the second helical groove 434 and as a result, the slide bracket 440 may slide in one (e.g., the −Y direction) of the first axis directions (e.g., the Y-axis direction).

In an example embodiment, because the slide bracket 440 is operatively connected to the first rotator 420 and the second rotator 430 through the first helical protrusion 444 and the second helical protrusion 446, the two rotators (the first rotator 420 and the second rotator 430) may fold by interoperating with each other. For example, as the first rotator 420 rotates, the first helical groove 424 may push the first helical protrusion 444 and in interoperation therewith, the second helical protrusion 446 may push the second helical groove 434. As a result, the second rotator 430 may rotate in interoperation with rotation of the first rotator 420.

Figure 6A:
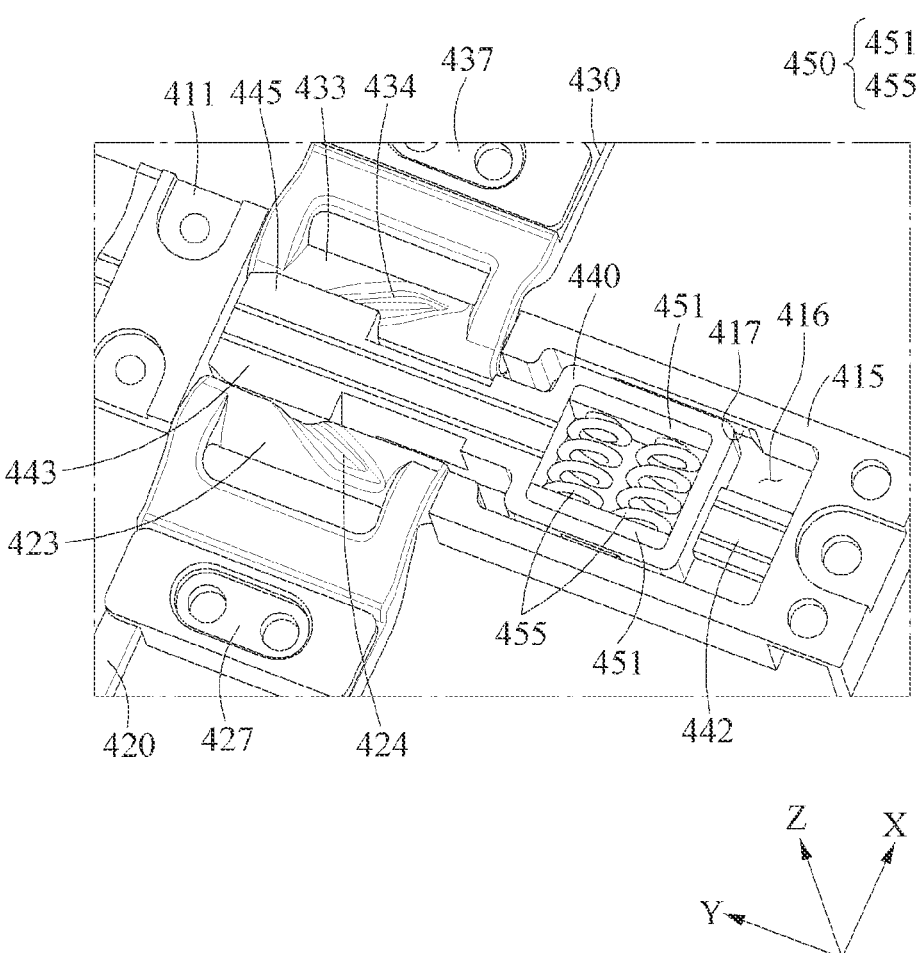
FIG. 6A is a perspective view of the hinge assembly in an unfolded state according to an example embodiment.
Figure 6B:
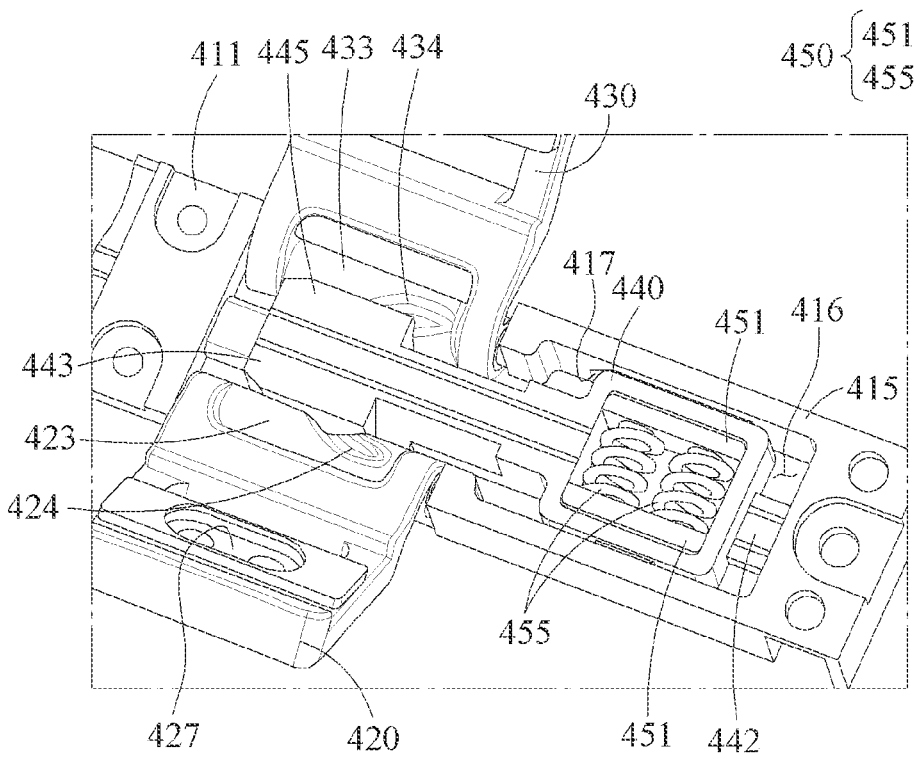
FIG. 6B is a perspective view of the hinge assembly in an intermediate state according to an example embodiment.
Figure 6B:
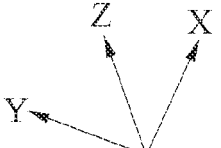
Figure 6C:
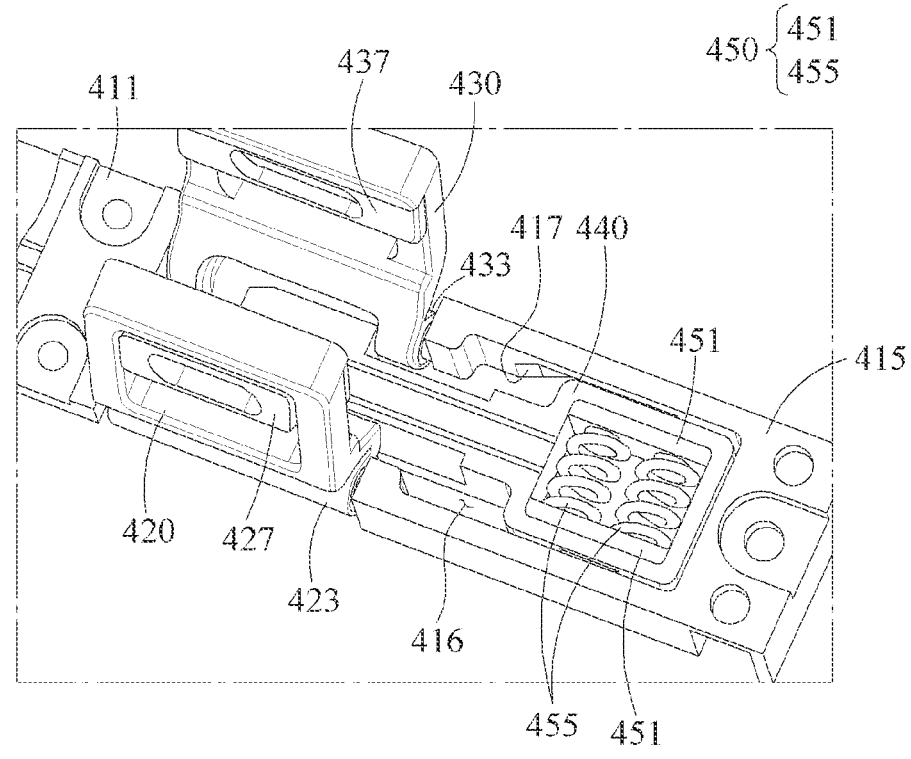
FIG. 6C is a perspective view of the hinge assembly in a folded state according to an example embodiment.
Figure 7A:
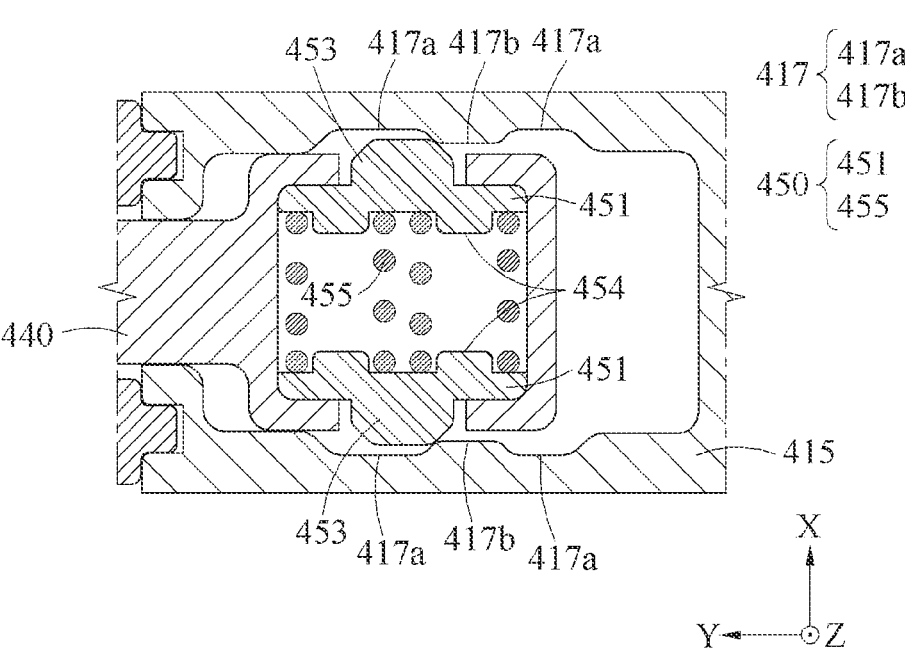
FIG. 7A is a partial cross-sectional view of the hinge assembly in an unfolded state according to an example embodiment.
Figure 7B:
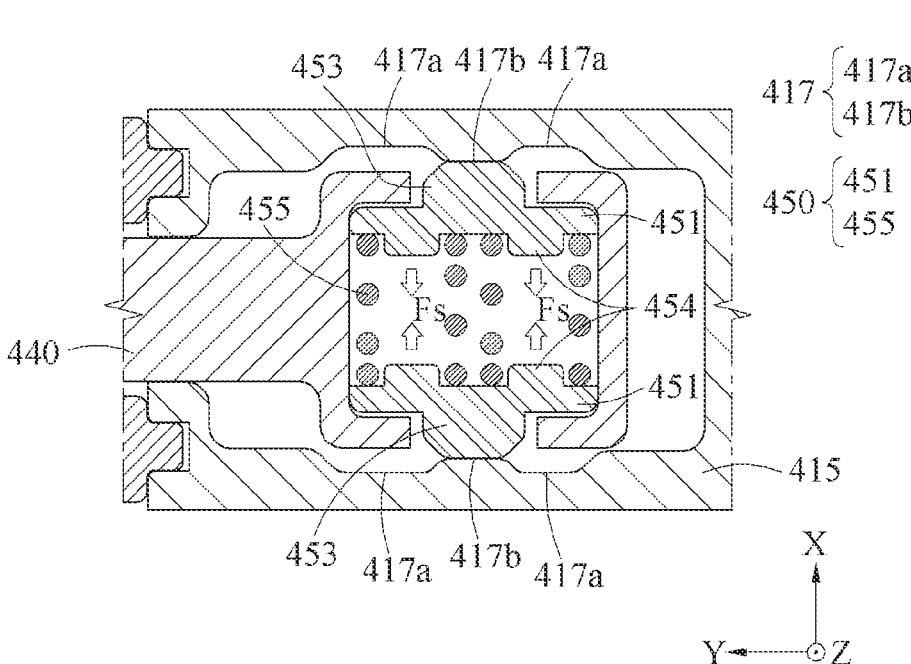
FIG. 7B is a partial cross-sectional view of the hinge assembly in an intermediate state according to an example embodiment.
Figure 7C:
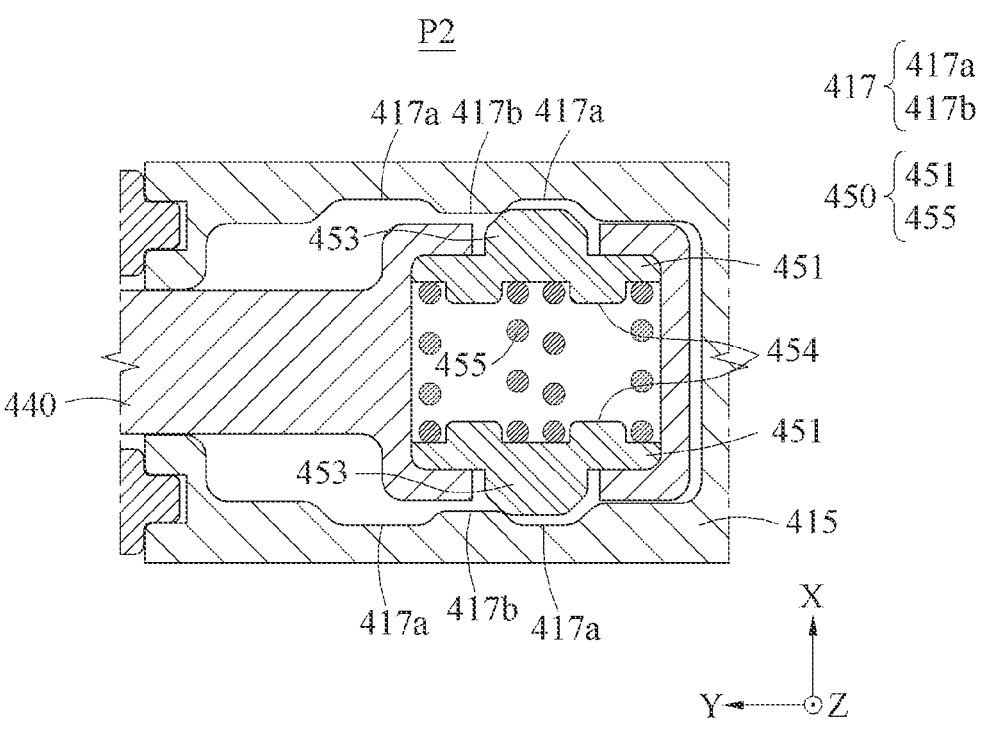
FIG. 7C is a partial cross-sectional view of the hinge assembly in a folded state according to an example embodiment.

FIG. 6A is a perspective view of the hinge assembly 400 in an unfolded state according to an example embodiment, FIG. 6B is a perspective view of the hinge assembly 400 in an intermediate state according to an example embodiment, FIG. 6C is a perspective view of the hinge assembly 400 in a folded state according to an example embodiment, FIG. 7A is a partial cross-sectional view of the hinge assembly 400 in an unfolded state according to an example embodiment, FIG. 7B is a partial cross-sectional view of the hinge assembly 400 in an intermediate state according to an example embodiment, and FIG. 7C is a partial cross-sectional view of the hinge assembly 400 in a folded state according to an example embodiment.

For example, the cross-sectional view of the hinge assembly 400 of FIG. 7A may correspond to the state of the hinge assembly 400 of FIG. 6A and the cross-sectional view of the hinge assembly 400 of FIG. 7B may correspond to the state of the hinge assembly 400 of FIG. 4B, and the cross-sectional view of the hinge assembly 400 of FIG. 7C may correspond to the state of the hinge assembly 400 of FIG. 6C.

Referring to FIGS. 6A to 7C, the detent assembly 450 in an embodiment may provide a detent force by interoperating with movement of the slide bracket 440.

Herein, in an example embodiment, the hinge assembly 400 may have a rotation structure that rotates the first housing (e.g., the first housing 311 of FIG. 3) and the second housing (e.g., the second housing 312 of FIG. 3) through the first rotator 420 and the second rotator 430. Alternatively, the hinge assembly 400 may have an interoperation structure that rotates the first rotator 420 and the second rotator 430 at substantially the same angle through the slide bracket 440 that spiral-slides by interoperating with the first rotator 420 and the second rotator 430. Alternatively, the hinge assembly 400 may have a detent structure through the detent assembly 450 that limits or helps movement of the slide bracket 440. Hereinafter, the rotation structure, the interoperation structure, and the detent structure implemented by various components of the hinge assembly 400 are described.

The hinge assembly 400 in an embodiment may be in an unfolded state (e.g., the state of FIG. 6A or the state at a first position P1 of FIG. 7A), an intermediate state (e.g., the state of FIG. 6B or the state at an intermediate position P0 of FIG. 7B), and a folded state (e.g., the state of FIG. 6C or the state at a second position P2 of FIG. 7C) as the first rotator 420 and the second rotator 430 rotate on the first hinge axis H1 and the second hinge axis H2, respectively.

In an example embodiment, when the first rotator 420 rotates on the first hinge axis H1, the slide bracket 440 may move in a straight line relative to the hinge bracket 410 by a pitch in the first axis direction (e.g., the Y-axis direction) corresponding to a rotation angle of the helical shape as the first helical protrusion 444 slides along the helical shape of the first helical groove 424, and the slide bracket 440 may move in a straight line relative to the hinge bracket 410 by a pitch in the first axis direction corresponding to a rotation angle of the helical shape as the second helical protrusion 446 slides along the helical shape of the second helical groove 434.

In an example embodiment, according to the structure described above, a rotation operation of the first rotator 420 and a rotation operation of the second rotator 430 may interoperate with each other by using linear movement of the slide bracket 440 as a medium. For example, any one of the rotation operations of the first rotator 420 and the second rotator 430 may interoperate with the other rotation operation by using linear movement of the slide bracket 440 as a medium. Accordingly, as the rotation operations of the first rotator 420 and the second rotator 430 interoperate with each other by the linear movement of the slide bracket 440, rotation angles of the first rotator 420 and the second rotator 430 may be synchronized with each other.

In an example embodiment, the detent assembly 450 may be coupled to the slide bracket 440 to move in the first axis direction together with the slide bracket 440. For example, the detent assembly 450 may be disposed inside a detent space (e.g., the detent space 447 of FIG. 4B and/or FIG. 5C) of the slide bracket 440 and may move in the first axis direction as the slide bracket 440 slides in the first axis direction.

In an example embodiment, the detent space 447 may accommodate the detent assembly 450 such that the cam 451 of the detent assembly 450 may move in the second axis direction perpendicular to the first axis direction. The detent space 447 may include a protrusion opening 448 open in the second axis direction and the protrusion area 453 of the cam 451 may protrude from the outer circumferential surface of the slide bracket 440 by penetrating a protrusion opening (e.g., the protrusion opening 448 of FIG. 4B).

In an example embodiment, the elastic member 455 may be a spring or an elastic body for providing an elastic force (e.g., the elastic force Fs of FIG. 7B) in the second axis direction to the cam 451. For example, when the cam 451 is pressed and moves in the second axis direction, the elastic member 455 may generate an elastic force Fs and the elastic force Fs of the elastic member 455 may provide a detent force to the hinge assembly 400.

In an example embodiment, a pair of elastic members 455 may be provided. The cams 451 may be respectively disposed on both sides (e.g., the second axis direction) of the elastic members 455 or one cam 451 may be disposed on one side.

In an example embodiment, the second bracket 415 of the hinge bracket 410 may include a detent bracket accommodation space (e.g., the detent bracket accommodation space 416 of FIG. 4A and/or FIG. 4B) and a second slide connection space (e.g., the second slide connection space 419 of FIG. 4A and/or FIG. 4B). In an example embodiment, the slide rail 417, which is a side surface contacting the detent assembly 450, may be formed in the detent bracket accommodation space 416.

In an example embodiment, referring to FIGS. 7A to 7C, the slide rail 417 may guide the slide bracket 440 to move between the first position P1 and the second position P2 in the first axis direction. For example, the slide bracket 440 may slide between the first position P1 where the slide rail 417 is located in the unfolded state and the second position P2 where the slide rail 417 is located in the folded state. The slide bracket 440 may be located at the intermediate position P0 corresponding to the intermediate state, and the intermediate position P0 may be a position between the first position P1 and the second position P2.

In an example embodiment, the slide rail 417 may include a flat area 417*a* and a protruding area 417*b* that protrudes from the flat area 417*a* in the second axis direction. The protruding area 417*b* may face the cam 451 and may be formed, for example, at a position of the slide rail 417 facing the protrusion area 453 at the first position P1 and a position of the slide rail 417 facing the protrusion area 453 at the second position P2.

In an example embodiment, the slide bracket 440 may move along the slide rail 417 and the cam 451 may be moved in the second axis direction by the protruding area 417*b*. For example, as the slide bracket 440 and the detent assembly 450 move in the first axis direction, the protruding area 417*b* may press the cam 451 of the detent assembly 450 in the second axis direction. However, this is an example, and the slide rail 417 may be formed in a structure that presses the cam 451 in the second axis direction in at least a partial region as the slide bracket 440 moves in the first axis direction. For example, the slide rail 417 may omit the flat area 417*a* and may include a protruding area 417*b* that relatively protrudes than other areas or may include the protruding area 417*b* and a recessed area (not illustrated) opposite to the protruding area 417*b*.

In an example embodiment, the protrusion area 453 of the cam 451 may protrude in a direction facing the protruding area 417*b* and the protrusion area 453 may be an area facing and contacting the protruding area 417*b*. As the protrusion area 453 is pressed by the protruding area 417*b*, the cam 451 may move in the direction of the elastic member 455.

In an example embodiment, to move from the unfolded state or the folded state to the intermediate state, a force to overcome the elastic force Fs of the elastic member 455 may be required. When the cam 451 is pressed in the second axis direction by the protruding area 417*b*, the elastic member 455 may provide the elastic force Fs in the opposite direction thereto and the detent assembly 450 may provide a detent force to the slide bracket 440 through the elastic force Fs of the elastic member 455.

In an example embodiment, while the hinge assembly 400 moves from the unfolded state (e.g., the state of FIGS. 6A and 7A) to the intermediate state (e.g., the state of FIGS. 6B and 7B), open detent may be generated. The open detent may be a force (e.g., a frictional force) or a torque to allow the hinge assembly 400 to be maintained in the unfolded state.

For example, the slide bracket 440 may slide in one direction (e.g., the −Y direction) in interoperation with rotation of the first rotator 420 and/or the second rotator 430. While the slide bracket 440 moves from the first position P1 to the intermediate position P0, the cam 451 may be pressed by the protruding area 417*b* and the elastic member 455 may generate the elastic force Fs that pushes the cam 451 in the second axis direction. By the elastic force Fs of the elastic member 455, open detent may be generated, the slide bracket 440 may be maintained at the first position P1 in a range less than or equal to an external force such that the slide bracket 440 may overcome the open detent, and the hinge assembly 400 may be maintained in the unfolded state.

In an example embodiment, while the hinge assembly 400 moves from the folded state (e.g., the state of FIG. 6C and 7C) to the intermediate state (e.g., the state of FIGS. 6B and 7B), close detent may be generated. The close detent may be a force or a torque to allow the hinge assembly 400 to be maintained in the folded state (e.g., a frictional force).

For example, the slide bracket 440 may slide in one direction (e.g., the +Y direction) in interoperation with rotation of the first rotator 420 and/or the second rotator 430. While the slide bracket 440 moves from the second position P2 to the intermediate position P0, the cam 451 may be pressed by the protruding area 417*b* and the elastic member 455 may generate the elastic force Fs that pushes the cam 451 in the second axis direction. By the elastic force Fs of the elastic member 455, close detent may be generated, the slide bracket 440 may be maintained at the second position P2 in a range less than or equal to an external force such that the slide bracket 440 may overcome the close detent, and the hinge assembly 400 may be maintained in the folded state.

In an example embodiment, when the hinge assembly 400 is in the intermediate state (e.g., the state of FIGS. 6B and 7B), free stop may occur. The free stop may be a state to maintain the hinge assembly 400 to be in the intermediate state (e.g., the state between the unfolded state and the folded state) or a movable state to the other state (e.g., the unfolded state or the folded state) by a predetermined external force.

For example, when the slide bracket 440 is located at the intermediate position P0, the elastic member 455 may generate a great elastic force Fs and a stop frictional force may be generated between the protrusion area 453 and the protruding area 417b. The free stop state may be maintained by the stop frictional force and the hinge assembly 400 may maintain the intermediate state. When a predetermined force is provided in any direction (e.g., the +Y-axis or –Y axis direction) of the first axis direction to the slide bracket 440 at the intermediate position P0, the stop frictional force may be overcome and the cam 451 may move in a direction in which a force is applied.

In an example embodiment, the slide bracket 440 that overcame the stop frictional force may relatively easily move to the first position P1 or the second position P2, and the hinge assembly 400 may semi-automatically move from the intermediate state to the folded state or the unfolded state. This is described with reference to FIGS. 8A, 8B, 8C, and 8D.

In an example embodiment, the hinge assembly 400 may cause interoperation of rotation operations of the first rotator 420 and the second rotator 430 by interoperating with the first rotator 420, the second rotator 430, and the slide bracket 440, and open detent, free stop, and close detent may be generated by interoperating with the slide bracket 440, the hinge bracket 410, and the detent assembly 450. Since one hinge assembly 400 may perform rotation, detent, and interoperation functions, a separate sync assembly may not be provided, and thus, the number of components, width, weight, and/or cost of the hinge assembly 400 or an electronic device (e.g., the electronic device 300 of FIG. 3) including them may decrease.

In an example embodiment, through the structural design described above, the detent assembly 450 may easily secure durability and the elastic force Fs of the elastic member 455 and may improve the lifespan of the elastic member 455. For example, a plurality of elastic members 455 may be arranged in the first axis direction to provide the elastic force Fs in the second axis direction.

For example, in an example embodiment, when the elastic member 455 and the cam 451 are arranged in the first axis direction and provide the elastic force Fs, the arrangement of the plurality of elastic members 455 may be limited and the size of the area demanded by the detent assembly 450 may increase because the size of the cam 451 needs to increase to support the arrangement.

In an example embodiment, the cam 451 that is movable in the second axis direction in interoperation with the slide bracket 440 and the elastic member 455 that provides the elastic force Fs in the second axis direction to the cam 451 may be provided. The hinge assembly 400 may increase a contact area of the elastic member 455 by arranging the plurality of elastic members 455 in the first axis direction to provide the elastic force Fs in the second axis direction, arranging the plurality of elastic member 455 in the first axis direction, or having a plate shape in which the cam 451 extends in the first axis direction. Accordingly, the hinge assembly 400 may improve the detent performance and durability of the detent assembly 450 and may become slim due to an advantage of internal structural design.

FIGS. 8A, 8B, 8C, and 8D are partial cross-sectional views of the hinge assembly 400 in an embodiment, respectively.

Referring to FIGS. 8A, 8B, 8C, and 8D, the slide rail 417 and the protrusion area 453 may have various shapes and structures.

Figure 8A:
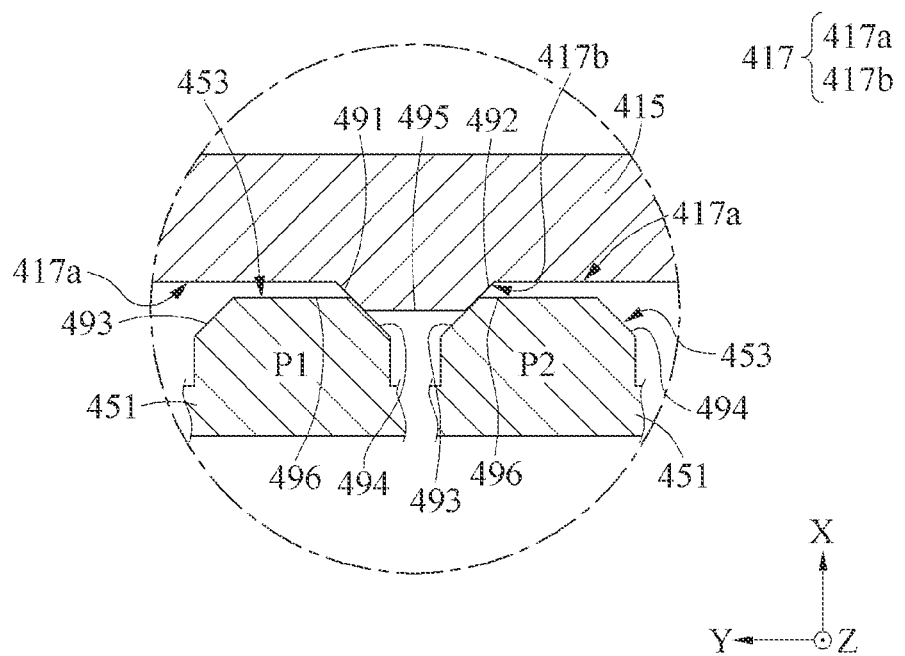
FIG. 8A is a partial cross-sectional view of the hinge assembly according to an example embodiment.

In an example embodiment, as illustrated in FIG. 8A, the protruding area 417b may include a first inclined surface 491 and a second inclined surface 492. Each of the first inclined surface 491 and the second inclined surface 492 may be an area inclining in a direction facing the cam 451 from the flat area 417a at a predetermined angle.

In an example embodiment, the protrusion area 453 may include a third inclined surface 493 and a fourth inclined surface 494. The third inclined surface 493 and the fourth inclined surface 494 may be areas protruding in a direction facing the protruding area 417b from a protrusion opening (e.g., the protrusion opening 448 of FIG. 4B) of the slide bracket 440 or the cam 451.

In an example embodiment, the first position P1 may be a position of the protrusion area 453 of the hinge assembly 400 in the unfolded state and the second position P2 may be a position of the protrusion area 453 of the hinge assembly 400 in the folded state.

In an example embodiment, the protruding area 417b may include a first flat surface 495 formed between the first inclined surface 491 and the second inclined surface 492, and the protrusion area 453 may include a second flat surface 496 formed between the third inclined surface 493 and the fourth inclined surface 494 and substantially parallel with the first flat surface 495.

In an example embodiment, the third inclined surface 493 may be substantially parallel with the second inclined surface 492 and the fourth inclined surface 494 may be substantially parallel with the first inclined surface 491. However, the example is not limited thereto.

In an example embodiment, in a state (e.g., the unfolded state of FIG. 7A) in which at least a portion of the first inclined surface 491 contacts at least a portion of the fourth inclined surface 494, open detent may occur in the hinge assembly 400. As the slide bracket 440 slides in a direction (e.g., the –Y direction), the first inclined surface 491 of the protruding area 417b may press the fourth inclined surface 494 of the cam 451. The elastic member 455 may be compressed as the cam 451 moves in the second axis direction by the fourth inclined surface 494, and open detent may occur as the elastic force of the elastic member 455 increases.

In an example embodiment, in a state (e.g., the intermediate state of FIG. 7B) in which at least a portion of the first flat surface 495 contacts at least a portion of the second flat surface 496, free stop may occur in the hinge assembly 400. The elastic member 455 may press the second flat surface 496 in a direction facing the first flat surface 495 and a stop frictional force may increase between the first flat surface 495 and the second flat surface 496. In the hinge assembly 400, the free stop may occur in a range less than or equal to the stop frictional force of the first flat surface 495 and the second flat surface 496.

In an example embodiment, in a state (e.g., the folded state of FIG. 7C) in which at least a portion of the second inclined surface 492 contacts at least a portion of the third inclined surface 493, close detent may occur in the hinge assembly 400. As the slide bracket 440 slides in a direction (e.g., the +Y direction), the second inclined surface 492 of the protruding area 417b may press the third inclined surface 493 of the cam 451. The elastic member 455 may be compressed as the cam 451 moves in the second axis direction by the third inclined surface 493, and close detent may occur as the elastic force of the elastic member 455 increases.

Figure 8B:
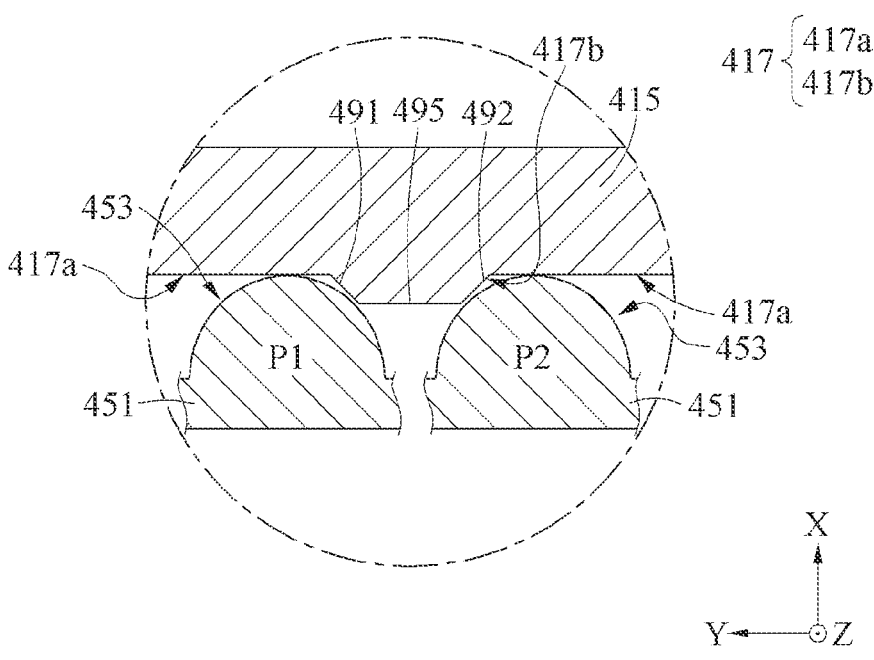
FIG. 8B is a partial cross-sectional view of the hinge assembly according to an example embodiment.

In an example embodiment, as illustrated in FIG. 8B, the protrusion area 453 may protrude in a curved structure having a predetermined curvature. Through the curved structure, a contact surface between the protrusion area 453 and the protruding area 417*b* may decrease and the cam 451 may move more smoothly.

For example, compared to the embodiment of FIG. 8A, as the cam 451 moves in the first axis direction, a contact point of the protrusion area 453 of FIG. 8B and the first inclined surface 491 or the second inclined surface 492 may continuously vary, a direction pressing the elastic member 455 may vary, and a force pressing the elastic member 455 may relatively smoothly increase. In addition, while the protrusion area 453 enters the flat area 417*a* from the first inclined surface 491 or the second inclined surface 492, the protrusion area 453 may relatively smoothly slide and move.

Figure 8C:
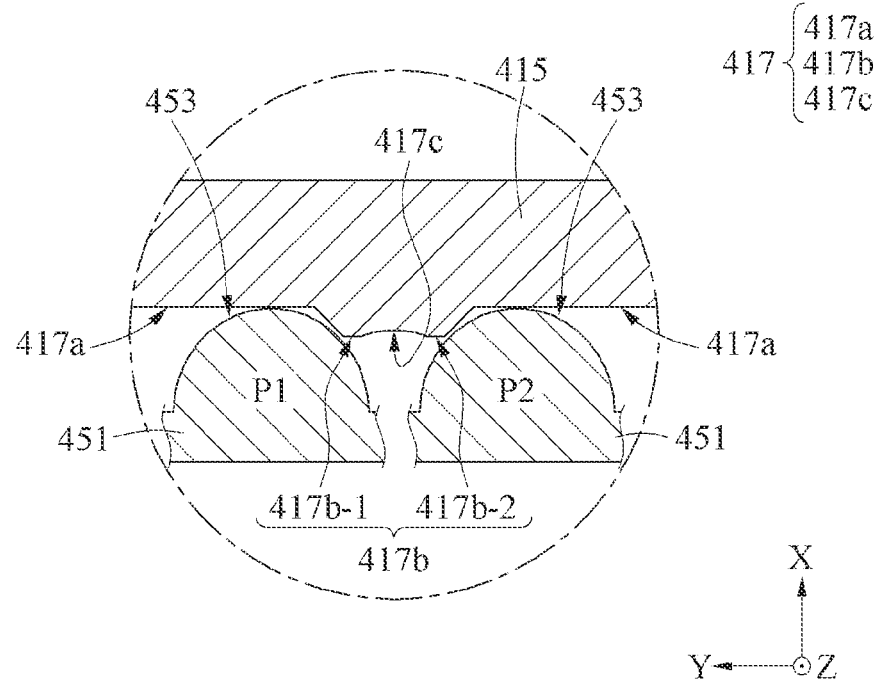
FIG. 8C is a partial cross-sectional view of the hinge assembly according to an example embodiment.

In an example embodiment, as illustrated in FIG. 8C, the slide rail 417 may include a plurality of protruding areas 417*b* and may further include a groove area 417*c* formed between the plurality of protruding areas 417*b*.

In an example embodiment, the plurality of protruding areas 417*b* may include a first protruding area 417*b*-1 and a second protruding area 417*b*-2. For example, the first protruding area 417*b*-1 may be relatively closer to the protruding area 453 at the first position P1 than the second protruding area 417*b*-2, or the second protruding area 417*b*-2 may be relatively closer to the protrusion area 453 at the second position P2 than the first protruding area 417*b*-1. The groove area 417*c* may be formed between the first protruding area 417*b*-1 and the second protruding area 417*b*-2.

In an example embodiment, the groove area 417*c* may have a structure corresponding to the shape of the protrusion area 453 and intermediate detent may occur in the hinge assembly 400 by the groove area 417*c*. As the protrusion area 453 passes through one of the plurality of protruding areas 417*b*, the elastic member 455 may be compressed and when the protrusion area 453 reaches the groove area 417*c*, the elastic member 455 may extend in a predetermined range. The elastic member 455 may extend and may provide an elastic force, and the protrusion area 453 may be smoothly inserted into the groove area 417*c*. To escape from the groove area 417*c*, as the protrusion area 453 slides, the protrusion area 453 may be pressed by the protruding area 417*b*. The cam 451 may move in the second axis direction by the protruding area 417*b* and the elastic member 455 may be compressed and intermediate detent may occur as the elastic force of the elastic member 455 may increase.

Figure 8D:
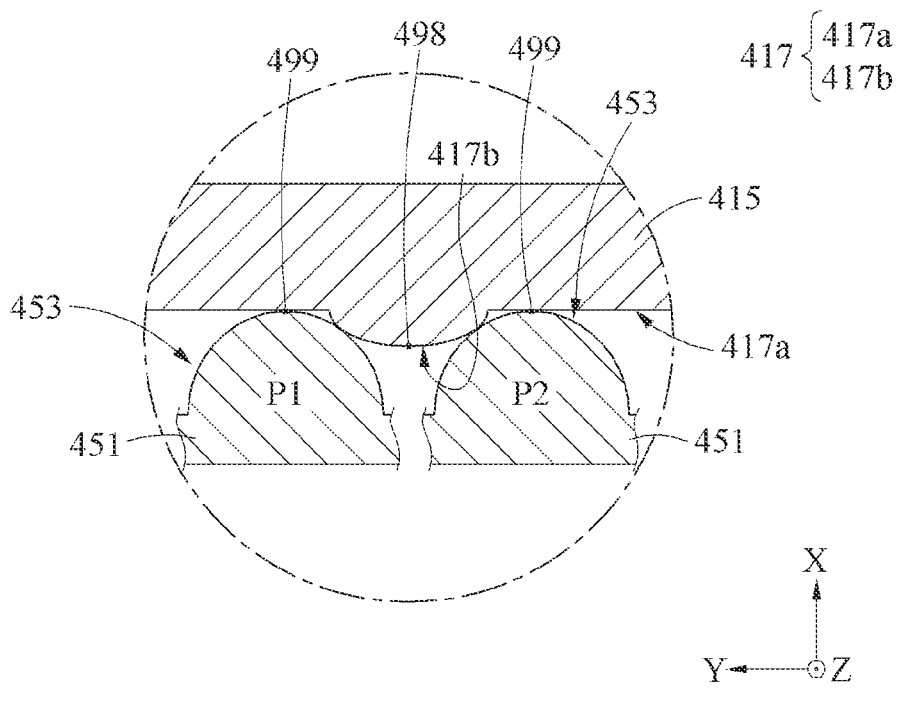
FIG. 8D is a partial cross-sectional view of the hinge assembly according to an example embodiment.

In an example embodiment, as illustrated in FIG. 8D, the protruding area 417*b* may protrude in a curved structure having a predetermined curvature, and/or the protrusion area 453 may protrude in a curved structure having a predetermined curvature. Through the curved structure of the protruding area 417*b* and the protrusion area 453, a contact area between the protrusion area 453 and the protruding area 417*b* may decrease, movement of the cam 451 may smoothen, and semi-automatic detent may occur.

In an example embodiment, compared to the embodiment of FIG. 8B, as the cam 451 moves in the first axis direction, a contact point of the protrusion area 453 of FIG. 8D and the protruding area 417*b* may continuously vary, a direction pressing the elastic member 455 may vary, and a force pressing the elastic member 455 may relatively smoothly increase.

For example, the protruding area 417*b* may include a first center point 498 that is a contact point substantially located at the center of the curved structure and the protrusion area 453 may include a second center point 499 substantially located at the center of the curved structure. Alternatively, contact points of the protruding area 417*b* and the protrusion area 453 in a state in which compression of the elastic member 455 is maximized or the elastic force is the greatest (or the intermediate state) may be the first center point 498 and the second center point 499.

In an example embodiment, to move the slide bracket 440 in the intermediate state in the first axis direction, the slide bracket 440 may escape from the intermediate state by applying a relatively small force. When the slide bracket 440 escapes the intermediate state, the protrusion area 453 may slide from the protruding area 417*b* and may move to the flat area 417*a* by the elastic force of the elastic member 455. In this case, the hinge assembly 400 may move to the folded state or the unfolded state in a semi-automatic manner and movement convenience of a user may improve.

As described above, the detent operation of the hinge assembly 400 according to an example embodiment may be variously implemented based on the structure, arrangement, shape, or number of the protruding area 417*b* of the slide rail 417 and the protrusion area 453 of the cam 451 and through this, a desired detent operation may be freely implemented and user convenience may improve.

Figure 9:
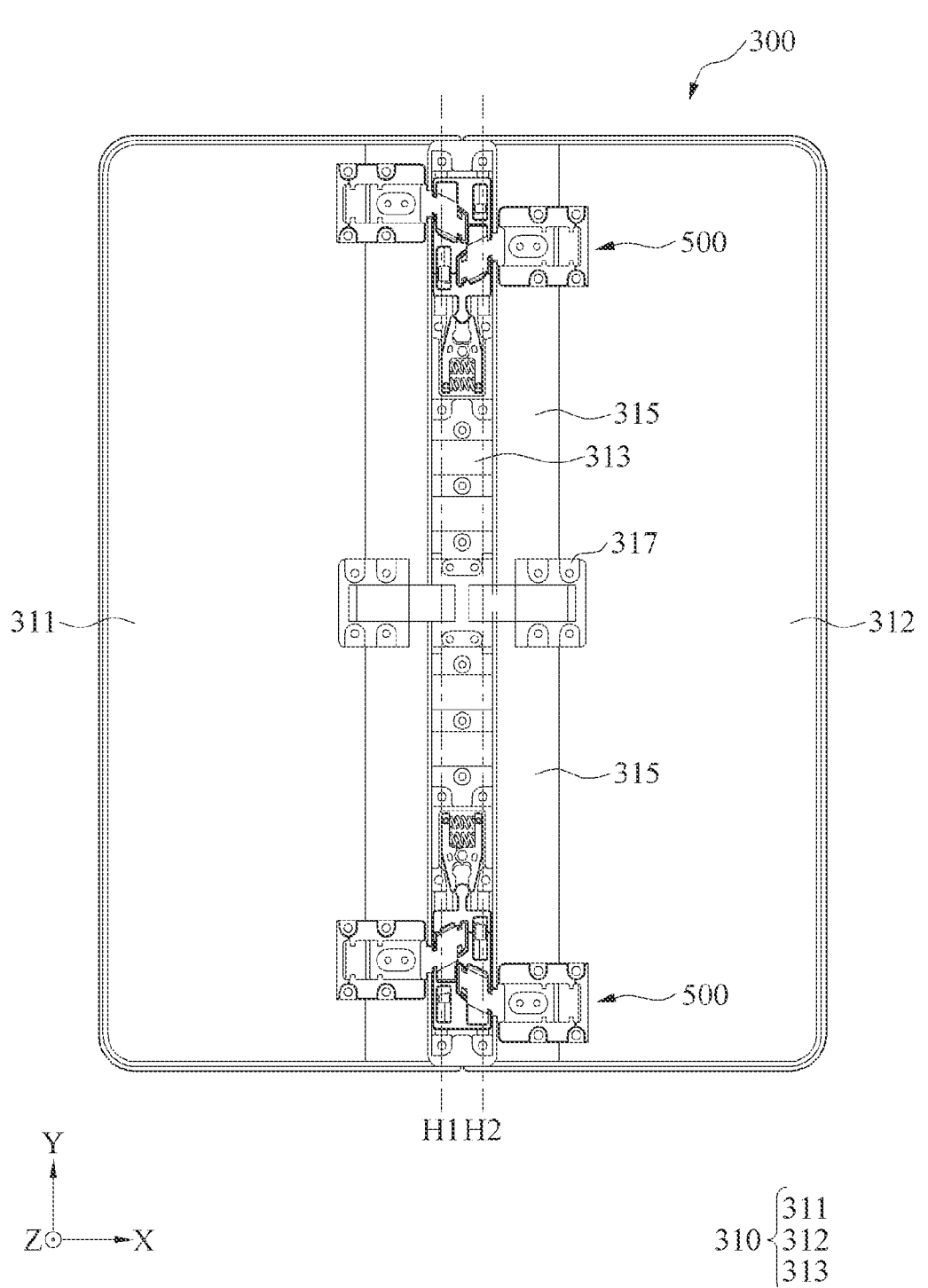
FIG. 9 is a front view illustrating a state in which a hinge assembly is applied to an electronic device according to an example embodiment.

FIG. 9 is a front view illustrating a state in which a hinge assembly 500 is applied to an electronic device according to an example embodiment.

Referring to FIG. 9, the electronic device 300 (e.g., the electronic device 101 of FIG. 1 or the electronic device 200 of FIGS. 2A through 2C) according to an example embodiment may be a foldable electronic device.

Hereinafter, to describe the electronic device 300 including the hinge assembly 500, a duplicated description of the electronic device 300 including the hinge assembly (e.g., at least one of the hinge assembly 400 of FIGS. 3 to 8D) described above or clearly understood content are omitted and a description is mainly provided based on the hinge assembly 500.

The electronic device 300 according to an example embodiment may include a housing 310 (e.g., the foldable housing 201 of FIGS. 2A through 2D), a display (not illustrated) (e.g., the display module 160 of FIG. 1 or the display 250 of FIGS. 2A through 2D), and the hinge assembly 500.

In an example embodiment, the hinge assembly 500 may be disposed between the first housing 311 and the second housing 312 to connect the first housing 311 to the second housing 312. For example, each of the first housing 311 and the second housing 312 may include a connection plate 315 and the hinge assembly 500 may be connected to the first housing 311 and the second housing 312 by fastening to the connection plate 315.

In an example embodiment, a hinge structure (e.g., the hinge structure 230 of FIG. 2B) of the electronic device 300 may include a plurality of hinge assemblies 500. The plurality of hinge assemblies 500 may be spaced apart from each other along a hinge axis H1 or H2.

In an example embodiment, as illustrated in FIG. 9, two hinge assemblies 500 may be spaced apart from each other along the hinge axis H1 or H2 and a sub hinge 317 may be disposed between the two hinge assemblies 500. For example, one hinge assembly 500 and the sub hinge 317 may be fastened to both ends of one connection plate 315 and the other hinge assembly 500 and the sub hinge 317 may be connected to both ends of another connection plate 315. The sub hinge 317 may be simultaneously connected to the two connection plates 315 and the two hinge assemblies 500 and the sub hinge 317 may interoperate. However, this is only an example, and the number of hinge assemblies 500 is not limited thereto and the sub hinge 317 may be omitted.

In an example embodiment, the hinge assembly 500 may implement folding or unfolding operations of the electronic device 300. The hinge assembly 500 may operate between a folded state in which a first area (e.g., the first area 251 of FIG. 2C and/or FIG. 2D) and a second area (e.g., the second area 252 of FIG. 2C and/or FIG. 2D) face each other and an unfolded state in which the first area 251 and the second area 252 do not face each other. The hinge assembly 500 may generate a force (e.g., a frictional force) to maintain a specific folded state of the electronic device 300.

For example, when the electronic device 300 is in the folded state, the hinge assembly 500 may generate a force to maintain the electronic device 300 to be in the folded state. When the electronic device 300 is in the unfolded state, the hinge assembly 500 may generate a force to maintain the electronic device 300 to be in the unfolded state. When the electronic device 300 is in the intermediate state, the hinge assembly 500 may generate a force to maintain the electronic device 300 to be in the intermediate state. In addition, the hinge assembly 500 may synchronize a folding angle of the first housing 311 with a folding angle of the second housing 312. For example, the hinge assembly 500 may interoperate a folding operation of the first housing 311 with a folding operation of the second housing 312 such that the folding angle of the first housing 311 may be synchronized with the folding angle of the second housing 312.

Figure 10A:
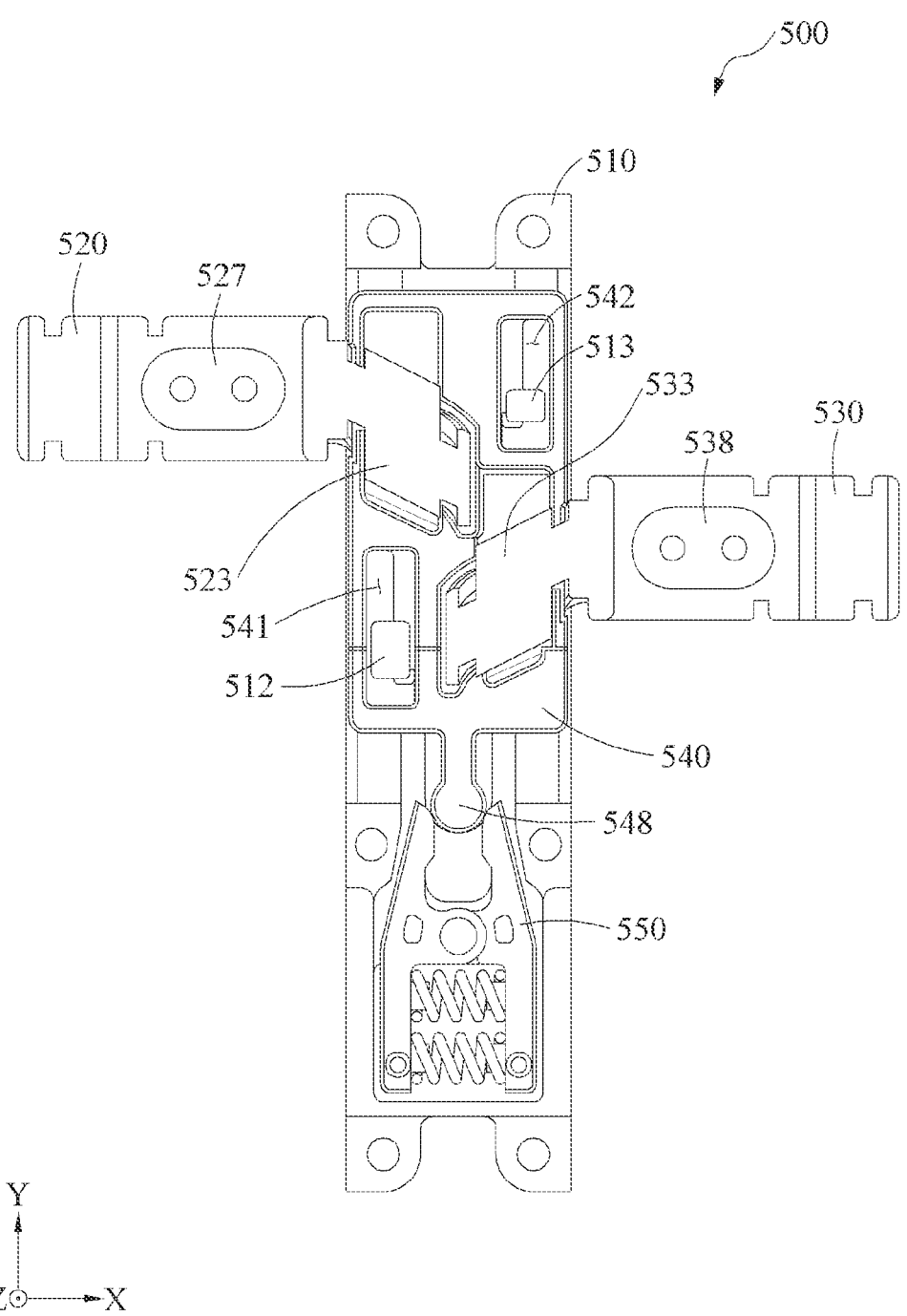
FIG. 10A is a front view of the hinge assembly according to an example embodiment.
Figure 10B:
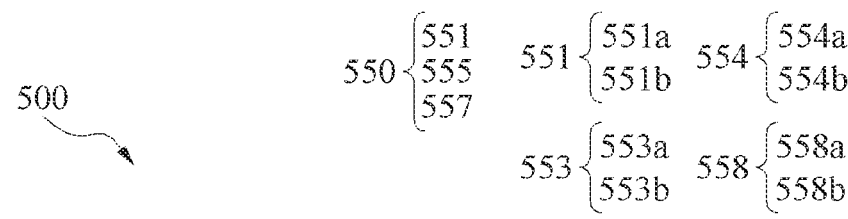
FIG. 10B is an exploded perspective view of the hinge assembly according to an example embodiment.
Figure 10B:
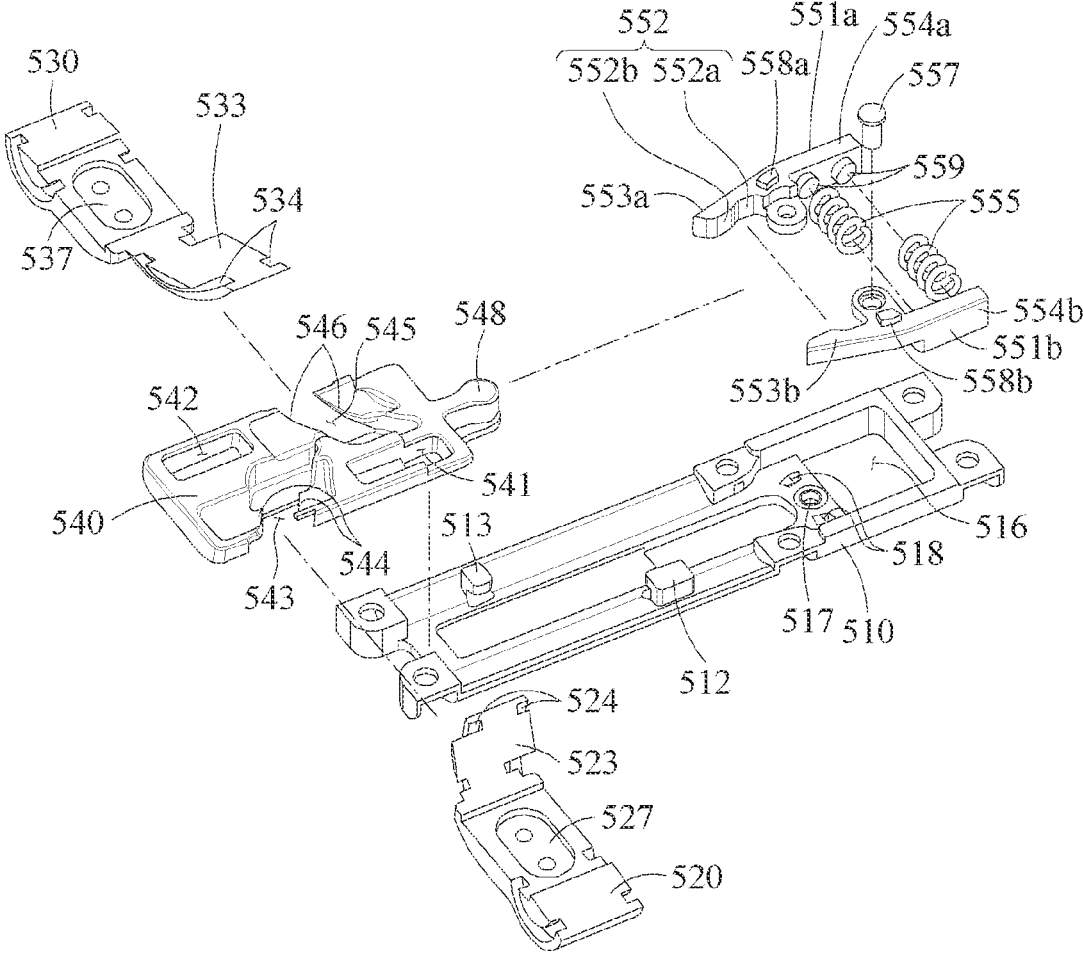
Figure 10B:
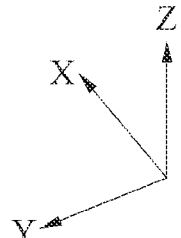

FIG. 10A is a front view of the hinge assembly 500 according to an example embodiment and FIG. 10B is an exploded perspective view of the hinge assembly 500 according to an example embodiment.

Referring to FIGS. 10A and 10B, the hinge assembly 500 in an example embodiment may include a hinge bracket 510, a first rotator 520, a second rotator 530, a slide bracket 540, and a detent assembly 550.

Hereinafter, components and a structure of the hinge assembly 500 in an embodiment are described with reference to FIGS. 10A and 10B. However, this is only an example, and the structure, number, shape, and/or arrangement of the components of the hinge assembly 500 are not limited thereto.

The hinge bracket 510 in an embodiment may be fixedly connected to a housing (e.g., the housing 310 of FIG. 9). For example, the hinge bracket 510 may be fixedly connected to the hinge housing (e.g., the hinge housing 313 of FIG. 9). The hinge bracket 510 may be formed to have a longitudinal direction (e.g., the y-axis direction) parallel with a hinge axis (e.g., the hinge axis H1 or H2 of FIG. 9). In an example embodiment, the lower surface (e.g., a surface in the −Z direction) of the hinge bracket 510 may be formed substantially corresponding to an inner shape of the hinge housing 313.

In an example embodiment, the hinge bracket 510 may fasten to and support other components of the hinge assembly 500. For example, the slide bracket 540 may be slidably coupled to the hinge bracket 510 and the detent assembly 450 may be pivotably coupled to the hinge bracket 510.

In an example embodiment, a hinge cover (not illustrated) may be connected to a surface (e.g., the upper surface in the Z direction) of the hinge assembly 500 and may cover and protect internal components. However, the structure is only an example and is not limited thereto in an actual implementation. The structure may be implemented as the hinge bracket 510 formed in one body.

In an example embodiment, the first rotator 520 may include a first connecting member 523 to fasten to the slide bracket 540 and in the first connecting member 523, a first helical groove 524 may be formed in a helical shape in one direction based on the first hinge axis (e.g., the first hinge axis H1 of FIG. 9).

In an example embodiment, the first rotator 520 may include a first fastening area 527 to be fastened to another structure. In an example embodiment, the first fastening area 527 may include at least one hole to insert a fixing member (not illustrated), such as a screw, therein.

For example, the first rotator 520 may be fastened to a partial area (e.g., the first housing structure 210 of FIGS. 2A to 2D) and/or a partial area (e.g., the first area 251 of the display 250 of FIGS. 2A to 2D) of a display through the first fastening area 527.

In an example embodiment, when the first fastening area 527 is fixed and the first rotator 520 rotates toward the first hinge axis H1 as the hinge assembly 500 folds, the first housing structure 210 and/or the first area 251 of the display 250 may rotate by interoperating with the first rotator 520.

In an example embodiment, the second rotator 530 may include a second connecting member 533 to fasten to the slide bracket 540 and in the second connecting member 533, a second helical groove 534 may be formed in a helical shape in one direction based on the second hinge axis (e.g., the second hinge axis H2 of FIG. 9).

In an example embodiment, the second rotator 530 may include a second fastening area 537 to be fastened to another structure. In an example embodiment, the second fastening area 537 may include at least one hole to insert a fixing member (not illustrated), such as a screw, therein.

For example, the second rotator 530 may be fastened to a partial area (e.g., the second housing structure 220 of FIGS. 2A to 2D) and/or a partial area (e.g., the second area 252 of the display 250 of FIGS. 2A to 2D) of a display through the second fastening area 537.

In an example embodiment, when the second fastening area 537 is fixed and the second rotator 530 rotates toward the second hinge axis H2 as the hinge assembly 500 folds, the second housing structure 220 and/or the second area 252 of the display 250 may rotate by interoperating with the second rotator 530.

In an example embodiment, the slide bracket 540 may include a first rotator connection space 543 and the first connecting member 523 of the first rotator 520 may be rotatably connected to the first rotator connection space 543 based on the first hinge axis H1.

In an example embodiment, the slide bracket 540 may include a second rotator connection space 545 and the second connecting member 533 of the second rotator 530 may be rotatably connected to the second rotator connection space 545 based on the second hinge axis H2.

In an example embodiment, the slide bracket 540 may include at least one of slide connection spaces 541 and 542. For example, the plurality of slide connection spaces 541 and 542 may be formed to be spaced apart from each other and may include the first slide connection space 541 and the second slide connection space 542.

In an example embodiment, the hinge bracket 510 may include a first slide guide member 512 inserted into the first slide connection space 541 and a second slide guide member 513 inserted into the second slide connection space 542.

In an example embodiment, the hinge bracket 510 may include a detent assembly accommodation space 516 accommodating the detent assembly 550. A pivot axis fastening hole 517 to which a pivot axis 557 of the detent assembly 550 is fastened may be formed adjacent to the detent assembly accommodation space 516. A support protrusion 559 to support an elastic member 555 may be formed on a surface of a cam 551 facing the elastic member 555.

In an example embodiment, a plurality of cams 551 may be formed and the plurality of cams 551 may include a first cam 551a and a second cam 551b spaced apart from each other in both directions (e.g., the X-axis direction or the second axis direction) to which an elastic force is applied based on the elastic member 555.

In an example embodiment, the first cam 551a may include a first sub cam area 553a and a third sub cam area 554a and the second cam 551b may include a second sub cam area 553b and a fourth sub cam area 554b. The first sub cam area 553a and the second sub cam area 553b may constitute a first cam area 553 and the third sub cam area 554a and the fourth sub cam area 554b may constitute a second cam area 554.

In an example embodiment, the hinge bracket 510 may include a guide groove 518 into which a guide member 558 of the detent assembly 550 is inserted and although not illustrated in drawings, similar to the hinge bracket 510, a hinge cover (not illustrated) may include the guide groove 518 into which the guide member 558 is inserted.

FIG. 10B and some drawings below illustrate that the cam 551 includes the guide member 558 protruding in at least one of both directions (e.g., + or −Z direction) facing a hinge cover (not illustrated) and/or the hinge bracket 510 and the hinge bracket 510 includes the guide groove 518 into which the guide member 558 is inserted. However, an actual implementation is not limited thereto. For example, the hinge bracket 510 and/or a hinge cover (not illustrated) may include a guide member (not illustrated) protruding in a direction facing the cam 551 and the cam 551 may include a guide groove (not illustrated) into which the guide member (not illustrated) is inserted.

In an example embodiment, a plurality of guide members 558 may be provided and for example, the plurality of guide members 558 may include a first guide member 558a formed in the first cam 551a and a second guide member 558b formed in the second cam 551b.

In an example embodiment, at least one guide member 558 of the detent assembly 550 may be formed in a direction parallel with the pivot axis 557 of the detent assembly 550. For example, the guide members 558 may be formed in both directions parallel with the pivot axis 557 of the detent assembly 550.

In an example embodiment, the slide bracket 540 may be slidably connected to the hinge bracket 510 in a slide direction (e.g., the Y-axis direction) For example, both directions in which the slide bracket 540 slides may be a first axis direction and a direction perpendicular to the first axis direction (e.g., the X-axis direction) may be a second axis direction.

In an example embodiment, the slide bracket 540 may include the first slide connection space 541 and the second slide connection space 542. The first slide guide member 512 and the second slide guide member 513 may slide in the slide direction inside the first slide connection space 541 and the second slide connection space 542, respectively. The first slide connection space 541 and the second slide connection space 542 may restrict a sliding range of the slide bracket 540 and may prevent or reduce the chances of the slide bracket 540 from escaping.

In an example embodiment, the slide bracket 540 may include a first rotator connection space 543 to which the first connecting member 523 of the first rotator 520 is rotatably fastened. A second helical protrusion 544 interoperating with the first helical groove 524 may be formed in the first rotator connection space 543.

In an example embodiment, the slide bracket 540 may include a second rotator connection space 545 to which the second connecting member 533 of the second rotator 530 is rotatably fastened. A second helical protrusion 546 interoperating with the second helical groove 534 may be formed in the second rotator connection space 545.

In an example embodiment, as the slide bracket 540 moves in the first axis direction, the slide bracket 540 may include a pressurizing area 548 in which the cam 551 of the detent assembly 550 is pressed to pivot based on the pivot axis 557.

In an example embodiment, the detent assembly 550 may provide a detent force in a direction resisting movement of the slide bracket 540 in the first axis direction. The detent assembly 550 may include the pivot axis 557 that is fixed to the pivot axis fastening hole 517 of the hinge bracket 510 and connected to the cam 551.

In an example embodiment, the detent assembly 550 may include the cam 551 and the elastic member 555. The cam 551 may pivot in the second axis direction perpendicular to the first axis direction by interoperating with the movement of the slide bracket 540.

In an example embodiment, the elastic member 555 may provide an elastic force in the second axis direction by interoperating with the movement of the cam 551. For example, when the cam 551 is pressed and pivots based on the pivot axis 557 by the pressurizing area 548, the elastic member 555 may provide an elastic force to the cam 551 in the second axis direction.

In an example embodiment, the cam 551 may include the first cam area 553 and the second cam area 554. The first cam area 553 may include a pressurizing surface 552 facing the pressurizing area 548 and the pressurizing surface 552 may include a flat area 552a and a protruding area 552b. When the pressurizing area 548 of the slide bracket 540 moves in the first axis direction, the pressurizing surface 552 may be pressed in the second axis direction and may pivot based on the pivot axis 557.

In an example embodiment, the second cam area 554 may be opposite to the first cam area 553 based on the pivot axis 557 and may be integrally formed with the first cam area 553 as one body. The second cam area 554 may pivot based on the pivot axis 557 by interoperating with movement of the pressurizing area 548 and as the second cam area 554 pivots, the elastic member 555 may provide an elastic force to the second cam area 554.

In an example embodiment, the detent assembly 550 may provide a folding detent force and an unfolding detent force corresponding to folding and unfolding directions of the hinge assembly 500 through the elastic force of the elastic member 555.

In an example embodiment, the detent assembly 550 may include at least one cam 551 and/or at least one elastic member 555. For example, the detent assembly 550 may include one cam 551 and one elastic member 555. For example, the detent assembly 550 may include an elastic structure body (e.g., a leaf spring) that functions as the cam and the elastic member.

Figure 11A:
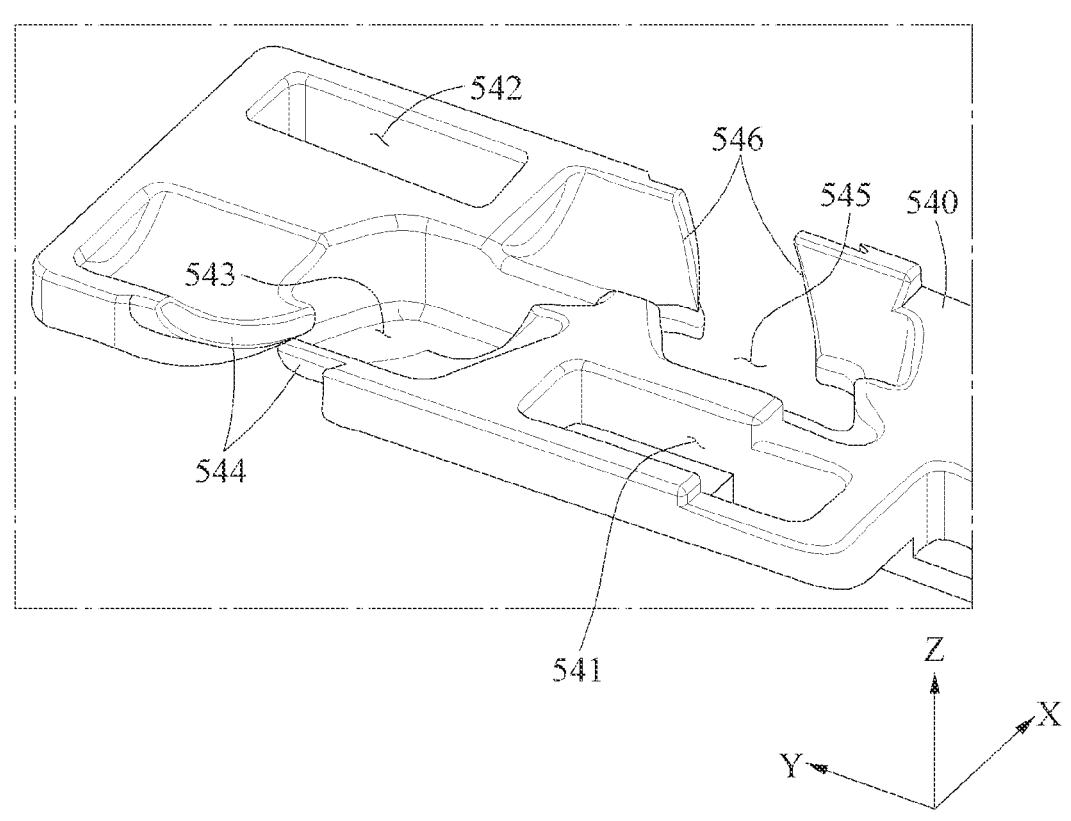
FIG. 11A is an enlarged perspective view of a slide bracket according to an example embodiment.
Figure 11B:
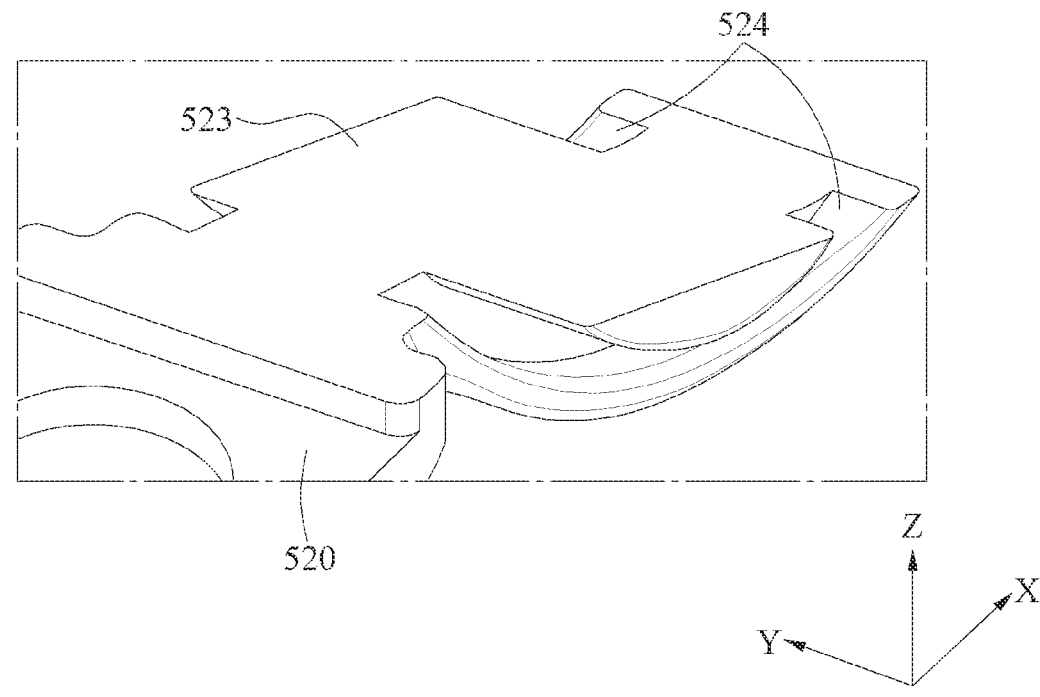
FIG. 11B is an enlarged perspective view of a rotator according to an example embodiment.
Figure 11C:
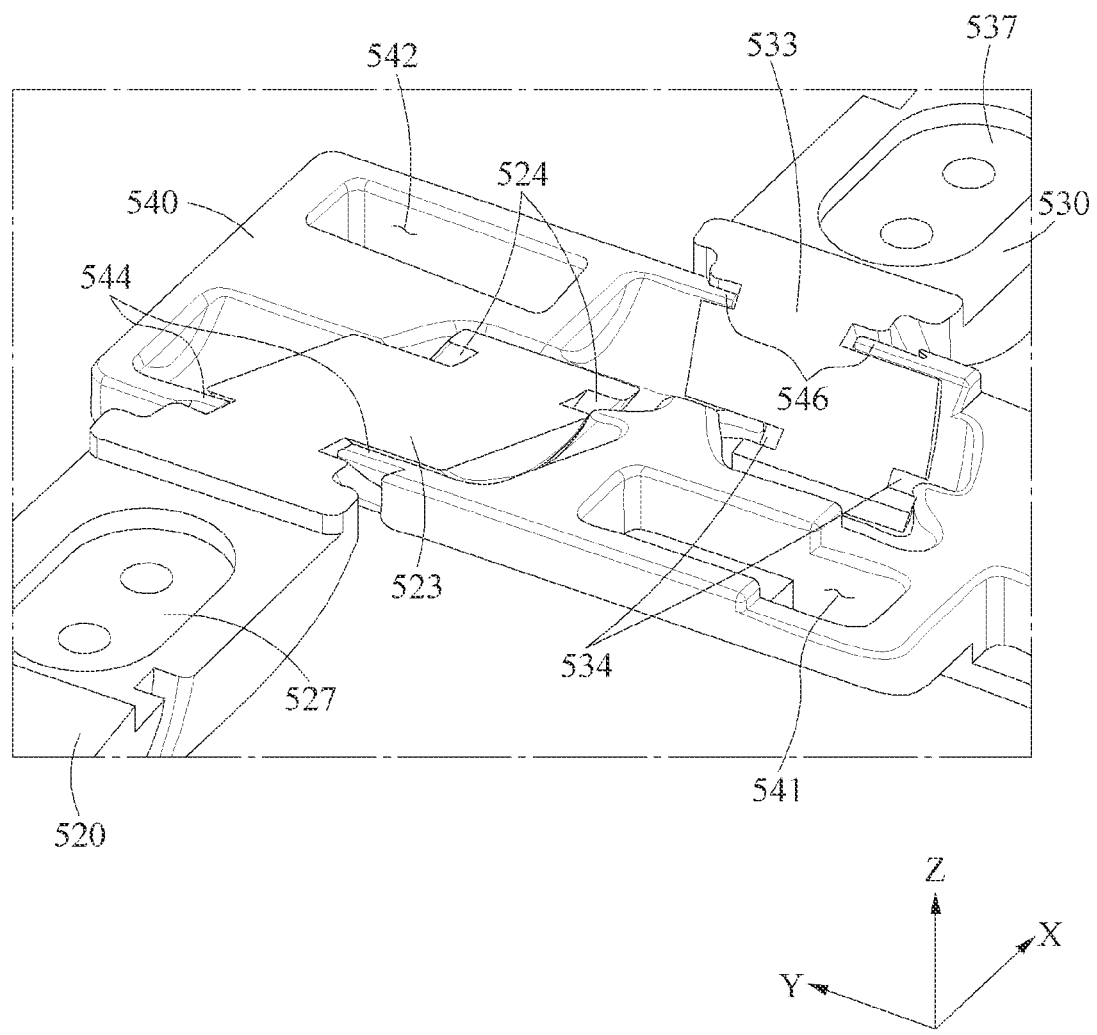
FIG. 11C is an enlarged perspective view of the hinge assembly in an unfolded state according to an example embodiment.
Figure 11D:
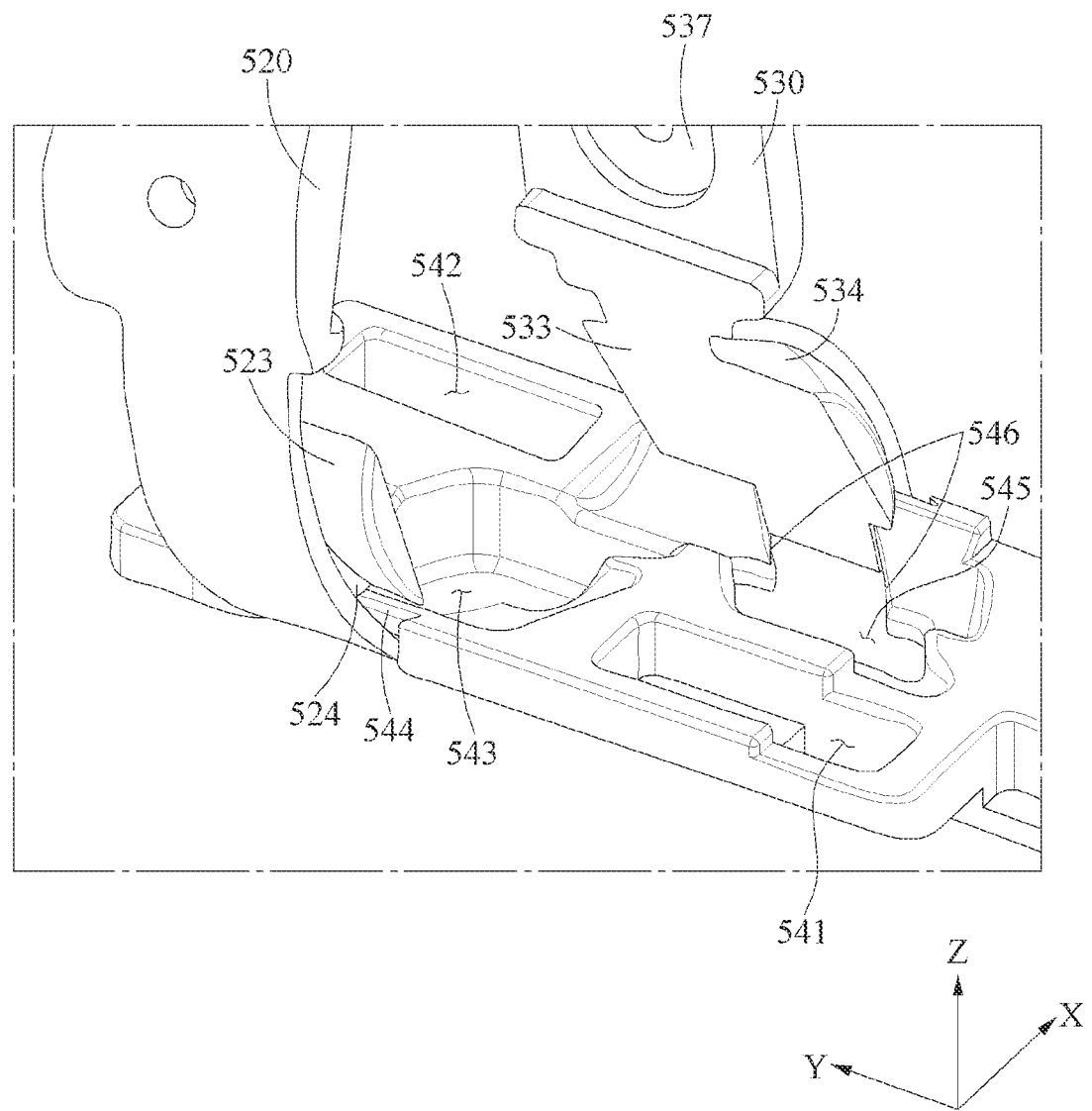
FIG. 11D is an enlarged perspective view of the hinge assembly in a folded state according to an example embodiment.

FIG. 11A is an enlarged perspective view of the slide bracket 540 according to an example embodiment, FIG. 11B is an enlarged perspective view of the rotator 530 according to an example embodiment, FIG. 11C is an enlarged perspective view of the hinge assembly 500 in an unfolded state according to an example embodiment, and FIG. 11D is an enlarged perspective view of the hinge assembly 500 in a folded state according to an example embodiment.

Referring to FIGS. 11A, 11B, 11C, and 11D, the slide bracket 540 in an example embodiment may slide by interoperating with rotations of the first rotator 520 and the second rotator 530. Hereinafter, to describe FIGS. 11A, 11B, 11C, and 11D, descriptions provided with reference to FIGS. 10A and 10B are omitted.

In an example embodiment, the slide bracket 540 may spiral-slide by interoperating with rotations of the first rotator 520 and the second rotator 530. The spiral-slide may refer to an operation or a structure in which the slide bracket 540 slides by engaging with spiral structures of the first rotator 520 and the second rotator 530 in interoperation with rotations of the first rotator 520 and the second rotator 530. For example, the first helical groove 524 of the first rotator 520 and the second helical groove 534 of the second rotator 530 may interoperate with the first helical protrusion 544 and the second helical protrusion 546, respectively.

In an example embodiment, the first rotator 520 may be rotatably connected to the slide bracket 540 based on the first hinge axis H1 and the second rotator 530 may be rotatably connected to the slide bracket 540 based on the second hinge axis H2. The first rotator 520 and the second rotator 530 may be formed in substantially symmetrical shapes based on the first axis direction (e.g., the Y-axis direction) parallel with the hinge axis H1 or H2.

In an example embodiment, the slide bracket 540 may be slidably connected to the hinge bracket 510 in the first axis direction (e.g., the Y-axis direction) parallel with the first hinge axis H1 or the second hinge axis H2 by interoperating with rotations of the first rotator 520 and the second rotator 530. The slide bracket 540 may include the first rotator connection space 543 and the second rotator connection space 545 to rotatably connect to the first rotator 520 and the second rotator 530.

In an example embodiment, the first helical groove 524 may be formed in the first rotator 520 and the first helical protrusion 544 may be formed in the first rotator connection space 543 of the slide bracket 540. Hereinafter, the descriptions of the first helical groove 524 and the first helical protrusion 544 may be applicable to the second helical groove 534 of the second rotator 530 and the second helical protrusion 546 of the second rotator connection space 545 in substantially the same or similar manner.

In an example embodiment, the first helical protrusion 544 may include an arc shape and the center of the arc shape of the first helical protrusion 544 may be first hinge axis H1. For example, the first helical protrusion 544 may include an arc shape with the first hinge axis as the center.

In an example embodiment, the first helical groove 524 may be formed in both side surfaces (e.g., a pair of surfaces in the Y-axis direction) of the first connecting member 523 and the first helical protrusion 544 may protrude in the first hinge axis H1 direction from both side surfaces of the first helical groove 524 facing each other. For example, the first helical protrusion 544 and the second helical protrusion 546 may be formed in both side surfaces (e.g., a pair of surfaces in the X-axis direction) of the slide bracket 540, respectively.

In an example embodiment, the first helical groove 524 may be recessed in both side surfaces of the first connecting member 523. The first helical groove 524 may include an arc shape with the first hinge axis H1 as the center.

In an example embodiment, the first helical protrusion 544 may interoperate with the first helical groove 524 of the first rotator 520. The first helical protrusion 544 may slide along the helical shape of the first helical groove 524 by being inserted into the first helical groove 524. The first helical protrusion 544 may be formed in a direction corresponding to a helical direction of the first helical groove 524.

In an example embodiment, the second helical protrusion 546 may interoperate with the second helical groove 534 of the second rotator 530. The second helical protrusion 546 may slide along the helical shape of the second helical groove 534 by being inserted into the second helical groove 534. The second helical protrusion 546 may be formed in a direction corresponding to a helical direction of the second helical groove 534.

For example, the first helical protrusion 544 may be inserted into the first helical groove 524. The arc shape of the first helical protrusion 544 may substantially correspond to the arc shape of the first helical groove 524. The width of the first helical protrusion 544 may substantially correspond to the width of the first helical groove 524. The first helical groove 524 may rotate on the first hinge axis H1 along the first helical protrusion 544 in a designated angle range. According to the structure described above, the first rotator 520 may rotate on the first hinge axis H1 in the designated angle range relative to the hinge bracket 540. However, this is an example, and the hinge assembly 500 in an embodiment may include a recessed structure (not illustrated) corresponding to the first helical protrusion 544 or a protruding structure (not illustrated) corresponding to the first helical groove 524.

In an example embodiment, the first helical protrusion 544 or the first helical groove 524 may be formed in a helical shape in a clockwise direction when facing the upper side (e.g., the +Y direction) from the lower side (e.g., the −Y direction) and the second helical protrusion 546 or the second helical groove 534 may be formed in a helical shape in a counterclockwise direction when facing the upper side (e.g., the +Y direction) from the lower side (e.g., the −Y direction). However, the example is not limited thereto and may be formed conversely.

In an example embodiment, the slide bracket 540 may slide in the first axis direction (e.g., the Y-axis direction) parallel with the hinge axis H1 or H2 direction along the first helical protrusion 544 and the second helical protrusion 546. According to the structure described above, the slide bracket 540 may slide in the first axis direction relative to the hinge bracket 510.

In an example embodiment, when the first rotator 520 and the second rotator 530 rotate from the unfolded state (e.g., the state of FIG. 11C) to the folded state (e.g., the state of FIG. 11D), the first helical groove 524 and the second helical groove 534 may rotate along the first hinge axis H1 and the second hinge axis H2, respectively. The first helical protrusion 544 and the second helical protrusion 546 may be pushed in one (e.g., the −Y direction) of the first axis direction by interoperating with rotations of the first helical groove 524 and the second helical groove 534 and as a result, the slide bracket 540 may slide in one (e.g., the −Y direction) of the first axis directions (e.g., the Y-axis direction).

In an example embodiment, because the slide bracket 540 is operatively connected to the first rotator 520 and the second rotator 530 through the first helical protrusion 544 and the second helical protrusion 546, the two rotators (the first rotator 520 and the first rotator 530) may fold by interoperating with each other. For example, as the first rotator 520 rotates, the first helical groove 524 may push the first helical projection 544 and in interoperation therewith, the second helical projection 546 may push the second helical groove 534. As a result, the second rotator 530 may rotate in interoperation with rotation of the first rotator 520.

Figure 12A:
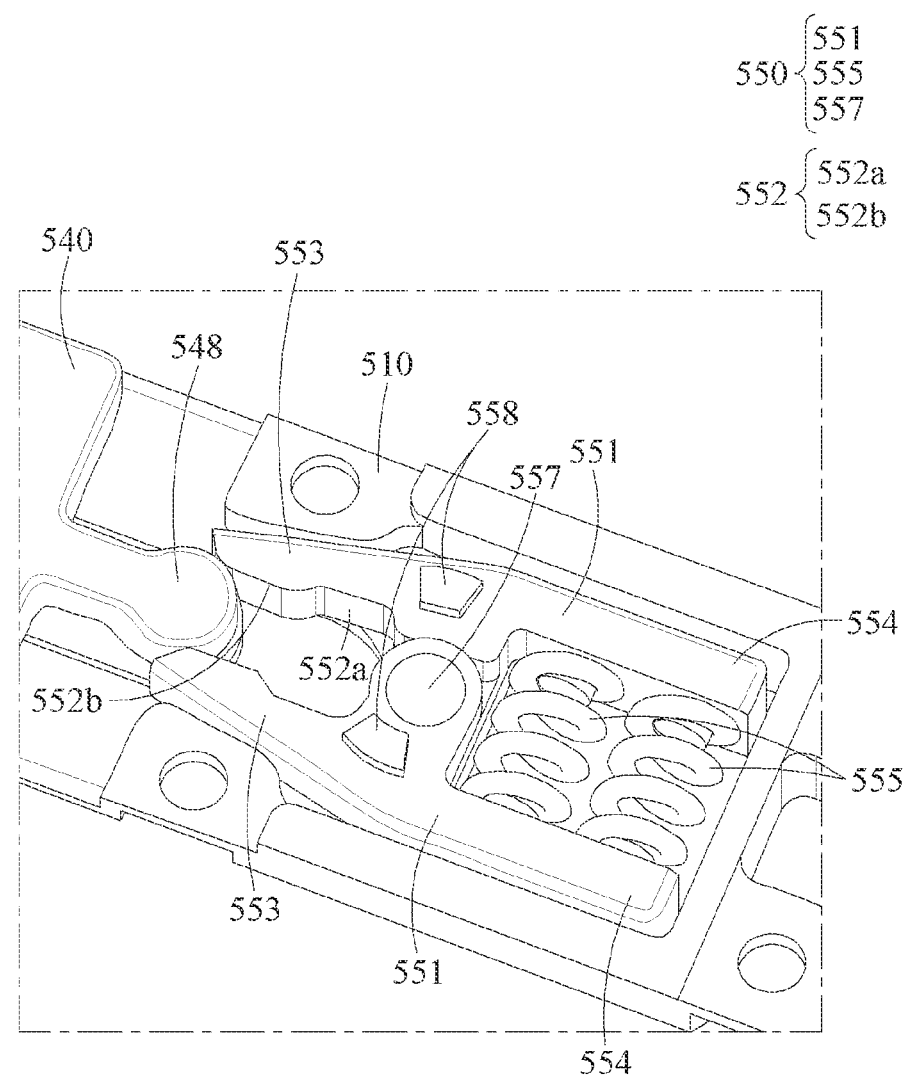
FIG. 12A is a perspective view of the hinge assembly in an unfolded state according to an example embodiment.
Figure 12A:
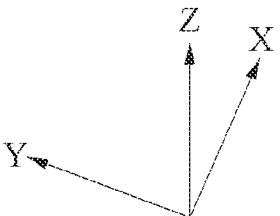
Figure 12B:
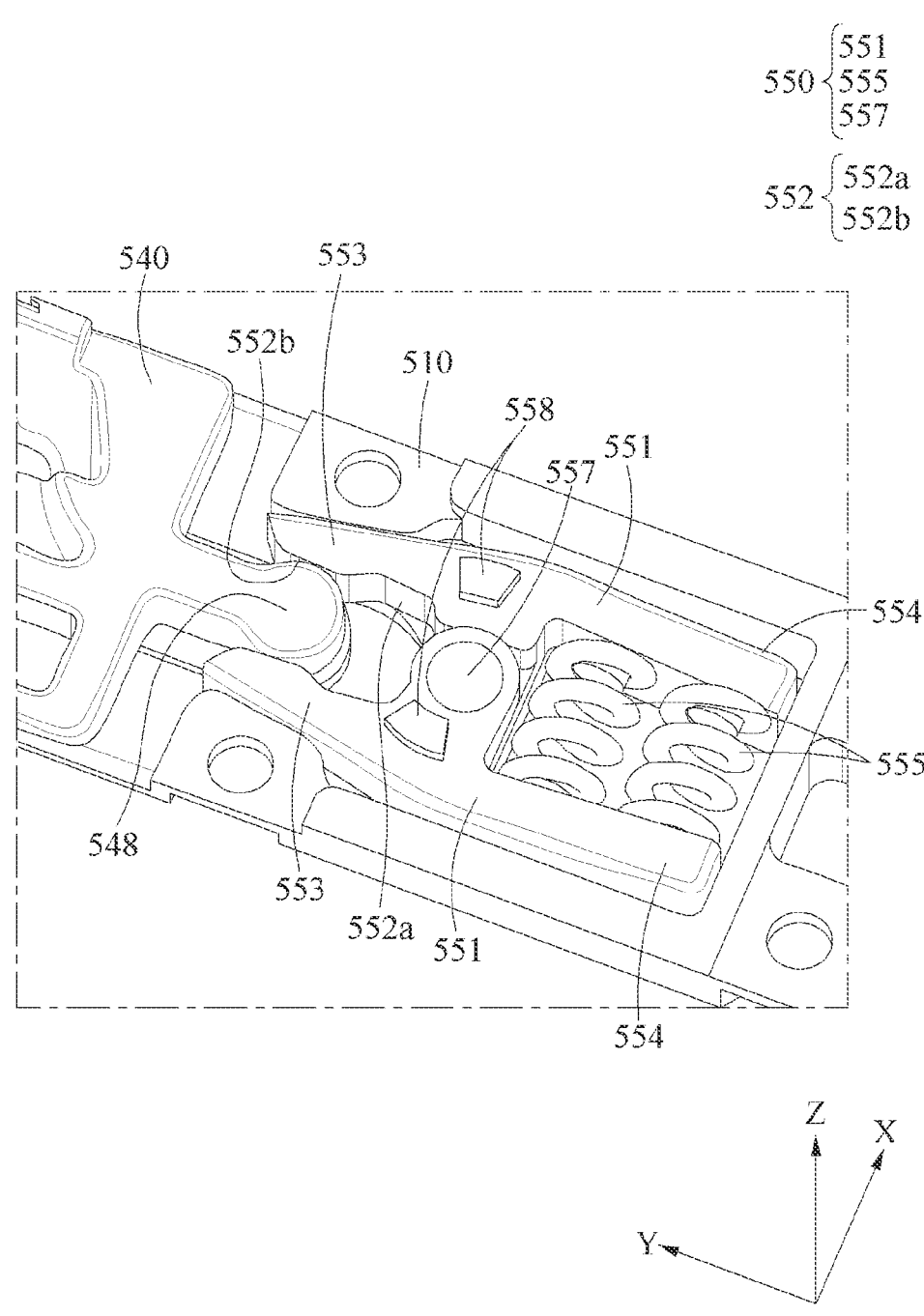
FIG. 12B is a perspective view of the hinge assembly in an intermediate state according to an example embodiment.
Figure 12C:
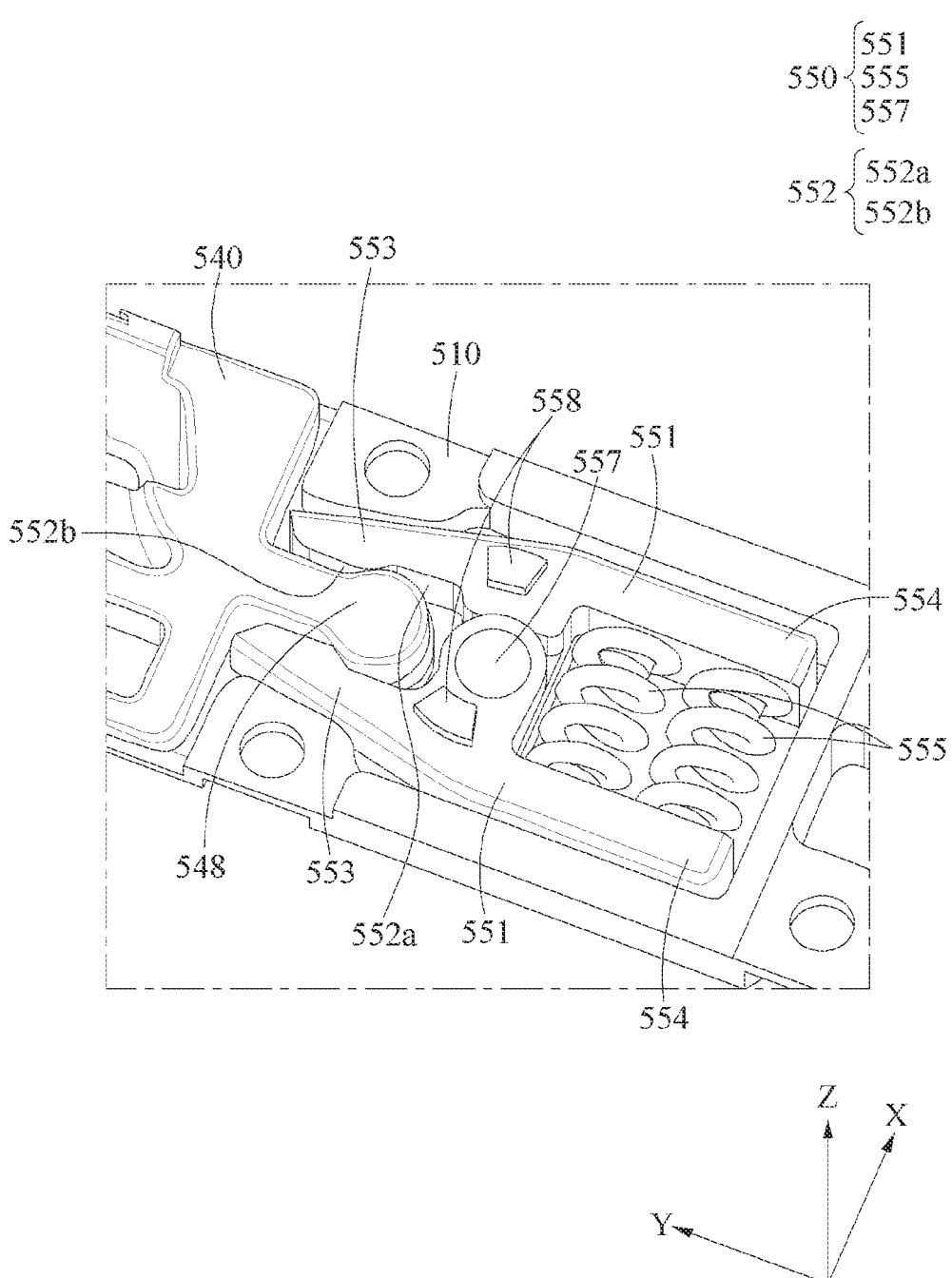
FIG. 12C is a perspective view of the hinge assembly in a folded state according to an example embodiment.
Figure 13A:
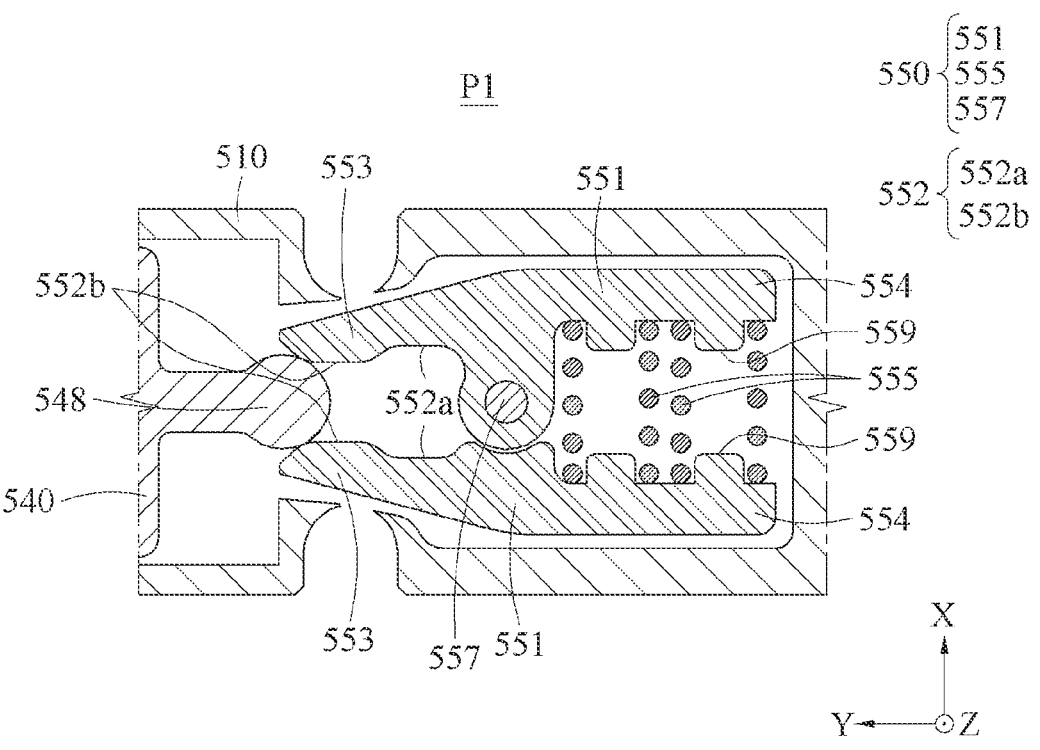
FIG. 13A is a partial cross-sectional view of the hinge assembly in an unfolded state according to an example embodiment.
Figure 13B:
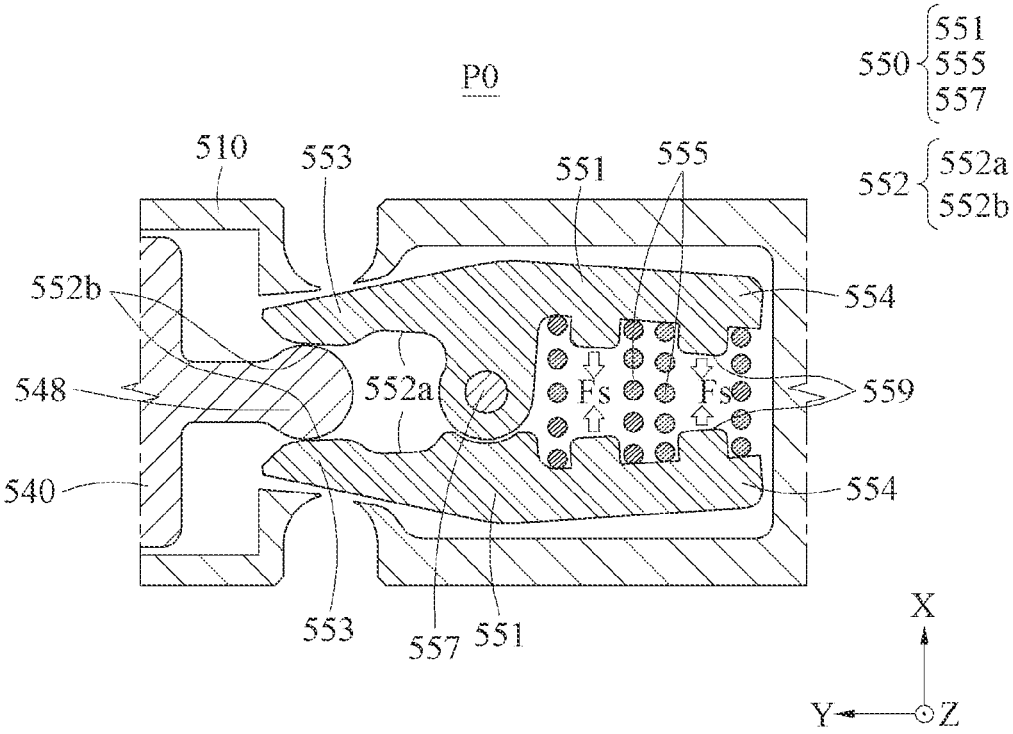
FIG. 13B is a partial cross-sectional view of the hinge assembly in an intermediate state according to an example embodiment.
Figure 13C:
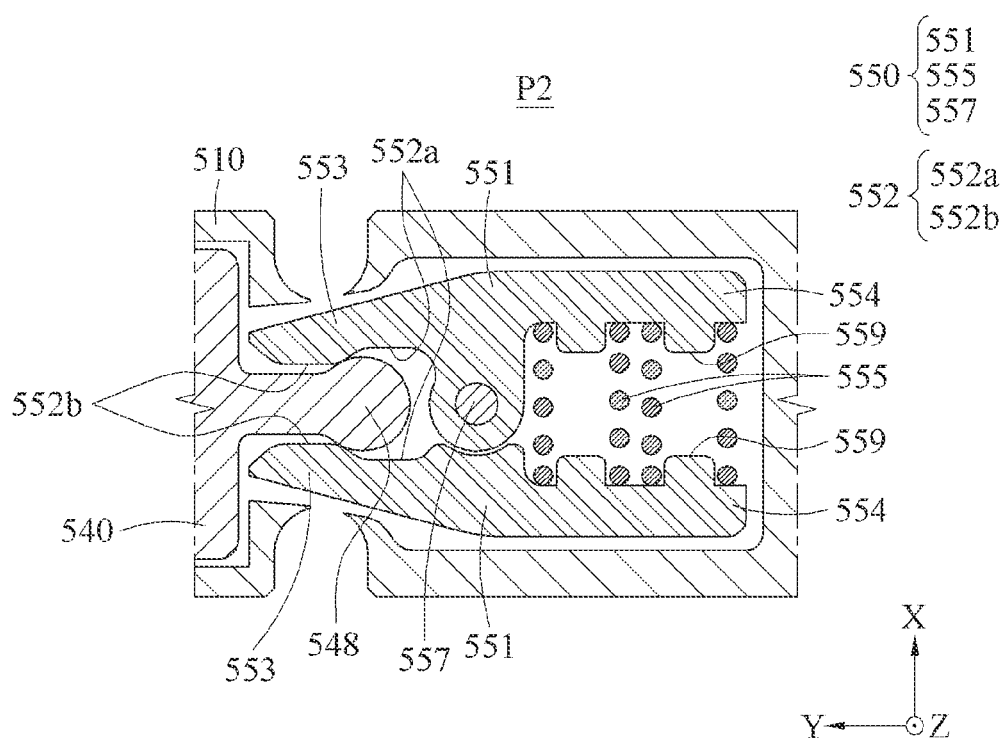
FIG. 13C is a partial cross-sectional view of the hinge assembly in a folded state according to an example embodiment.

FIG. 12A is a perspective view of the hinge assembly 500 in an unfolded state according to an example embodiment, FIG. 12B is a perspective view of the hinge assembly 500 in an intermediate state according to an example embodiment, FIG. 12C is a perspective view of the hinge assembly 500 in a folded state according to an example embodiment, FIG. 13A is a partial cross-sectional view of the hinge assembly 500 in an unfolded state according to an example embodiment, FIG. 13B is a partial cross-sectional view of the hinge assembly 500 in an intermediate state according to an example embodiment, and FIG. 13C is a partial cross-sectional view of the hinge assembly 500 in a folded state according to an example embodiment.

For example, the cross-sectional view of the hinge assembly 500 of FIG. 13A may correspond to the state of the hinge assembly 500 of FIG. 12A and the cross-sectional view of the hinge assembly 500 of FIG. 13B may correspond to the state of the hinge assembly 500 of FIG. 12B, and the cross-sectional view of the hinge assembly 500 of FIG. 13C may correspond to the state of the hinge assembly 500 of FIG. 12C.

Referring to FIGS. 12A to 13C, the detent assembly 550 in an embodiment may provide a detent force by interoperating with movement of the slide bracket 540.

Herein, in an example embodiment, the hinge assembly 500 may have a rotation structure that rotates the first housing (e.g., the first housing 311 of FIG. 9) and the second housing (e.g., the second housing 312 of FIG. 9) through the first rotator 520 and the second rotator 530. Alternatively, the hinge assembly 500 may have an interoperation structure that rotates the first rotator 520 and the second rotator 530 at substantially the same angle through the slide bracket 540 that spiral-slides by interoperating with the first rotator 520 and the second rotator 530. Alternatively, the hinge assembly 500 may have a detent structure through the detent assembly 550 that limits or helps movement of the slide bracket 540. Hereinafter, the rotation structure, the interoperation structure, and the detent structure implemented by various components of the hinge assembly 500 are described.

The hinge assembly 500 in an embodiment may be in an unfolded state (e.g., the state of FIG. 12A or the state at a first position P1 of FIG. 13A), an intermediate state (e.g., the state of FIG. 12B or the state at an intermediate position P0 of FIG. 13B), and a folded state (e.g., the state of FIG. 12C or the state at a second position P2 of FIG. 13C) as the first rotator 520 and the second rotator 530 rotate on the first hinge axis H1 and the second hinge axis H2, respectively.

In an example embodiment, when the first rotator 520 rotates on the first hinge axis H1, as a first helical protrusion (e.g., the first helical protrusion 544 of FIGS. 10B, 11A, 11C, and/or 11D) slides along a helical shape of a first helical groove (e.g., the first helical groove 524 of FIGS. 10B, 11B, 11C, and/or 11D), the slide bracket 540 may move in a straight line relative to the hinge bracket 510 by a pitch in the first axis direction (e.g., the Y-axis direction) corresponding to the rotation angle of the helical shape, and as a second helical protrusion (e.g., the second helical protrusion 546 of FIGS. 10B, 11A, 11C, and/or 11D) slides along a helical shape of a second helical groove (e.g., the second helical groove 534 of FIGS. 10B, 11C, and/or 11D), the slide bracket 540 may move in a straight line relative to the hinge bracket 510 by a pitch in the first axis direction (e.g., the Y-axis direction) corresponding to the rotation angle of the helical shape.

In an example embodiment, according to the structure described above, a rotation operation of the first rotator 520 and a rotation operation of the second rotator 530 may interoperate with each other by using linear movement of the slide bracket 540 as a medium. For example, any one of the rotation operations of the first rotator 520 and the second rotator 530 may interoperate with the other rotation operation by using linear movement of the slide bracket 540 as a medium. Accordingly, as the rotation operations of the first rotator 520 and the second rotator 530 interoperate with each other by the linear movement of the slide bracket 540, rotation angles of the first rotator 520 and the second rotator 530 may be synchronized with each other.

In an example embodiment, the detent assembly 550 may be coupled to the hinge bracket 510 such that the cam 551 pivots based on the pivot axis 557 by interoperating with the slide bracket 540. For example, the detent assembly 550 may be disposed inside the detent assembly accommodation space 516 of the hinge bracket 510 and may move in the first axis direction as the slide bracket 540 slides in the first axis direction.

In an example embodiment, the cam 551 may include the guide member 558 protruding toward the hinge bracket 510 and/or a hinge cover (not illustrated) from a surface facing the hinge bracket 510 and/or the hinge cover (not illustrated). As the cam 551 pivots, the guide member 558 may move inside the guide groove 518 of the hinge cover (not illustrated) or the hinge bracket 510, may guide movement of the cam 551, and may restrict a moving range of the cam 551.

In an example embodiment, the elastic member 555 may be a spring or an elastic body for providing an elastic force (e.g., the elastic force Fs of FIG. 13B) in the second axis direction to the cam 551. For example, when the first cam area 553 of the cam 551 is pressed and pivots in the second axis direction, the second cam area 554 of the cam 551 may pivot and may press the elastic member 555. The elastic member 555 may generate the elastic force Fs and the elastic force Fs of the elastic member 555 may provide a detent force to the hinge assembly 500.

In an example embodiment, a pair of elastic members 555 may be provided. The cams 551 may be respectively disposed on both sides (e.g., the second axis direction) of the elastic members 555 or one cam 551 may be disposed on one side. The first cam area 553 of at least one cam 551 may include the pressurizing surface 552 facing the pressurizing area 548.

In an example embodiment, referring to FIGS. 13A to 13C, the pressurizing surface 552 may guide the slide bracket 540 to move between the first position P1 and the second position P2 in the first axis direction. For example, the slide bracket 540 may slide between the first position P1 where the pressurizing surface 552 in the unfolded state is located and the second position P2 where the pressurizing surface 552 in the folded state is located. The slide bracket 540 may be located at the intermediate position P0 corresponding to the intermediate state, and the intermediate position P0 may be a position between the first position P1 and the second position P2.

In an example embodiment, the pressurizing surface 552 may include a flat area 552a and a protruding area 552b that protrudes from the flat area 552a in the second axis direction. The protruding area 552b may face the pressurizing area 548 and may be formed, for example, between a position facing the pressurizing area 548 at the first position P1 or in the unfolded state and a position facing the pressurizing area 548 at the second position P2 or in the folded state.

In an example embodiment, when the pressurizing area 548 of the slide bracket 540 moves along the pressurizing surface 552, the cam 551 may be pressed by the pressurizing area 548 by the structure and/or shape of the protruding area 552b and may pivot based on the pivot axis 557 in the second axis direction. For example, as the slide bracket 540 moves in the first axis direction, the protruding area 552b may be pressed in the second axis direction by the pressurizing area 548. However, this is an example, and the pressurizing area 548 may be formed in a structure that presses the cam 551 in the second axis direction in at least a partial region as the slide bracket 540 moves in the first axis direction. For example, the pressurizing surface 552 may omit the flat area 552a and may include a protruding area 552b that relatively protrudes than other areas or may include the protruding area 552b and a recessed area (not illustrated) opposite to the protruding area 552b.

In an example embodiment, the pressurizing area 548 may protrude in a direction facing the pressurizing surface 552 or the protruding area 552b, and the pressurizing area 548 may be an area facing and contacting the protruding area 552b. As the pressurizing area 548 is pressed by the protruding area 552b, the cam 551 may move in the direction of the elastic member 555.

In an example embodiment, to move from the unfolded state or the folded state to the intermediate state, a force to overcome the elastic force Fs of the elastic member 555 may be required. When the cam 551 is pressed in the second axis direction by the pressurizing area 548, the first cam area 553 may pivot and the second cam area 554 may press the elastic member 555. The elastic member 555 may provide the elastic force Fs in a direction opposite thereto and the detent assembly 550 may provide a detent force to the slide bracket 540 through the elastic force Fs of the elastic member 555.

In an example embodiment, while the hinge assembly 500 moves from the unfolded state (e.g., the state of FIGS. 12A and 13A) to the intermediate state (e.g., the state of FIGS. 12B and 13B), open detent may be generated. The open detent may be a force (e.g., a frictional force) or a torque to allow the hinge assembly 500 to be maintained in the unfolded state.

For example, the slide bracket 540 may slide in one direction (e.g., the −Y direction) in interoperation with rotation of the first rotator 520 and/or the second rotator 530. While the pressurizing area 548 of the slide bracket 540 moves from the first position P1 to the intermediate position P0, the protruding area 552 of the cam 551 may be pressed by the pressurizing area 548 and the elastic member 555 may generate the elastic force Fs that pushes the second cam area 554 of the cam 551 in the second axis direction. By the elastic force Fs of the elastic member 555, open detent may be generated as the first cam area 553 of the cam 551 presses the pressurizing area 548, the slide bracket 540 may be maintained at the first position P1 in a range less than or equal to an external force such that the slide bracket 540 may overcome the open detent, and the hinge assembly 500 may be maintained in the unfolded state.

In an example embodiment, while the hinge assembly 500 moves from the folded state (e.g., the state of FIGS. 12C and 13C) to the intermediate state (e.g., the state of FIGS. 12B and 13B), close detent may be generated. The close detent may be a force or a torque to allow the hinge assembly 500 to be maintained in the folded state (e.g., a frictional force).

For example, the slide bracket 540 may slide in one direction (e.g., the +Y direction) in interoperation with rotation of the first rotator 520 and/or the second rotator 530. While the pressurizing area 548 of the slide bracket 540 moves from the second position P2 to the intermediate position P0, the protruding area 552 of the cam 551 may be pressed by the pressurizing area 548 and the elastic member 555 may generate the elastic force Fs that pushes the second cam area 554 of the cam 551 in the second axis direction. By the elastic force Fs of the elastic member 555, close detent may be generated as the first cam area 553 of the cam 551 presses the pressurizing area 548, the slide bracket 540 may be maintained at the second position P2 in a range less than or equal to an external force such that the slide bracket 540 may overcome the close detent, and the hinge assembly 500 may be maintained in the folded state.

In an example embodiment, when the hinge assembly 500 is in the intermediate state (e.g., the state of FIGS. 12B and 13B), free stop may occur. The free stop may be a state to maintain the hinge assembly 500 to be in the intermediate state (e.g., the state between the unfolded state and the folded state) or a movable state to the other state (e.g., the unfolded state or the folded state) by a predetermined external force.

For example, when the pressurizing area 548 of the slide bracket 540 is located at the intermediate position P0, the cam 551 may be pivoted by the protruding area 552b, the elastic member 555 may generate a great elastic force Fs, and a stop frictional force may be generated between the pressurizing area 548 and the protruding area 552b. The free stop state may be maintained by the stop frictional force and the hinge assembly 500 may maintain the intermediate state. When a predetermined force is provided in any direction (e.g., any one of the +Y-axis and −Y axis direction) of the first axis direction to the slide bracket 540 at the intermediate position P0, the stop frictional force may be overcome and the pressurizing area 548 may move in a direction in which a force is applied.

In an example embodiment, the slide bracket 540 that overcame the stop frictional force may relatively easily move to the first position P1 or the second position P2, and the hinge assembly 500 may semi-automatically move from the intermediate state to the folded state or the unfolded state. This is described with reference to FIGS. 14A, 14B, 14C, and 14D.

In an example embodiment, the hinge assembly 500 may cause interoperation of rotation operations of the first rotator 520 and the second rotator 530 by interoperating with the first rotator 520, the second rotator 530, and the slide bracket 540, and open detent, free stop, and close detent may be generated by interoperating with the slide bracket 540, the hinge bracket 510, and the detent assembly 550. Since one hinge assembly 500 may perform rotation, detent, and interoperation functions, a separate sync assembly may not be provided, and thus, the number of components, width, weight, and/or cost of the hinge assembly 500 or an electronic device (e.g., the electronic device 300 of FIG. 9) including them may decrease.

In an example embodiment, through the structural design described above, the detent assembly 550 may easily secure durability and the elastic force Fs of the elastic member 555 and may improve the lifespan of the elastic member 555. For example, a plurality of elastic members 555 may be arranged in the first axis direction to provide the elastic force Fs in the second axis direction.

For example, in an example embodiment, when the elastic member 555 and the cam 551 are arranged in the first axis direction and provide the elastic force Fs, the arrangement of the plurality of elastic members 555 may be limited and the size of the area demanded by the detent assembly 550 may increase because the size of the cam 551 needs to increase to support the arrangement.

In an example embodiment, the cam 551 that is movable in the second axis direction in interoperation with the slide bracket 540 and the elastic member 555 that provides the elastic force Fs in the second axis direction to the cam 551 may be provided. The hinge assembly 500 may increase a contact area of the elastic member 555 by arranging the plurality of elastic members 555 in the first axis direction to provide the elastic force Fs in the second axis direction or having a plate shape in which the cam 551 extends in the first axis direction. Accordingly, the hinge assembly 500 may improve the detent performance and durability of the detent assembly 550 and may become slim due to an advantage of internal structural design.

Figure 14A:
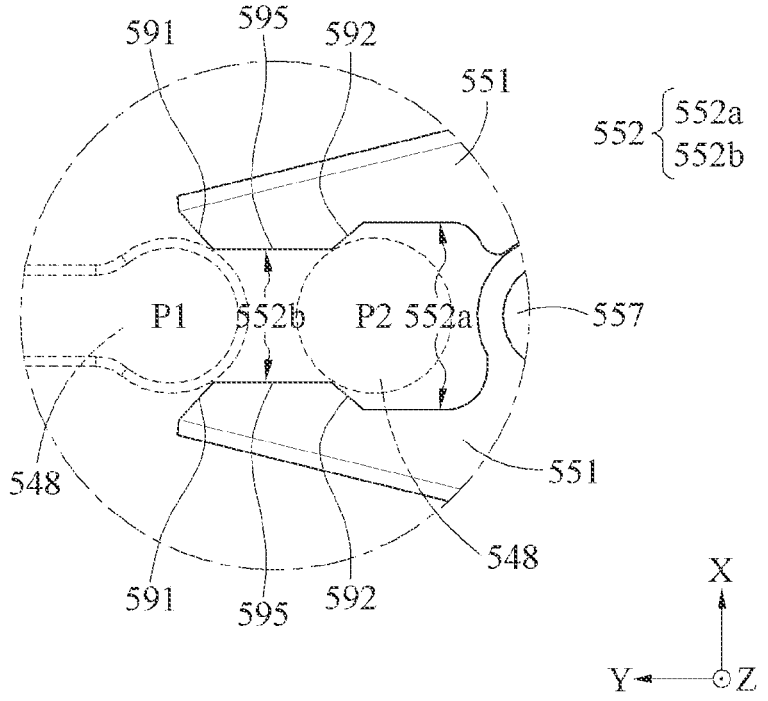
FIG. 14A is a partial cross-sectional view of the hinge assembly according to an example embodiment.
Figure 14B:
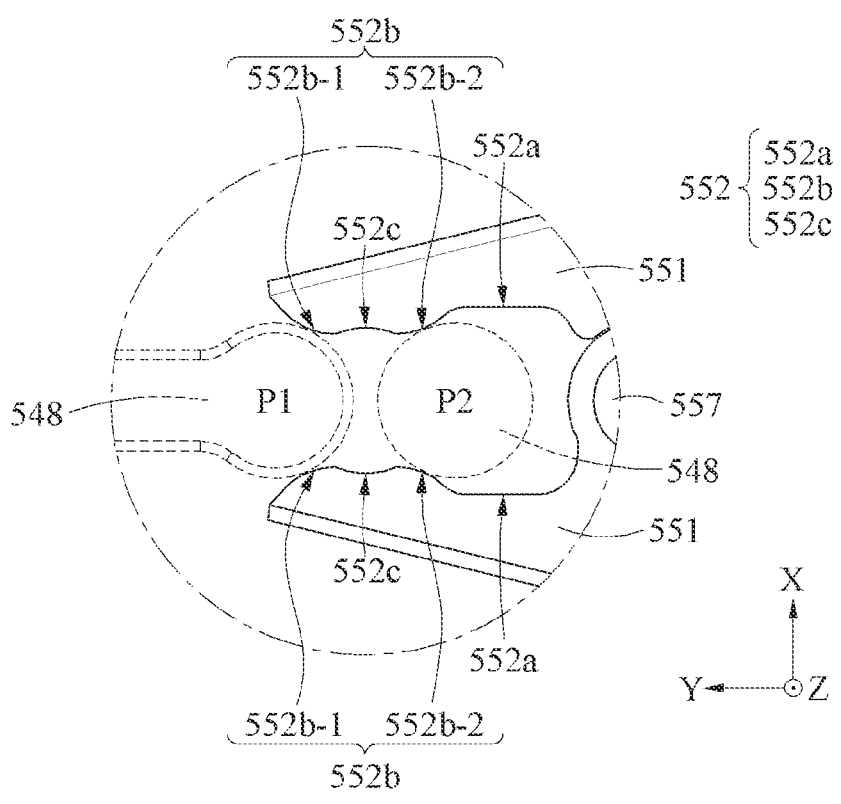
FIG. 14B is a partial cross-sectional view of the hinge assembly according to an example embodiment.
Figure 14C:
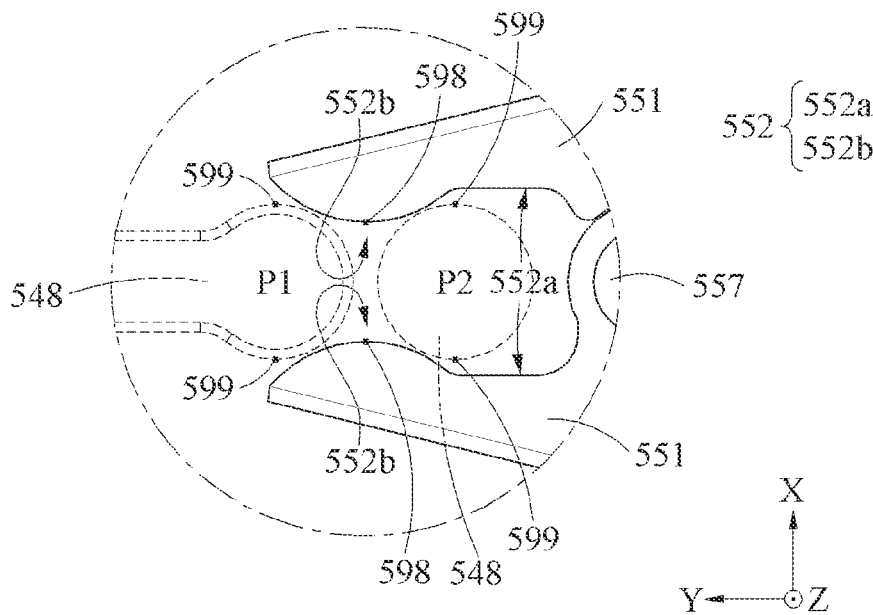
FIG. 14C is a partial cross-sectional view of the hinge assembly according to an example embodiment.

FIGS. 14A, 14B, and 14C are partial cross-sectional views of the hinge assembly 500 in an embodiment, respectively.

Referring to FIGS. 14A, 14B, and 14C, the pressurizing surface 552 and the pressurizing area 548 may have various shapes and structures.

In an example embodiment, as illustrated in FIG. 14A, the protruding area 552*b* may include the first inclined surface 591, the second inclined surface 592, and the first flat surface 595 formed between the first inclined surface 591 and the second inclined surface 592.

In an example embodiment, the first position P1 may be a position of the pressurizing area 548 of the hinge assembly 500 in the unfolded state and the second position P2 may be a position of the pressurizing area 548 of the hinge assembly 500 in the folded state.

In an example embodiment, the first inclined surface 591 may be an area that is relatively inclined compared to the first flat surface 595 and the second inclined surface 592 may be an area connected to the flat area 552*a* from the first flat surface 595. The second inclined surface 592 may be an area inclining in a direction facing the pressurizing area 548 at a predetermined angle based on the flat area 552*a* and the first inclined surface 591 may be an area declining in a direction facing the pressurizing area 548 at a predetermined angle based on the first flat surface 595.

In an example embodiment, the pressurizing area 548 may protrude in a curved shape having a predetermined curvature. Through the curved structure, a contact surface between the pressurizing area 548 and the protruding area 552*b* may decrease, the cam 551 may pivot more smoothly, and the pressurizing area 548 may move more smoothly.

For example, as the slide bracket 540 (or the pressurizing area 548) moves in the first axis direction, a contact point of the pressurizing area 548 contacting the first inclined surface 591 or the second inclined surface 592 may continuously vary. Therefore, the magnitude of a force pressing the elastic member 555 by the pressurizing area 548 may vary, and a force pressing the elastic member 555 may relatively smoothly increase. In addition, while the pressurizing area 548 enters the flat area 552*a* from the second inclined surface 592, the pressurizing area 548 may relatively smoothly slide and move.

In an example embodiment, in a state (e.g., the unfolded state of FIG. 13A) in which at least a portion of the first inclined surface 591 contacts at least a portion of the pressurizing area 548, open detent may occur in the hinge assembly 500. As the slide bracket 540 slides in a direction (e.g., the −Y direction), the first inclined surface 591 of the protruding area 552*b* may press the pressurizing area 548. The elastic member 555 may be compressed as the cam 551 pivots in the second axis direction and open detent may occur as the elastic force of the elastic member 555 increases.

In an example embodiment, in a state (e.g., the intermediate state of FIG. 13B) in which at least a portion of the first flat surface 595 contacts at least a portion of the pressurizing area 548, free stop may occur in the hinge assembly 500. The elastic member 555 may press the second cam area 554 and a stop frictional force between the first flat surface 595 and the pressurizing area 548 may increase. In the hinge assembly 500, the free stop may occur in a range less than or equal to the stop frictional force of the first flat surface 595 and the pressurizing area 548.

In an example embodiment, in a state (e.g., the folded state of FIG. 13C) in which at least a portion of the second inclined surface 592 contacts at least a portion of the pressurizing area 548, close detent may occur in the hinge assembly 500. As the slide bracket 540 slides in a direction (e.g., the +Y direction), the second inclined surface 592 of the protruding area 552*b* may press the pressurizing area 548. The elastic member 555 may be compressed as the cam 551 pivots in the second axis direction and close detent may occur as the elastic force of the elastic member 555 increases.

In an example embodiment, as illustrated in FIG. 14B, the pressurizing surface 552 may include a plurality of protruding areas 552*b* and may further include a groove area 552*c* formed between the plurality of protruding areas 552*b*.

In an example embodiment, the plurality of protruding areas 552*b* may include a first protruding area 552*b*-1 and a second protruding area 552*b*-2. For example, the first protruding area 552*b*-1 may be relatively closer to the pressurizing area 548 at the first position P1 than the second protruding area 552*b*-2, or the second protruding area 552*b*-2 may be relatively closer to the pressurizing area 548 at the second position P2 than the first protruding area 552*b*-1. The groove area 552*c* may be formed between the first protruding area 552*b*-1 and the second protruding area 552*b*-2.

In an example embodiment, the groove area 552*c* may have a structure corresponding to the shape of the pressurizing area 548 and intermediate detent may occur in the hinge assembly 500 by the groove area 552*c*. As the pressurizing area 548 passes through one of the plurality of protruding areas 552*b*, the elastic member 555 may be compressed and when the pressurizing area 548 reaches the groove area 552*c*, the elastic member 555 may extend in a predetermined range. The elastic member 555 may extend and may provide an elastic force and the pressurizing area 548 may be smoothly inserted into the groove area 552*c*. To escape from the groove area 552*c*, as the pressurizing area 548 slides, the pressurizing area 548 may be pressed by the protruding area 552*b*. The cam 551 may move in the second axis direction by the protruding area 552*b* and the elastic member 555 may be compressed and intermediate detent may occur as the elastic force of the elastic member 555 may increase.

In an example embodiment, as illustrated in FIG. 14C, the protruding area 552*b* may protrude in a curved structure having a predetermined curvature. Through the curved structure of the protruding area 552*b* and the pressurizing area 548, a contact area between the pressurizing area 548 and the protruding area 552*b* may decrease, movement of the cam 551 may smoothen, and semi-automatic detent may occur.

In an example embodiment, as the slide bracket 540 (or the pressurizing area 548) moves in the first axis direction, a contact point of the pressurizing area 548 and the protruding area 552*b* may continuously vary, the magnitude of a force pressing the elastic member 555 by the pressurizing area 548 may vary, and a force pressing the elastic member 555 may relatively smoothly increase.

For example, the protruding area 552*b* may include a first center point 598 that is a contact point substantially located at the center of the curved structure and the pressurizing area 548 may include a second center point 599 substantially located at the center of the curved structure. Alternatively, contact points of the protruding area 552*b* and the pressurizing area 548 in a state in which compression of the elastic member 555 is maximized or the elastic force is the greatest (or the intermediate state) may be the first center point 598 and the second center point 599.

In an example embodiment, to move the slide bracket 540 in the intermediate state in the first axis direction, the slide bracket 540 may escape from the intermediate state by applying a relatively small force. When the slide bracket 540 escapes the intermediate state, the pressurizing area 548 may slide from the protruding area 552*b* and may move to the flat area 552*a* or the outside of the protruding area 552*b* by the elastic force of the elastic member 555. In this case, the hinge assembly 500 may move to the folded state or the unfolded state in a semi-automatic manner and movement convenience of a user may improve.

As described above, the detent operation of the hinge assembly 500 according to an example embodiment may be variously implemented based on the structure, arrangement, shape, or number of the protruding area 552*b* of the pressurizing surface 552 and the pressurizing surface 552 of the cam 551 and through this, a desired detent operation may be freely implemented and user convenience may improve.

In an example embodiment, the electronic device 300 may include the display 250 including the first area 251, the second area 252, and at least the third area between the first area 251 and the second area 252 and the first housing 311 configured to support the first area 251, the second housing 312 configured to support the second area 252, and the hinge assembly 400 or 500 configured to connect the first housing 311 to the second housing 312 and operate between a folded state in which the first area 251 and the second area 252 face each other and an unfolded state in which the first area 251 and the second area 252 are viewable. In an example embodiment, the hinge assembly 400 or 500 may include the hinge bracket 410 and 510 defining the first hinge axis H1 and the second hinge axis H2, the first rotator 420 or 520 connected to the first housing 311 and rotatably connected to the hinge bracket 410 or 510 based on the first hinge axis H1, the second rotator 430 or 530 connected to the second housing 312 and rotatably connected to the hinge bracket 410 or 510 based on the second hinge axis H2, the slide bracket 440 or 540 slidably connected in the first axis direction parallel with the first hinge axis H1 and/or the second hinge axis H2 by interoperating with rotations of the first rotator 420 or 520 and the second rotator 430 or 530, and the detent assembly 450 or 550 configured to provide a detent force resisting movement of the slide bracket 440 or 540 in the first axis direction. In an example embodiment, the detent assembly 450 or 550 may include the cam 451 or 551 moving in the second axis direction perpendicular to the first axis direction by interoperating with movement of the slide bracket 440 or 540, and the elastic member 455 or 555 configured to provide an elastic force in the second axis direction by interoperating with movement of the cam 451 or 551.

In an example embodiment, the first rotator 420 may include the first helical groove 424 formed in a helical shape in one direction with the first hinge axis H1 as a center. In an example embodiment, the second rotator 430 may include the second helical groove formed 434 in a helical shape in one direction with the second hinge axis H2 as a center. In an example embodiment, the slide bracket 440 may include the first helical protrusion 444 interoperating with the first helical groove 424 and the second helical protrusion 446 interoperating with the second helical groove 434.

In an example embodiment, the detent assembly 450 may be coupled to the slide bracket 440 to move in the first axis direction together with the slide bracket 440. In an example embodiment, the slide bracket 440 may include the detent space 447 configured to accommodate the detent assembly 450 such that the cam 451 is able to move in the second axis direction.

In an example embodiment, the hinge bracket 410 may include the slide rail 417 configured to guide the slide bracket 440 to move in the first axis direction between at least the first position P1 where the slide bracket 440 is located in the unfolded state and the second position P2 where the slide bracket is located in the folded state.

In an example embodiment, the slide rail 417 may include the protruding area 417*b* protruding to press the cam 451 in the second axis direction as the slide bracket 440 moves in the first axis direction, and the elastic member 455 provides an elastic force in a direction opposite to a direction in which the cam 451 is pressed by the protruding area 417*b*.

In an example embodiment, the cam 451 may include the protrusion area 453 protruding in a direction facing the protruding area 417*b*.

In an example embodiment, the protrusion area 453 may protrude in a curved structure having a predetermined curvature.

In an example embodiment, the slide rail 417 may include a plurality of protruding areas 417*b*. In an example embodiment, the slide rail 417 may further include the groove area 417*c* formed between at least the plurality of protruding areas 417*b*.

In an example embodiment, the protruding area 417*b* may protrude in a curved structure having a predetermined curvature.

In an example embodiment, the detent assembly 550 may include the pivot axis 557 fixed to the hinge bracket 510 and connected to the cam 551. In an example embodiment, the slide bracket 540 may include the pressurizing area 548 configured to press the cam 551 to pivot as the slide bracket 540 moves in the first axis direction.

In an example embodiment, when the cam 551 is pressed by the pressurizing area 548 and pivots based on the pivot axis 557, the elastic member 555 may provide an elastic force to the cam 551 in the second axis direction.

In an example embodiment, the cam 551 may include the first cam area 553 including the pressurizing surface 552 facing the pressurizing area 548, and a second cam area 554 that is opposite to the first cam area 553 based on the pivot axis 557 and receives the elastic force from the elastic member 555.

In an example embodiment, the pressurizing surface 552 may include the protruding area 552*b* formed between at least the first position P1 where the pressurizing area 548 is located in the unfolded state and the second position P2 where the pressurizing area 548 is located in the folded state. In an example embodiment, the slide bracket 540 may pivot the cam 551 by pressing the protruding area 552*b* by the pressurizing area 548 as the slide bracket 540 moves in the first axis direction.

In an example embodiment, the hinge bracket 510 may include the guide groove 518. In an example embodiment, the cam 551 may include the guide member 558 configured to restrict a moving range of the cam 551 at least by moving inside the guide groove 518 as the cam 551 pivots.

In an example embodiment, the protruding area 552*b* may protrude in a curved structure having a predetermined curvature in a direction from the first position P1 to the second position P2.

In an example embodiment, the hinge assembly 400 applied to a foldable electronic device may include the hinge bracket 410 defining the first hinge axis H1 and the second hinge axis H2, the first rotator 420 rotatably connected to the hinge bracket 410 based on the first hinge axis H1, the second rotator 430 rotatably connected to the hinge bracket 410 based on the second hinge axis H2, the slide bracket 440 slidably connected in the first axis direction parallel with the first hinge axis H1 and/or the second hinge axis H2 by interoperating with rotations of the first rotator 420 and the second rotator 430, and the detent assembly 450 coupled to the slide bracket 440 to move in the first axis direction together with the slide bracket 440 and configured to provide a detent force resisting movement of the slide bracket 440 in the first axis direction. In an example embodiment, the detent assembly 450 may include the cam 451 moving in the second axis direction perpendicular to the first axis direction at least by interoperating with movement of the slide bracket 440, and the elastic member 455 configured to provide an elastic force in the second axis direction at least by interoperating with movement of the cam 451. In an example embodiment, the slide bracket 440 may include the detent space 447 configured to accommodate the detent assembly 450 such that the cam 451 is able to move in the second axis direction. "Based on" as used herein covers based at least on.

In an example embodiment, the hinge bracket 410 may include the slide rail 417 configured to guide the slide bracket 440 to move in the first axis direction.

In an example embodiment, the slide rail 417 may include the protruding area 417*b* protruding to press the cam 451 in the second axis direction as the slide bracket 440 moves in the first axis direction. In an example embodiment, the elastic member 455 may provide an elastic force in a direction opposite to a direction in which the cam 455 is pressed by the protruding area 417*b*.

In an example embodiment, the cam 451 may include the protrusion area 453 protruding in the second axis direction to contact the protruding area 417*b*.

In an example embodiment, the protrusion area 453 may protrude in a curved structure having a predetermined curvature.

Although preferred embodiments have been illustrated and described above, the present disclosure is not limited to the specific embodiments described above. In addition, it should be understood that various modified embodiments by one of ordinary skill in the art in a technical field of the present disclosure are allowed within the scope of the claims and such modified embodiments should not be separately construed from technical ideas or aspects.

What is claimed is:

1. An electronic device comprising:

a display comprising a first area, a second area, and a third area between at least the first area and the second area;

a first housing configured to support the first area;

a second housing configured to support the second area; and a hinge assembly configured to connect the first housing to the second housing and to operate between a folded state in which the first area and the second area face each other and an unfolded state in which the first area and the second area are viewable, wherein the hinge assembly comprises:

a hinge bracket;

a first rotator connected to the first housing and rotatably connected to the hinge bracket based on a first hinge axis;

a second rotator connected to the second housing and rotatably connected to the hinge bracket based on a second hinge axis;

a slide bracket slidably configured to be connected in a first axis direction parallel with the first hinge axis or the second hinge axis by interoperating with rotations of the first rotator and the second rotator; and a detent assembly configured to provide a detent force for resisting movement of the slide bracket in the first axis direction, wherein the detent assembly comprises:

a cam configured for movement relative to the slide bracket in a second axis direction perpendicular to the first axis direction by interoperating with movement of the slide bracket, and an elastic member configured to provide an elastic force in the second axis direction by interoperating with movement of the cam, wherein the hinge assembly is displaceable among an unfolded state, an intermediate state, and a folded state, and wherein the cam is configured for moving in the second axis direction between the unfolded state and the intermediate state and between the intermediate state and the folded state.

2. The electronic device of claim 1, wherein the first rotator comprises a first helical groove formed in a helical shape in a direction with the first hinge axis as a center, the second rotator comprises a second helical groove formed in a helical shape in a direction with the second hinge axis as a center, and the slide bracket comprises a first helical protrusion for interoperating with the first helical groove and a second helical protrusion for interoperating with the second helical groove.

3. The electronic device of claim 1, wherein the detent assembly is coupled to the slide bracket to move in the first axis direction together with the slide bracket, and the slide bracket comprises a detent space configured to accommodate the detent assembly such that the cam is able to move in the second axis direction.

4. The electronic device of claim 3, wherein the hinge bracket comprises a slide rail configured to guide the slide bracket to move in the first axis direction between at least a first position where the slide bracket is located in the unfolded state and a second position where the slide bracket is located in the folded state.

5. The electronic device of claim 4, wherein the slide rail comprises a protruding area protruding and configured to press the cam in the second axis direction as the slide bracket moves in the first axis direction, and the elastic member is configured to provide an elastic force in a direction opposite to a direction in which the cam is pressed by the protruding area.

6. The electronic device of claim 5, wherein the cam comprises a protrusion area protruding in a direction facing the protruding area.

7. The electronic device of claim 6, wherein the protrusion area protrudes in a curved structure having a predetermined curvature.

8. The electronic device of claim 5, wherein the slide rail comprises a plurality of protruding areas and further comprises a groove area formed between at least the plurality of protruding areas.

9. The electronic device of claim 5, wherein the protruding area protrudes in a curved structure having a predetermined curvature.

10. The electronic device of claim 1, wherein the detent assembly comprises a pivot axis fixed to the hinge bracket and connected to the cam, and the slide bracket comprises a pressurizing area configured to press the cam to pivot as the slide bracket moves in the first axis direction.

11. The electronic device of claim 10, wherein the elastic member is configured to provide an elastic force to the cam in the second axis direction when the cam is pressed by the pressurizing area and pivots based on the pivot axis.

12. The electronic device of claim 11, wherein the cam comprises:

a first cam area comprising a pressurizing surface facing the pressurizing area, and a second cam area that is opposite to the first cam area based on the pivot axis and which is configured to receive the elastic force from the elastic member.

13. The electronic device of claim 12, wherein the pressurizing surface comprises a protruding area formed between at least a first position where the pressurizing area is located in the unfolded state and a second position where the pressurizing area is located in the folded state, and the slide bracket is configured to pivot the cam at least by pressing the protruding area by the pressurizing area as the slide bracket moves in the first axis direction.

14. The electronic device of claim 13, wherein the protruding area protrudes in a curved structure having a predetermined curvature in a direction from the first position to the second position.

15. The electronic device of claim 10, wherein the hinge bracket comprises a guide groove, and the cam comprises a guide member configured to restrict a moving range of the cam at least by moving inside the guide groove as the cam pivots.

16. A hinge assembly to be applied to a foldable electronic device, the hinge assembly comprising:

a hinge bracket;

a first rotator rotatably connected to the hinge bracket based on a first hinge axis;

a second rotator rotatably connected to the hinge bracket based on a second hinge axis;

a slide bracket slidably connected in a first axis direction parallel with the first hinge axis or the second hinge axis and configured for interoperating with rotations of the first rotator and the second rotator; and a detent assembly coupled to the slide bracket to move in the first axis direction together with the slide bracket and configured to provide a detent force for resisting movement of the slide bracket in the first axis direction, wherein the detent assembly comprises:

a cam configured for moving relative to the slide bracket in a second axis direction perpendicular to the first axis direction at least by interoperating with movement of the slide bracket, and an elastic member configured to provide an elastic force in the second axis direction at least by interoperating with movement of the cam, wherein the slide bracket comprises a detent space configured to accommodate the detent assembly such that the cam is able to move in the second axis direction, wherein the hinge assembly is displaceable among an unfolded state, an intermediate state, and a folded state, and wherein the cam is configured for moving in the second axis direction between the unfolded state and the intermediate state and between the intermediate state and the folded state.

17. The hinge assembly of claim 16, wherein the hinge bracket comprises a slide rail configured to guide the slide bracket to move in the first axis direction.

18. The hinge assembly of claim 17, wherein the slide rail comprises a protruding area protruding to press the cam in the second axis direction as the slide bracket moves in the first axis direction, and the elastic member is configured to provide an elastic force in a direction opposite to a direction in which the cam is pressed by the protruding area.

19. The hinge assembly of claim 18, wherein the cam comprises a protrusion area protruding in the second axis direction to contact the protruding area.

20. The hinge assembly of claim 19, wherein the protrusion area protrudes in a curved structure having a predetermined curvature.

* * * * *